(12) United States Patent
Yamazaki et al.

(10) Patent No.: US 12,455,446 B2
(45) Date of Patent: Oct. 28, 2025

(54) DISPLAY DEVICE WITH LIGHT EMITTING DEVICE AND LIGHT SENSING DEVICE IN ONE LAYER

(71) Applicant: SEMICONDUCTOR ENERGY LABORATORY CO., LTD., Atsugi (JP)

(72) Inventors: Shunpei Yamazaki, Tokyo (JP); Takayuki Ikeda, Kanagawa (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 0 days.

(21) Appl. No.: 18/277,180

(22) PCT Filed: Feb. 14, 2022

(86) PCT No.: PCT/IB2022/051272
§ 371 (c)(1),
(2) Date: Aug. 14, 2023

(87) PCT Pub. No.: WO2022/180481
PCT Pub. Date: Sep. 1, 2022

(65) Prior Publication Data
US 2024/0118548 A1  Apr. 11, 2024

(30) Foreign Application Priority Data
Feb. 26, 2021  (JP) .................. 2021-030746

(51) Int. Cl.
*G02B 27/00* (2006.01)
*G02B 27/01* (2006.01)
(Continued)

(52) U.S. Cl.
CPC ..... *G02B 27/0093* (2013.01); *G02B 27/0172* (2013.01); *G02B 27/0176* (2013.01);
(Continued)

(58) Field of Classification Search
CPC ............ G02B 27/0172; G02B 27/0093; G02B 27/0176; H10K 59/122; H10K 59/35; H10K 59/125; H10K 59/124
See application file for complete search history.

(56) References Cited

U.S. PATENT DOCUMENTS 5,953,985 A  9/1999 Kobayashi
6,120,338 A  9/2000 Hirano et al.
(Continued)

FOREIGN PATENT DOCUMENTS

CN  112313701 A  2/2021
CN  112673411 A  4/2021
(Continued)

OTHER PUBLICATIONS

International Search Report (Application No. PCT/IB2022/051272) Dated May 10, 2022.
(Continued)

*Primary Examiner* — Benjamin C Lee
*Assistant Examiner* — Nathan P Brittingham
(74) *Attorney, Agent, or Firm* — Fish & Richardson P.C.

(57) ABSTRACT

A novel display device is provided. The display device includes a plurality of pixels each including a light-emitting device, a sensor device, a first circuit device, and a second circuit device. The light-emitting device and the sensor device are provided in a first layer. The first circuit device is provided in a second layer. The second circuit device is provided in a third layer. The light-emitting device includes a lower electrode, an upper electrode, and a light-emitting layer provided between the lower electrode and the upper electrode. The sensor device has a function of detecting light emitted from the light-emitting device. The first circuit device has a function of driving the light-emitting device or the sensor device. The second circuit device has a function
(Continued)

of performing an arithmetic operation based on information output from the first circuit device. The first layer is provided over the second layer. The second layer is provided over the third layer.

18 Claims, 18 Drawing Sheets

(51) Int. Cl.
  *H10K 59/122* (2023.01)
  *H10K 59/124* (2023.01)
  *H10K 59/125* (2023.01)
  *H10K 59/131* (2023.01)
  *H10K 59/35* (2023.01)
  *H10K 59/90* (2023.01)

(52) U.S. Cl.
  CPC ......... *H10K 59/122* (2023.02); *H10K 59/124* (2023.02); *H10K 59/125* (2023.02); *H10K 59/131* (2023.02); *H10K 59/35* (2023.02); *H10K 59/90* (2023.02)

(56) References Cited

U.S. PATENT DOCUMENTS

| | | | |
|---|---|---|---|
| 7,043,056 | B2 | 5/2006 | Edwards et al. |
| 7,342,256 | B2 | 3/2008 | Yamazaki |
| 7,964,879 | B2 | 6/2011 | Yamazaki |
| 7,965,266 | B2 | 6/2011 | Yamaguchi et al. |
| 8,507,897 | B2 | 8/2013 | Yanagihara |
| 8,907,928 | B2 | 12/2014 | Yamaguchi et al. |
| 10,254,829 | B2 | 4/2019 | Miyaguchi |
| 11,423,844 | B2 | 8/2022 | Ikeda et al. |
| 11,798,491 | B2 | 10/2023 | Ikeda et al. |
| 2002/0072139 | A1 | 6/2002 | Kashiwabara |
| 2006/0244693 | A1 | 11/2006 | Yamaguchi et al. |
| 2008/0129653 | A1 | 6/2008 | Yamazaki |
| 2011/0108880 | A1 | 5/2011 | Yanagihara |
| 2011/0148290 | A1 | 6/2011 | Oota |
| 2012/0176576 | A1* | 7/2012 | Hosoya ............. G02F 1/136213 349/138 |
| 2012/0256204 | A1 | 10/2012 | Yoshizumi et al. |
| 2012/0273804 | A1 | 11/2012 | Hatano |
| 2012/0276484 | A1 | 11/2012 | Izumi et al. |
| 2013/0084531 | A1 | 4/2013 | Hamaguchi et al. |
| 2013/0084664 | A1 | 4/2013 | Yoshitoku et al. |
| 2013/0084666 | A1 | 4/2013 | Oshige |
| 2013/0280839 | A1 | 10/2013 | Sonoda et al. |
| 2013/0295705 | A1 | 11/2013 | Sonoda et al. |
| 2014/0004640 | A1 | 1/2014 | Hamaguchi et al. |
| 2014/0004642 | A1 | 1/2014 | Otsuka et al. |
| 2015/0060826 | A1 | 3/2015 | Matsumoto et al. |
| 2015/0069360 | A1 | 3/2015 | Sato |
| 2015/0069921 | A1* | 3/2015 | Carmel-Veilleux .... H05B 47/11 250/208.2 |
| 2015/0076476 | A1 | 3/2015 | Odaka et al. |
| 2016/0172595 | A1 | 6/2016 | Malinowski et al. |
| 2016/0190110 | A1* | 6/2016 | Göötz ................... H01L 25/167 438/27 |
| 2016/0315133 | A1 | 10/2016 | Sato |
| 2017/0141167 | A1 | 5/2017 | Naganuma |
| 2017/0160801 | A1 | 6/2017 | Miyaguchi |
| 2017/0256754 | A1 | 9/2017 | Defranco et al. |
| 2017/0269440 | A1* | 9/2017 | Yoshitomi ............. G06F 3/0446 |
| 2018/0190615 | A1 | 7/2018 | Pan |
| 2018/0190908 | A1 | 7/2018 | Ke et al. |
| 2019/0081116 | A1* | 3/2019 | Kondo ................... H10K 59/35 |
| 2020/0019238 | A1* | 1/2020 | Agaoglu ............... G06F 1/3231 |
| 2020/0203662 | A1 | 6/2020 | Mollard et al. |
| 2021/0279449 | A1* | 9/2021 | Yamazaki ................ G06T 7/00 |
| 2021/0295780 | A1 | 9/2021 | Ikeda et al. |
| 2022/0005790 | A1 | 1/2022 | Watanabe et al. |
| 2022/0181572 | A1 | 6/2022 | Ohsawa et al. |
| 2022/0209162 | A1 | 6/2022 | Seo et al. |
| 2022/0217325 | A1* | 7/2022 | Lee ......................... G06V 40/19 |
| 2022/0270548 | A1 | 8/2022 | Kurokawa et al. |
| 2023/0022181 | A1 | 1/2023 | Ikeda et al. |
| 2023/0164302 | A1* | 5/2023 | Ma .......................... G09G 3/342 348/51 |
| 2024/0099070 | A1 | 3/2024 | Ikeda. et al. |
| 2024/0122028 | A1 | 4/2024 | Ikeda. et al. |

FOREIGN PATENT DOCUMENTS

| | | |
|---|---|---|
| DE | 102016223765 | 6/2017 |
| JP | 2000-036385 A | 2/2000 |
| JP | 2003-059663 A | 2/2003 |
| JP | 2004-504684 | 2/2004 |
| JP | 2006-065305 A | 3/2006 |
| JP | 2006-301864 A | 11/2006 |
| JP | 2008-098106 A | 4/2008 |
| JP | 2008-147072 A | 6/2008 |
| JP | 2008-251270 A | 10/2008 |
| JP | 2010-097420 A | 4/2010 |
| JP | 2010-102892 A | 5/2010 |
| JP | 2011-103222 A | 5/2011 |
| JP | 2012-160473 A | 8/2012 |
| JP | 2014-120218 A | 6/2014 |
| JP | 2014-135251 A | 7/2014 |
| JP | 2014-232568 A | 12/2014 |
| JP | 2015-115178 A | 6/2015 |
| JP | 2015-152757 A | 8/2015 |
| JP | 2016-197494 A | 11/2016 |
| JP | 2017-130190 A | 7/2017 |
| JP | 2019-179696 A | 10/2019 |
| JP | 2020-160305 A | 10/2020 |
| KR | 2017-0066249 A | 6/2017 |
| KR | 2021-0022642 A | 3/2021 |
| KR | 2021-0043604 A | 4/2021 |
| TW | 202025113 | 7/2020 |
| WO | WO-2002/009025 | 1/2002 |
| WO | WO-2019/220278 | 11/2019 |
| WO | WO-2019/243955 | 12/2019 |
| WO | WO-2020/049397 | 3/2020 |

OTHER PUBLICATIONS

Written Opinion (Application No. PCT/IB2022/051272) Dated May 10, 2022.
Katsui.S et al., "5291 ppi Organic Light Emitting Diode Display using Field-effect Transistors Including a C-Axis Aligned Crystalline Oxide Semiconductor", SID Digest '19 : SID International Symposium Digest of Technical Papers, May 12, 2019, vol. 50, No. 1, pp. 311-314.
Malinowski.P et al., "Photolithography as Enabler of AMOLED Displays Beyond 1000 ppi", SID Digest '17 : SID International Symposium Digest of Technical Papers, May 1, 2017, vol. 48, No. 1, pp. 623-626.
Gather.M et al., "Solution-Processed Full-Color Polymer-OLED Displays Fabricated by Direct Photolithography", SID Digest '06 : SID International Symposium Digest of Technical Papers, Jun. 1, 2006, vol. 37, No. 1, pp. 909-911.
Ke. T et al., "Island and Hole Fabrication on OLED Stack for High-Resolution Sensor in Display Application", IDW '20 : Proceedings of the 27th International Display Workshops, Dec. 9, 2020, vol. 27, pp. 902-905.
Malinowski.P et al., "Organic photolithography for displays with integrated fingerprint scanner", SID Digest '19 : SID International Symposium Digest of Technical Papers, May 29, 2019, vol. 50, No. 1, pp. 1007-1010.
Malinowski.P et al., "Integration of additional functionalities into the frontplane of AMOLED displays", SID Digest '20 : SID International Symposium Digest of Technical Papers, Aug. 1, 2020, vol. 51, No. 1, pp. 646-649.
Ke.T et al., "Technology Developments in High-Resolution FMM-free OLED and BEOL IGZO TFTs for Power-Efficient Microdisplays", SID Digest '21 : SID International Symposium Digest of Technical Papers, May 1, 2021, vol. 52, No. 1, pp. 127-130.

(56) References Cited

OTHER PUBLICATIONS

Papadopoulos.N et al., "AMOLED Displays with In-Pixel Photodetector", Liquid Crystals and Display Technology, Jul. 9, 2020, pp. 1-19.
Malinowski.P et al., "Multicolor 1250 ppi OLED Arrays Patterened by Photolithography", SID Digest '16 : SID International Symposium Digest of Technical Papers, May 22, 2016, vol. 47, No. 1, pp. 1009-1012.
Malinowski.P et al., "Photolithographic patterning of organic photodetectors with a non-fluorinated photoresist system", Organic Electronics, Jul. 12, 2014, vol. 15, No. 10, pp. 2355-2359.
Malinowski.P et al., "High resolution photolithography for direct view active matrix organic light-emitting diode augmented reality displays", J. Soc. Inf. Display (Journal of the Society for Information Display), Apr. 2, 2018, vol. 26, No. 3, pp. 128-136.
Zakhidov.A et al., "Orthogonal processing: A new strategy for organic electronics", Chem. Sci. (Chemical Science), Apr. 7, 2011, vol. 2, No. 6, pp. 1178-1182.

* cited by examiner

DISPLAY DEVICE WITH LIGHT EMITTING DEVICE AND LIGHT SENSING DEVICE IN ONE LAYER

CROSS REFERENCE TO RELATED APPLICATIONS

This application is a U.S. National Phase Application under 35 U.S.C. § 371 of International Application PCT/IB2022/051272, filed on Feb. 14, 2022, which is incorporated by reference and claims the benefit of a foreign priority application filed in Japan on Feb. 26, 2021, as Application No. 2021-030746.

TECHNICAL FIELD

One embodiment of the present invention relates to a display device and an electronic device.

Note that one embodiment of the present invention is not limited to the above technical field. Examples of the technical field of one embodiment of the present invention disclosed in this specification and the like include a semiconductor device, a display device, a light-emitting apparatus, a power storage device, a memory device, an electronic device, a lighting device, an input device, an input/output device, a driving method thereof, and a manufacturing method thereof.

BACKGROUND ART

In recent years, higher definition of display devices has been required. For example, devices for virtual reality (VR), augmented reality (AR), substitutional reality (SR), or mixed reality (MR) are given as devices requiring high-definition display devices and have been actively developed in recent years. Display devices used for these devices are required to be downsized as well as to increase definition.

In addition, typical examples of a display device include a liquid crystal display device; a light-emitting apparatus including a light-emitting element (also referred to as a light-emitting device) such as an organic EL (Electro Luminescence) element or a light-emitting diode (LED); electronic paper performing display by an electrophoretic method or the like; and the like.

The basic structure of an organic EL element is, for example, a structure in which a layer containing a light-emitting organic compound is sandwiched between a lower electrode and an upper electrode. By applying voltage to this element, light emission can be obtained from the light-emitting organic compound. A display device employing such an organic EL element does not need a backlight that is necessary for a liquid crystal display device or the like; thus, a thin, lightweight, high-contrast, and low-power display device can be achieved. Patent Document 1, for example, discloses an example of a display device using an organic EL element. In the case where high display quality is required as in the display device in Patent Document 1, a high-definition display device including a large number of pixels is required in some cases.

REFERENCE

Patent Document

[Patent Document 1] PCT International Publication No. 2019/220278

SUMMARY OF THE INVENTION

Problems to be Solved by the Invention

A display device having high display quality, such as the display device disclosed in Patent Document 1, has been required for virtual reality (VR) and augmented reality (AR) devices. In this case, display is performed in a wearable housing, like in a glasses-type device or a goggle-type device; therefore, small size and light weight are important factors for the display device. In the wearable housing, for example, the size of the display device needs to be reduced to approximately less than or equal to 2 inches, or less than or equal to 1 inch.

In addition, a display device requires a driver circuit such as a gate driver or a source driver for driving pixels. Furthermore, in order to increase the display quality of a display device, the display device requires a functional circuit such as an application processor for generating control signals or the like for performing display.

In the case where the display device includes the driver circuit and the functional circuit separately, in addition to a pixel circuit including a plurality of pixels, the length of wirings for electrically connecting the circuits increases, which makes it difficult to reduce the size and weight of the display device. Furthermore, in the case where the display device includes the driver circuit and the functional circuit that are monolithically provided, in addition to a pixel circuit including a plurality of pixels, addition of the driver circuit and the functional circuit to the pixel circuit causes a problem of an increase in the circuit area.

Moreover, in the case where the display device is provided with an added value such as a sensor, a functional circuit or the like for driving or controlling the sensor or the like is also needed, which increases the circuit area and makes it difficult to reduce the size and weight of the display device.

In view of the above problems, an object of one embodiment of the present invention is to provide a display device with reduced size. Another object of one embodiment of the present invention is to provide a display device with reduced weight. Another object of one embodiment of the present invention is to provide a display device having high display quality. Another object of one embodiment of the present invention is to provide a novel display device.

Note that the description of these objects does not preclude the presence of other objects. Note that in one embodiment of the present invention, there is no need to achieve all these objects. Note that objects other than these can be derived from the description of the specification, the drawings, the claims, and the like.

Means for Solving the Problems

One embodiment of the present invention is a display device including a plurality of pixels. The plurality of pixels each include a light-emitting device, a sensor device, and a circuit device. The light-emitting device and the sensor device are provided in a first layer. The circuit device is provided in a second layer. The light-emitting device includes a lower electrode, an upper electrode, and a light-emitting layer provided between the lower electrode and the upper electrode. The sensor device has a function of detecting light emitted from the light-emitting device. The first layer is provided over the second layer.

One embodiment of the present invention is a display device including a plurality of pixels. The plurality of pixels each include a light-emitting device, a sensor device, a first circuit device, and a second circuit device. The light-emitting device and the sensor device are provided in a first layer. The first circuit device is provided in a second layer. The second circuit device is provided in a third layer. The light-emitting device includes a lower electrode, an upper electrode, and a light-emitting layer provided between the lower electrode and the upper electrode. The sensor device has a function of detecting light emitted from the light-emitting device. The first circuit device has a function of driving the light-emitting device or the sensor device. The second circuit device has a function of performing an arithmetic operation based on information output from the first circuit device. The first layer is provided over the second layer. The second layer is provided over the third layer.

When a cross section of the light-emitting device is observed, the light-emitting device preferably includes a region where a side surface of the lower electrode and a side surface of the light-emitting layer are aligned with or substantially aligned with each other.

An insulator is preferably included between the light-emitting device and an adjacent light-emitting device. The insulator preferably includes either one or both an inorganic material and an organic material. The insulator preferably includes a photosensitive organic resin.

It is preferable that the first circuit device include a first transistor and that the first transistor include a metal oxide in a channel formation region.

It is preferable that the second circuit device include a second transistor and that the second transistor include silicon in a channel formation region.

The second circuit device preferably has a function of detecting one or more selected from a user's blink, iris movement, and eyelid movement by using either one or both the light-emitting device and the sensor device.

One embodiment of the present invention is a display device including a plurality of pixels. The plurality of pixels each include a light-emitting device, a sensor device, and a circuit device. The light-emitting device and the sensor device are provided in a first layer. The circuit device is provided in a second layer. The light-emitting device includes a lower electrode, an upper electrode, and a light-emitting layer provided between the lower electrode and the upper electrode. The sensor device has a function of detecting light emitted from the light-emitting device. The first layer is provided over the second layer. The plurality of pixels each include a first subpixel to a sixth subpixel.

One embodiment of the present invention is a display device including a plurality of pixels. The plurality of pixels each include a first subpixel to a sixth subpixel. The first subpixel includes a first light-emitting device having a function of emitting red light. The second subpixel includes a second light-emitting device having a function of emitting green light. The third subpixel includes a third light-emitting device having a function of emitting blue light. At least one of the fourth subpixel to the sixth subpixel includes a first sensor device. The first subpixel to the sixth subpixel each include a circuit device. The first light-emitting device to the third light-emitting device and the first sensor device are provided in a first layer. The circuit device is provided in a second layer. The first light-emitting device to the third light-emitting device each include a lower electrode, an upper electrode, and a light-emitting layer provided between the lower electrode and the upper electrode. The first sensor device has a function of detecting light emitted from the pixel. The first layer is provided over the second layer.

In the above structure, it is preferable that the fourth subpixel include a fourth light-emitting device having a function of emitting infrared light, the fifth subpixel include the first sensor device, the sixth subpixel include a second sensor device, the fifth subpixel have a function of detecting visible light, and that the sixth subpixel have a function of detecting infrared light.

It is preferable that the first subpixel to the sixth subpixel each include a light-emitting region or a light-receiving region whose one side is greater than or equal to 1 μm and less than or equal to 10 μm and a region whose distance from an adjacent subpixel is less than 1 μm.

One embodiment of the present invention is an electronic device that includes any of the above display devices, a housing provided with the display device, a sensor provided in the housing, and a battery provided in the housing to supply power to the display device.

One embodiment of the present invention is an electronic device that includes at least two of the above display devices, a housing provided with the display devices, a sensor provided in the housing, and a battery provided in the housing to supply power to the display devices. The housing includes a wearing portion and a pair of lenses. An image from one of the two display devices is projected on one of the pair of lenses, and an image from the other of the two display devices is projected on the other of the pair of lenses.

Note that other embodiments of the present invention are shown in the description of the following embodiments and the drawings.

Effect of the Invention

One embodiment of the present invention can provide a display device with reduced size. Another embodiment of the present invention can provide a display device with reduced weight. Another embodiment of the present invention can provide a display device having high display quality. Another embodiment of the present invention can provide a novel display device.

Note that the description of these effects does not preclude the presence of other effects. Note that one embodiment of the present invention does not necessarily have all the effects. Note that other effects can be derived from the description of the specification, the drawings, the claims, and the like.

MODE FOR CARRYING OUT THE INVENTION

Figure 1A:
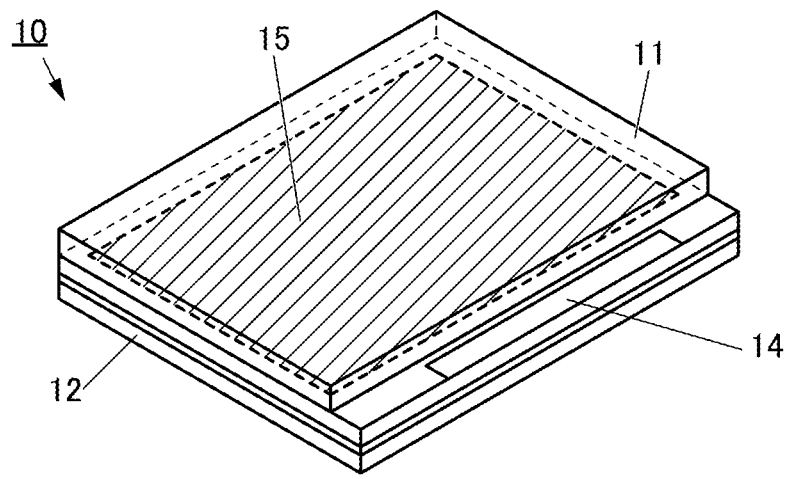
FIG. 1A and FIG. 1B are diagrams each illustrating a structure example of a display device.

Embodiments will be described below with reference to the drawings. Note that the embodiments can be implemented with many different modes, and it will be readily understood by those skilled in the art that modes and details thereof can be changed in various ways without departing from the spirit and scope thereof. Therefore, the present invention should not be construed as being limited to the description of embodiments below.

In addition, in the drawings, the size, the layer thickness, or the region is exaggerated for clarity in some cases. Thus, the size, the layer thickness, or the region is not necessarily limited to the illustrated scale. Note that the drawings schematically illustrate ideal examples, and embodiments of the present invention are not limited to shapes, values, and the like illustrated in the drawings.

Furthermore, unless otherwise specified, off-state current in this specification and the like refers to drain current of a transistor in an off state (also referred to as a non-conduction state or a cutoff state). Unless otherwise specified, an off state refers to, in an n-channel transistor, a state where voltage $V_{gs}$ between its gate and source is lower than the threshold voltage $V_{th}$ (in a p-channel transistor, higher than $V_{th}$).

In this specification and the like, a metal oxide is an oxide of metal in a broad sense. Metal oxides are classified into an oxide insulator, an oxide conductor (including a transparent oxide conductor), an oxide semiconductor (also simply referred to as an OS), and the like. For example, in the case where a metal oxide is used in an active layer of a transistor, the metal oxide is referred to as an oxide semiconductor in some cases. That is, an OS transistor can also be called a transistor including an oxide or an oxide semiconductor.

In addition, in this specification and the like, a device manufactured using a metal mask or an FMM (a fine metal mask or a high-definition metal mask) is sometimes referred to as a device having an MM (metal mask) structure. Furthermore, in this specification and the like, a device manufactured without using a metal mask or an FMM is sometimes referred to as a device having an MML (metal maskless) structure.

Note that in this specification and the like, a structure in which light-emitting layers in light-emitting devices of respective colors (here, blue (B), green (G), and red (R)) are separately formed or the light-emitting layers are separately patterned is sometimes referred to as an SBS (Side By Side) structure. In addition, in this specification and the like, a light-emitting device capable of emitting white light is sometimes referred to as a white light-emitting device. Note that a combination of a white light-emitting device with a coloring layer (e.g., a color filter) enables a full-color display device.

In addition, light-emitting devices can be roughly classified into a single structure and a tandem structure. A device having a single structure includes one light-emitting unit between a pair of electrodes, and the light-emitting unit preferably includes one or more light-emitting layers. In order to obtain white light emission, in the case where two light-emitting layers are used to obtain white light emission, the two light-emitting layers are selected so that emission colors of the two light-emitting layers have a relationship of complementary colors. For example, when an emission color of a first light-emitting layer and an emission color of a second light-emitting layer have a relationship of complementary colors, it is possible to obtain a structure where the light-emitting device can emit white light as a whole. Furthermore, in the case where three or more light-emitting layers are used to obtain white light emission, the light-emitting device is configured to emit white light as a whole by combining the emission colors of the three or more light-emitting layers.

A device having a tandem structure includes two or more light-emitting units between a pair of electrodes, and each light-emitting unit preferably includes one or more light-emitting layers. To obtain white light emission, the structure is made so that light from light-emitting layers of the plurality of light-emitting units can be combined to be white light. Note that a structure for obtaining white light emission is similar to that in the single structure. Note that in the device having the tandem structure, an intermediate layer such as a charge-generation layer is suitably provided between the plurality of light-emitting units.

Furthermore, when the white light-emitting device (the single structure or the tandem structure) and a light-emitting device having an SBS structure are compared, the light-emitting device having the SBS structure can have lower power consumption than the white light-emitting device. In the case where the power consumption is required to be low, the light-emitting device having the SBS structure is suitably used. Meanwhile, the white light-emitting device is preferable in terms of low manufacturing cost or high manufacturing yield because the manufacturing process of the white light-emitting device is simpler than that of the light-emitting device having the SBS structure.

Embodiment 1

Structural examples of display devices according to one embodiment of the present invention will be described below with reference to the drawings.

Structure Example 1 of Display Device

Figure 1B:
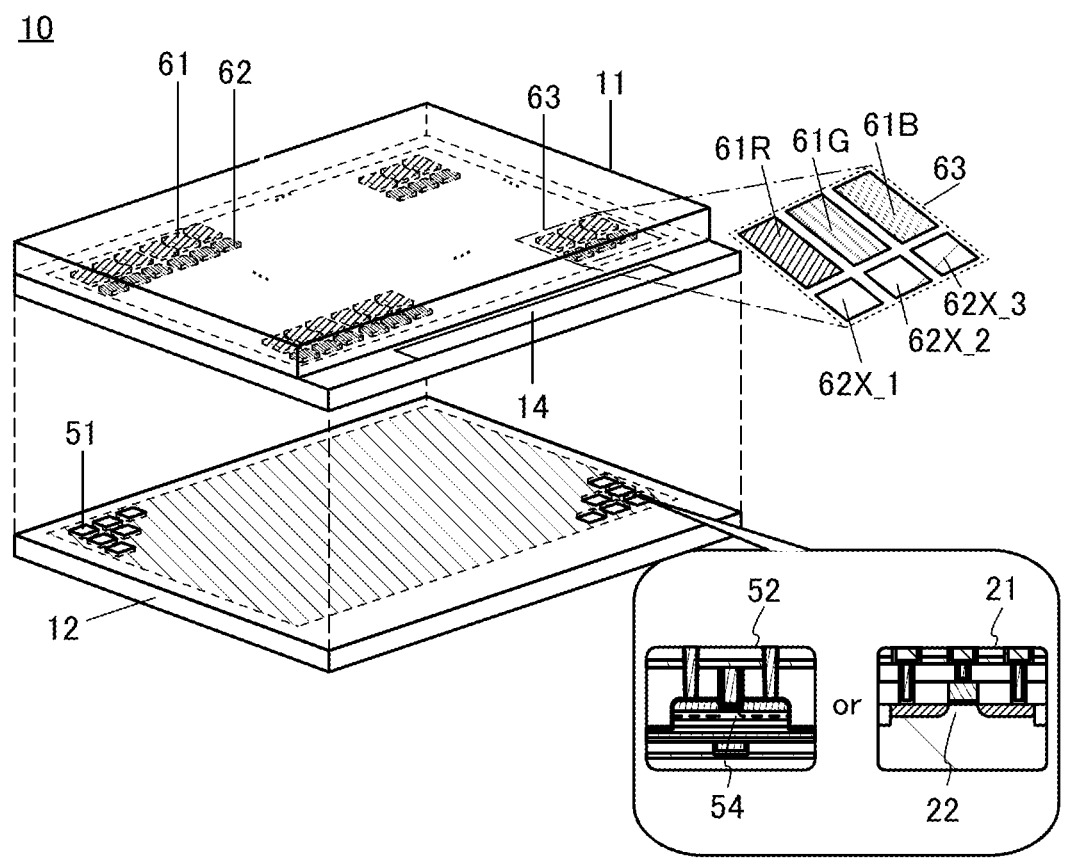

FIG. 1A and FIG. 1B are schematic perspective views of a display device 10.

The display device 10 illustrated in FIG. 1A and FIG. 1B includes a layer 11 and a layer 12. The display device 10 further includes a display portion 15 including elements provided in the layer 11 and the layer 12. The display portion 15 is a region where an image is displayed in the display device 10. The display portion 15 is a region provided with pixel circuits and pixels that include display elements connected to the pixel circuits.

In this specification and the like, the term "element" can be rephrased as the term "device" in some cases. For example, a display element, a light-emitting element, and a liquid crystal element can be rephrased as a display device, a light-emitting device, and a liquid crystal device, respectively. In addition, in this specification and the like, the term "device" can be rephrased as the term "element" in some cases.

In the display device 10, a variety of signals and power supply potentials are input from the outside via a terminal portion 14, so that display can be performed in the display portion 15. The display device includes a plurality of layers, and each layer is provided with a transistor for performing a circuit operation or a display element that emits light. Circuit devices such as a pixel circuit having a function of controlling light emission of the display element, a driver circuit having a function of controlling the pixel circuit, and a functional circuit having a function of controlling the driver circuit are provided in the plurality of layers.

FIG. 1B is a perspective view schematically illustrating structures of the layer 11 and the layer 12.

A plurality of pixel circuits 51 are provided over the layer 12. The layer 12 includes a transistor 52 (also referred to as an OS transistor) containing a metal oxide (also referred to as an oxide semiconductor) in a channel formation region 54 or a transistor 21 (also referred to as a Si transistor) containing silicon in a channel formation region 22. A silicon substrate is preferably used for the layer 12 because of having higher thermal conductivity than a glass substrate.

The transistor 21 can be a transistor containing single crystal silicon in a channel formation region, for example. In particular, the use of a transistor containing single crystal silicon in a channel formation region as the transistor provided in the layer 12 can increase the on-state current of the transistor. Thus, this is preferable because circuits included in the layer 12 can be driven at high speed. In addition, with the use of microfabrication, the channel length of the Si transistor can be greater than or equal to 3 nm and less than or equal to 10 nm, for example. With the use of the Si transistor, the display device 10 can be provided with an accelerator such as a CPU (Central Processor Unit) or a GPU (Graphics Processing Unit), an application processor, or the like.

A transistor that contains an oxide containing at least one of indium, an element M (the element M is aluminum, gallium, yttrium, or tin), and zinc in a channel formation region is preferably used as the transistor 52, which is the OS transistor. Such an OS transistor has a characteristic of extremely low off-state current. Thus, it is particularly preferable to use the OS transistor as a transistor provided in a pixel circuit because analog data written to the pixel circuit can be retained for a long time.

The layer 11 is provided over the layer 12. The layer 11 is provided with a plurality of display elements 61 and a plurality of elements 62. In the layer 11, pixels 63 that include the display elements 61 and the elements 62 are arranged in a matrix. In this embodiment, the case is described in which one pixel 63 includes six elements (three display elements 61 and three elements 62). That is, it can be said that the pixel 63 includes six subpixels.

FIG. 1B illustrates an example where one pixel 63 includes three display elements 61, a display element 61R, a display element 61G, and a display element 61B.

The pixel 63 can include a plurality of display elements that emit light of different colors. For example, in the case where display elements of three colors are included, light-emitting devices of three colors, red (R), green (G), and blue (B), light-emitting devices of three colors, yellow (Y), cyan (C), and magenta (M), or the like can be used.

For example, a light-emitting device emitting red light can be used for the display element 61R. A light-emitting device emitting green light can be used for the display element 61G. A light-emitting device emitting blue light can be used for the display element 61B.

As the display element 61, an EL element such as an OLED (Organic Light Emitting Diode) or a QLED (Quantum-dot Light Emitting Diode) is preferably used. As a light-emitting substance (also referred to as a light-emitting material) included in the display element, a substance that emits fluorescence (a fluorescent material), a substance that emits phosphorescence (a phosphorescent material), an inorganic compound (a quantum dot material or the like), a substance that exhibits thermally activated delayed fluorescence (a Thermally Activated Delayed Fluorescence (TADF) material), and the like can be given. Note that as a TADF material, a material that is in a thermal equilibrium state between a singlet excited state and a triplet excited state may be used. Such a TADF material has a short emission lifetime (excitation lifetime), which allows inhibition of a decrease in efficiency in a high-luminance region of a light-emitting device.

Alternatively, an LED such as a micro-LED (Light Emitting Diode) can be used as the display element 61.

FIG. 1B illustrates an example where the pixel 63 further includes three elements 62, an element 62X_1, an element 62X_2, and an element 62X_3.

One or more kinds of elements can be used as the element 62. A light-emitting device, a sensor device (also referred to as a sensor element) such as a light-receiving device (also referred to as a light-receiving element), or the like can be used as the element 62. Specifically, a light-emitting device emitting white light, a light-emitting device emitting yellow light, a light-emitting device emitting infrared light (including near infrared light), a light-emitting device emitting visible light, a light-receiving device detecting infrared light, or the like can be used as the element 62.

For example, the display device 10 or an electronic device including the display device can have a function of detecting one or more selected from a user's blink, iris movement, and eyelid movement by using the element 62.

When a light-receiving device is used as the element 62, the display device 10 can capture an image of the periphery of an eye, the surface of the eye, or the inside (fundus or the like) of the eye. For example, with the use of a light-receiving device detecting infrared light, one or more of a blink, eyelid movement, and iris movement can be detected. Moreover, a light-receiving device detecting visible light can be used for funduscopy, eye fatigue detection, or the like. The amount of hemoglobin can be detected with the use of one or both of visible light and infrared light. The use of both visible light and infrared light can increase the detection accuracy in some cases. Note that these functions will be described in detail in Embodiment 2.

In addition, for example, with the use of the element 62, the display device 10 or the electronic device can have a function of measuring at least one of force, displacement, a position, speed, acceleration, angular velocity, rotational frequency, distance, magnetism, temperature, a chemical substance, time, an electric field, current, voltage, power, radiation, flow rate, humidity, a gradient, oscillation, odor, a physical condition, a pulse, body temperature, a blood oxygen level, and arterial oxygen saturation.

In addition, examples of the function of the display device 10 or the electronic device include a degradation correction function, an acceleration sensor function, an odor sensor function, a physical condition detection function, a pulse detection function, a body temperature detection function, a pulse oximeter function, a blood oxygen level measurement function, and the like.

As the degradation correction function, a function of correcting the degradation of the display element 61 can be given. More specifically, in the case where a material used for the display element 61G has low reliability, when the element 62 has a structure similar to that of the display element 61G, a structure can be employed in which two display elements 61G are provided in the pixel 63. With this structure, the light emission area of the display element 61G can be increased. For example, when the light emission area of the display element 61G is twice, the reliability can be increased approximately twice. Alternatively, with the structure in which the two display elements 61G are provided in the pixel 63, in the case where light is not emitted due to degradation or the like of one of the display elements 61G, the other of the display elements 61G may compensate for the light emission of the one of the display elements 61G. Note that although the display element 61G is explicitly described above, the display element 61B and the display element 61R can have a similar structure.

Each of the acceleration sensor function, the odor sensor function, the physical condition detection function, the pulse detection function, the body temperature detection function, the pulse oximeter function, and the blood oxygen level measurement function can be achieved by providing a sensor device that is needed for detection as the element 62. In addition, it can be said that the display device 10 or the electronic device can achieve a variety of functions depending on the sensor device provided as the element 62.

When the variety of functions are provided using the element 62 as described above, the display device including the pixel 63 can be referred to as a multifunctional display device or a multifunctional panel. Note that functions using the element 62 may be one, or two or more, and a practitioner can select an optimal function as appropriate.

As a light-receiving device that can be used for the element 62, a pn-type or pin-type photodiode can be given, for example. The light-receiving device functions as a photoelectric conversion device (also referred to as a photoelectric conversion element) that detects light entering the light-receiving device and generates electric charge. The amount of electric charge generated from the light-receiving device depends on the amount of light entering the light-receiving device.

It is particularly preferable to use an organic photodiode including a layer containing an organic compound, as the light-receiving device. An organic photodiode is easily made thin, lightweight, and large in area and has a high degree of freedom for shape and design, and thus can be employed in a variety of display devices.

In one embodiment of the present invention, organic EL devices are used as the light-emitting devices, and organic photodiodes are used as the light-receiving devices. The organic EL device and the organic photodiode can be formed over the same substrate. Thus, the organic photodiodes can be incorporated in a display device including the organic EL devices.

The display device 10 includes a light-emitting device and a light-receiving device in the pixel 63. In the display device 10, the pixel 63 has a light-receiving function, so that an image of an object can be captured or the object can be detected while an image is displayed. For example, all the display elements 61 included in the display device 10 can display an image. Alternatively, some of the display elements 61 can emit light as a light source and the rest of the display elements 61 can display an image.

In addition, in the display device 10, the light-emitting devices are arranged in a matrix in the display portion 15, and an image can be displayed on the display portion 15. Furthermore, the light-receiving devices are arranged in a matrix in the display portion 15, and the display portion has one or both of an image capturing function and a sensing function in addition to an image displaying function. The display portion 15 can be used for an image sensor. That is, an image can be captured by detecting light with the display portion 15, or the movement of an object (the movement of an eye, an eyelid, or an eyeball) can be detected by regularly monitoring an image. Furthermore, in the display device 10, the light-emitting devices can be used as a light source of the sensor. Accordingly, a light-receiving portion and a light source are not necessarily provided separately from the display device 10, and the number of components of the electronic device can be reduced.

For example, a light-emitting device emitting infrared light (IR) can be used for the element 62X_1. A light-receiving device detecting visible light can be used for the element 62X_2. A light-receiving device detecting infrared light can be used for the element 62X_3.

At this time, the element 62X_2 is preferably capable of detecting light emitted from one or more of the display element 61R, the display element 61G, and the display element 61B. In addition, the element 62X_3 is preferably capable of detecting infrared light emitted from the element 62X_1.

Note that the pixel 63 is not limited to a structure including six kinds of elements. For example, a light-receiving device detecting visible light can be used for the element 62X_1, and a light-receiving device detecting infrared light can be used for each of the element 62X_2 and the element 62X_3.

At this time, the element 62X_1 is preferably capable of detecting light emitted from one or more of the display element 61R, the display element 61G, and the display element 61B. In addition, the element 62X_2 and the element 62X_3 detect infrared light emitted from a light source that is provided separately from the display device 10.

In addition, the refresh rate of the display device according to one embodiment of the present invention can be variable. For example, the refresh rate is adjusted (adjusted in the range from 1 Hz to 240 Hz, for example) in accordance with contents displayed on the display device, so that power consumption can be reduced. Furthermore, the drive frequency of the light-receiving device may be changed in accordance with the refresh rate. In the case where the refresh rate of the display device is 120 Hz, for example, a structure can be employed in which the drive frequency of the light-receiving device is a frequency higher than 120 Hz (typically 240 Hz). Such a structure can achieve low power consumption and can increase the response speed of the light-receiving device.

Structure Example 2 of Display Device

Figure 2A:
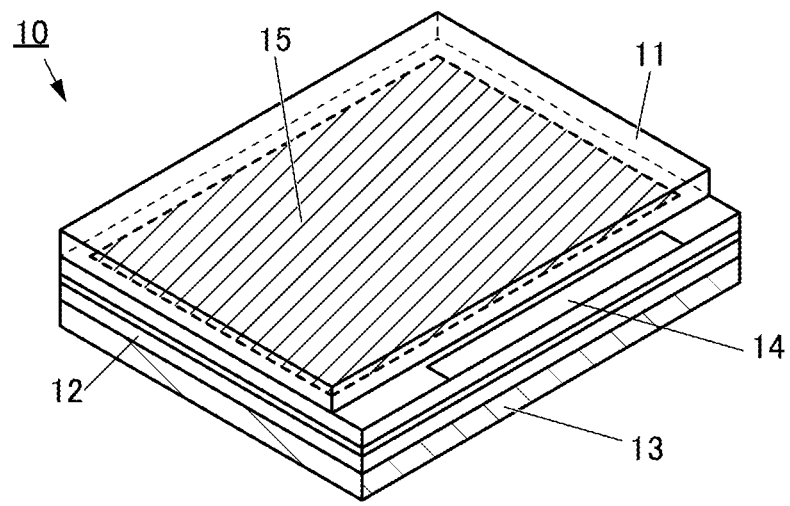
FIG. 2A and FIG. 2B are diagrams each illustrating a structure example of the display device.
Figure 2B:
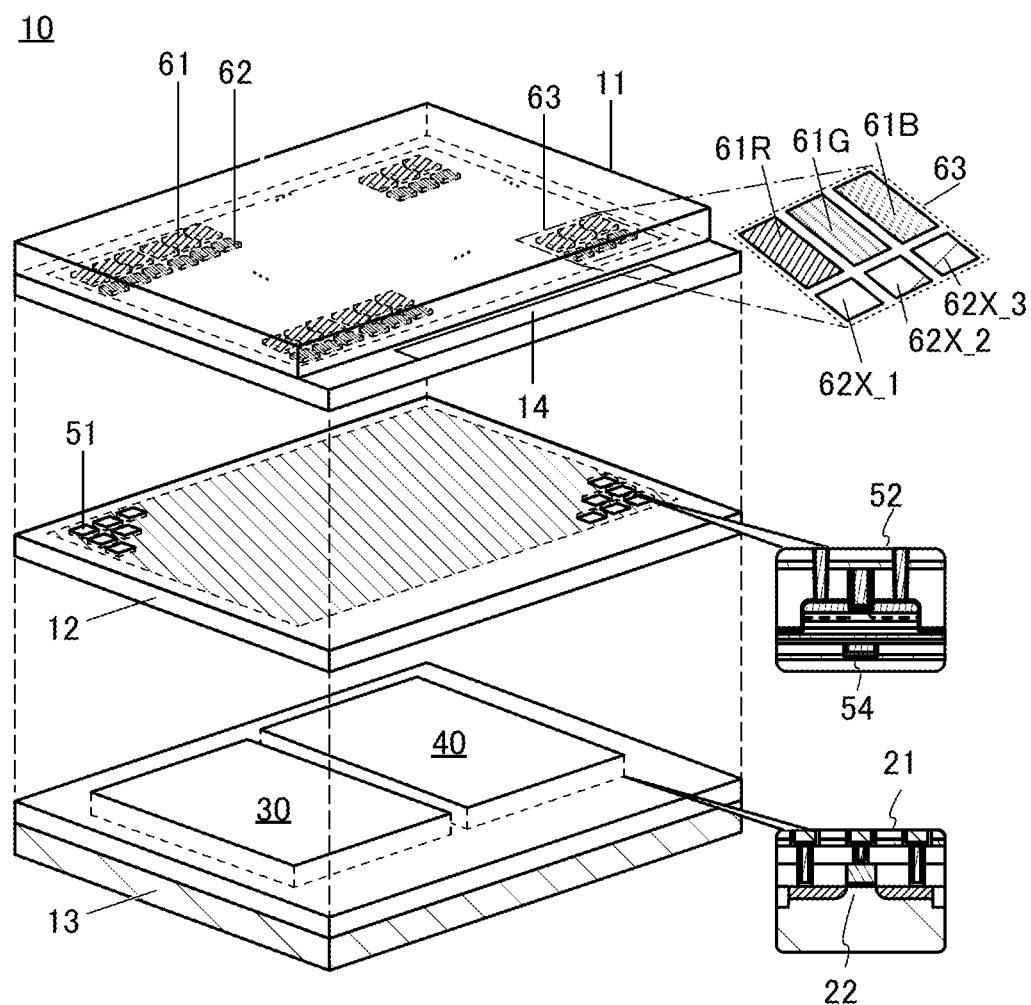

FIG. 2A and FIG. 2B are modification examples of the display device 10 illustrated in FIG. 1A and FIG. 1B. Structures that are different from the structures illustrated in FIG. 1A and FIG. 1B are described below.

The display device 10 illustrated in FIG. 2A and FIG. 2B includes the layer 11, the layer 12, and a layer 13. The layer 13 is provided with a driver circuit 30 and a functional circuit 40. The layer 13 includes transistors 21 containing silicon in channel formation regions 22. The layer 12 includes transistors 52 containing a metal oxide in channel formation regions 54.

The driver circuit 30 includes a gate driver circuit, a source driver circuit, or the like, for example. In addition, one or more of an arithmetic circuit, a memory circuit, a power supply circuit, and the like may be included. Since the gate driver circuit, the source driver circuit, and other circuits can be placed to be overlapped with the display portion 15, the width of a non-display region (also referred to as a bezel) provided along the outer periphery of the display portion 15 of the display device 10 can be extremely narrow compared with the case where these circuits and the display portion 15 are arranged side by side, so that the small display device 10 can be achieved.

The functional circuit 40 has a function of an application processor for generating signals for controlling the circuits in the display device 10, for example. In addition, the functional circuit 40 may include a CPU and a circuit for correcting image data, such as an accelerator (e.g., a GPU). Furthermore, the functional circuit 40 may include an LVDS (Low Voltage Differential Signaling) circuit, an MIPI (Mobile Industry Processor Interface) circuit, and/or a D/A (Digital to Analog) converter circuit, or the like having a function of an interface for receiving image data or the like from the outside of the display device 10. Moreover, the functional circuit 40 may include a circuit for compressing and decompressing image data and/or a power supply circuit, for example.

Structure Example 3 of Display Device

Figure 3A:
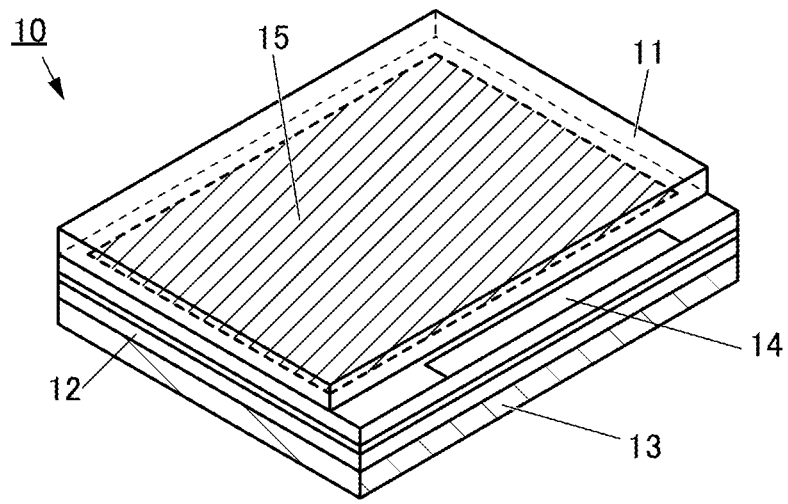
FIG. 3A and FIG. 3B are diagrams each illustrating a structure example of the display device.
Figure 3B:
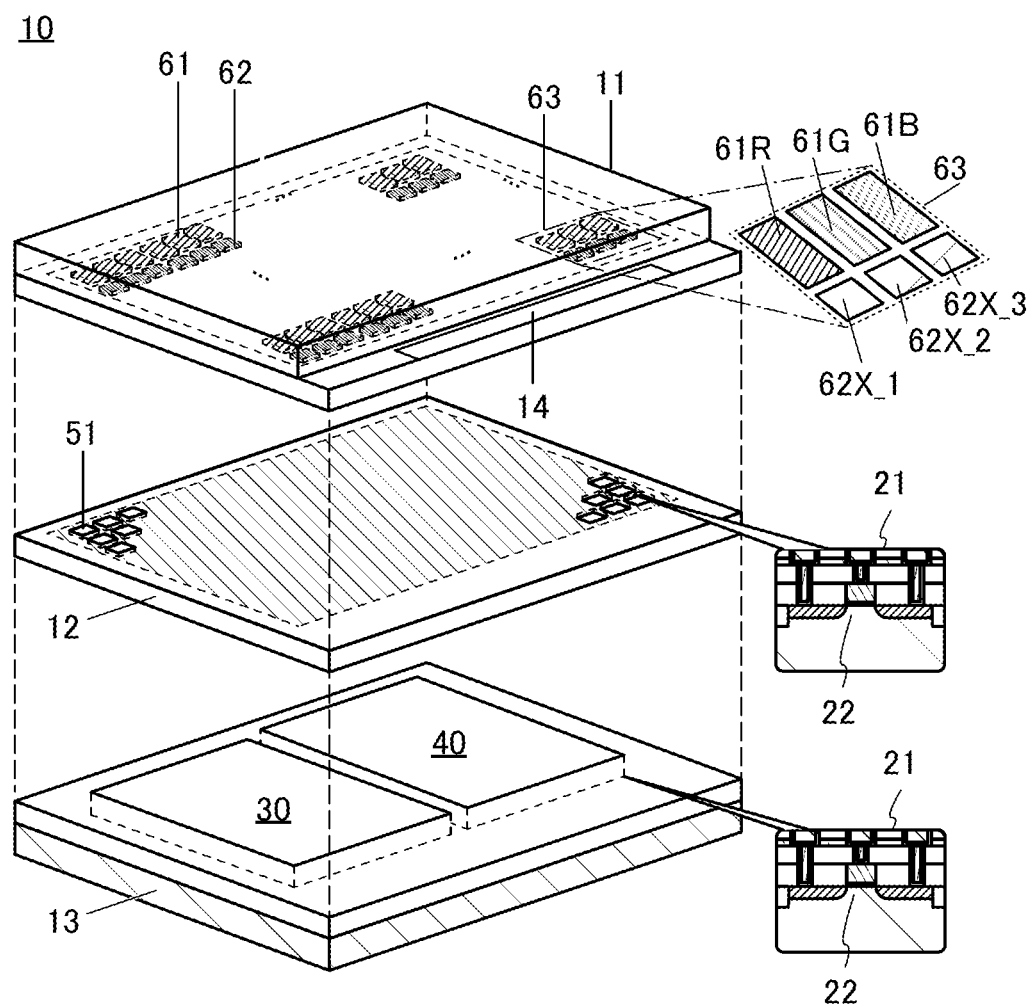

FIG. 3A and FIG. 3B are modification examples of the display device 10 illustrated in FIG. 2A and FIG. 2B. Structures that are different from the structures illustrated in FIG. 2A and FIG. 2B are described below.

The display device 10 illustrated in FIG. 3A and FIG. 3B includes the layer 11, the layer 12, and the layer 13. The layer 13 is provided with the driver circuit 30 and the functional circuit 40. The layer 12 and the layer 13 each include the transistors 21 containing silicon in the channel formation regions 22.

When Si transistors are employed for each of the layer 12 and the layer 13, the layer 12 and the layer 13 can be formed using the same kind of material and can be formed through the same manufacturing process, which is suitable. In addition, since the on-state current of the Si transistors can be made high as described above, the display device can be compatible with a high-speed operation.

Structure Example 4 of Display Device

Figure 4A:
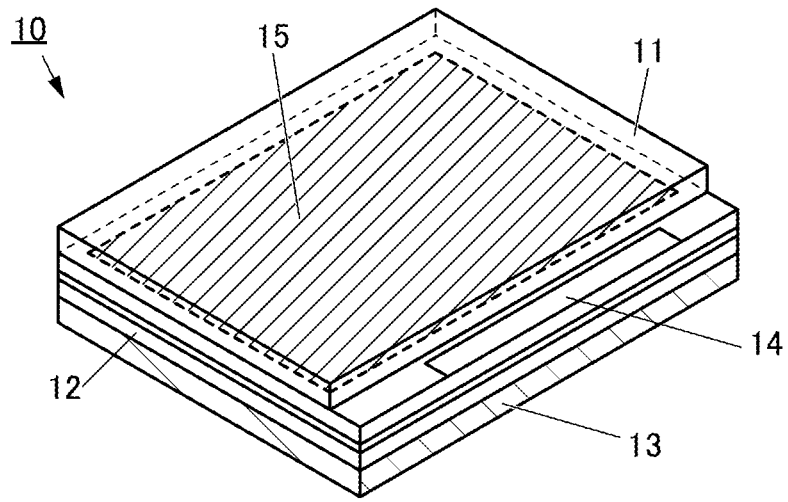
FIG. 4A and FIG. 4B are diagrams each illustrating a structure example of the display device.
Figure 4B:
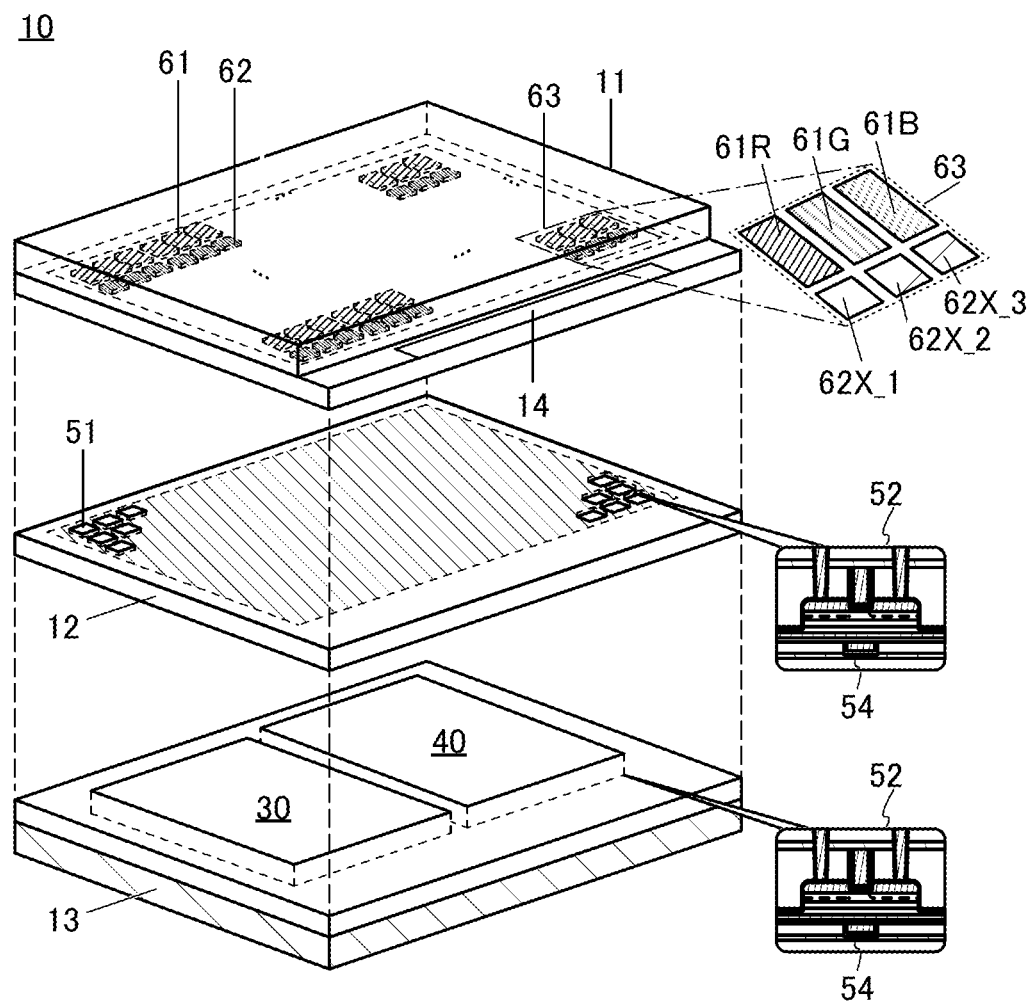

FIG. 4A and FIG. 4B are modification examples of the display device 10 illustrated in FIG. 3A and FIG. 3B. Structures that are different from the structures illustrated in FIG. 3A and FIG. 3B are described below.

The display device 10 illustrated in FIG. 4A and FIG. 4B includes the layer 11, the layer 12, and the layer 13. The layer 13 is provided with the driver circuit 30 and the functional circuit 40. The layer 12 and the layer 13 each include the transistors 52 containing a metal oxide in the channel formation regions 54.

When OS transistors are employed for each of the layer 12 and the layer 13, the layer 12 and the layer 13 can be formed using the same kind of material and can be formed through the same manufacturing process, which is suitable. In addition, since the off-state current of the OS transistors can be made low as described above, power consumption can be reduced in the case where the display device requires long-term data retention or the like, which is suitable.

Figure 5:
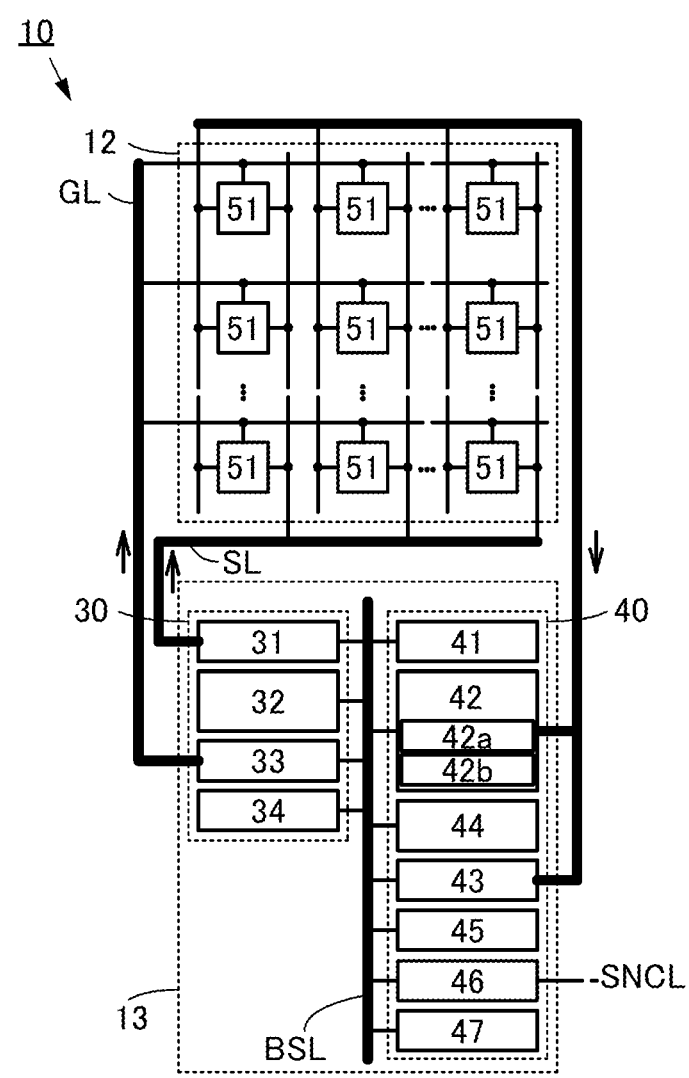
FIG. 5 is a block diagram illustrating a structure example of the display device.

Next, specific structure examples of the driver circuit 30 and the functional circuit 40 that are described above are described with reference to FIG. 5. The display device 10 illustrated in FIG. 5 is a block diagram illustrating a plurality of wirings connecting the pixel circuits 51, the driver circuit 30, and the functional circuit 40, a bus wiring, and the like.

The display device 10 according to one embodiment of the present invention can have a structure in which the display elements 61, the pixel circuits 51, the driver circuit 30, and the functional circuit 40 are stacked; thus, the aperture ratio (effective display area ratio) of the pixels can be significantly increased. For example, the pixel aperture ratio can be greater than or equal to 40% and less than 100%, preferably greater than or equal to 50% and less than or equal to 95%, further preferably greater than or equal to 60% and less than or equal to 95%. Furthermore, the pixel circuits 51 can be arranged extremely densely, and the definition of the pixels can be extremely high. For example, the pixels can be arranged in the display portion of the display device 10 (a region where the pixel circuits 51 and the display elements 61 are stacked) with a definition higher than or equal to 2000 ppi, preferably higher than or equal to 3000 ppi, further preferably higher than or equal to 5000 ppi, still further preferably higher than or equal to 6000 ppi, and lower than or equal to 20000 ppi or lower than or equal to 30000 ppi.

The display device 10 described above has extremely high definition, and thus can be suitably used for a device for VR such as a head-mounted display or a glasses-type device for AR. For example, even in the case of a structure in which the display portion of the display device 10 is seen through a lens, pixels of the extremely high-definition display portion included in the display device 10 are not seen even when the display portion is enlarged by the lens, so that display providing a high sense of immersion can be performed. Without limitation to the above, the display device 10 can also be suitably used for an electronic device having a comparatively small display portion. For example, the display device 10 can be suitably used for a display portion of a wearable electronic device such as a smart watch (registered trademark).

Note that in the case where single crystal silicon is used for the material of the transistor 21 in the display device 10, the diagonal size of the display portion 15 can be greater than or equal to 0.1 inches and less than or equal to 5 inches, preferably greater than or equal to 0.5 inches and less than or equal to 3 inches, further preferably greater than or equal to 1 inch and less than or equal to 2 inches. The bezel width of the display device 10 according to one embodiment of the present invention can be extremely narrow; therefore, in the case where the diagonal size of the layer 12 is 1 inch, for example, the amount of light to be taken out can be approximately four times that when the diagonal size of the layer 12 is 0.5 inches, which is suitable.

Note that in the display device 10 illustrated in FIG. 5, a plurality of pixel circuits 51 are arranged in a matrix in the layer 12. Furthermore, the driver circuit 30 and the functional circuit 40 are provided in the layer 13 in the display device 10 illustrated in FIG. 5. The driver circuit 30 includes, for example, a source driver circuit 31, a digital-to-analog converter circuit 32, a gate driver circuit 33, and a level shifter 34. The functional circuit 40 includes, for example, a memory device 41, a GPU 42 (an AI accelerator), an EL correction circuit 43, a timing controller 44, a CPU 45, a sensor controller 46, and a power supply circuit 47. The functional circuit 40 has a function of an application processor.

In addition, the display device 10 in FIG. 5 has a structure in which, for example, a bus wiring BSL is electrically connected to each of the circuits included in the driver circuit 30 and each of the circuits included in the functional circuit 40.

The source driver circuit 31 has a function of transmitting image data to the pixel circuit 51, for example. Thus, the source driver circuit 31 is electrically connected to the pixel circuit 51 through a wiring SL.

The digital-to-analog converter circuit 32 has a function of, for example, converting image data that has been digitally processed by a GPU, a correction circuit, or the like into analog data. The image data converted into analog data is transmitted to the pixel circuit 51 via the source driver circuit 31. Note that the digital-to-analog converter circuit 32 may be included in the source driver circuit 31, or the image data may be transmitted to the source driver circuit 31, the digital-to-analog converter circuit 32, and the pixel circuit 51 in this order.

The gate driver circuit 33 has a function of selecting a pixel circuit to which image data is to be transmitted in the pixel circuit 51, for example. Thus, the gate driver circuit 33 is electrically connected to the pixel circuit 51 through a wiring GL.

The level shifter 34 has a function of converting signals to be input to the source driver circuit 31, the digital-to-analog converter circuit 32, the gate driver circuit 33, and the like into signals having appropriate levels, for example.

The memory device 41 has a function of storing image data to be displayed by the pixel circuit 51, for example. Note that the memory device 41 can be configured to store the image data as digital data or analog data.

In addition, in the case where the memory device 41 stores image data, it is preferable to use a nonvolatile memory as the memory device 41. In that case, a NAND type memory or the like can be employed as the memory device 41, for example.

Furthermore, in the case where the memory device 41 stores temporary data generated in the GPU 42, the EL correction circuit 43, the CPU 45, or the like, it is preferable to use a volatile memory as the memory device 41. In that case, an SRAM (Static Random Access Memory), a DRAM (Dynamic Random Access Memory), or the like can be employed as the memory device 41, for example.

The GPU 42 has a function of performing processing for outputting image data read from the memory device 41 to the pixel circuit 51, for example. In particular, the GPU 42 is configured to perform pipeline processing in parallel and thus can perform high-speed processing of image data to be output to the pixel circuit 51. The GPU 42 can also have a function of a decoder for restoring an encoded image.

In addition, the functional circuit 40 may include a plurality of circuits that can improve the display quality of the display device 10. As such circuits, for example, correction circuits (dimming and toning) that sense color irregularity of a displayed image and correct the color irregularity to obtain an optimal image may be provided. Furthermore, in the case where a light-emitting device using an organic EL material is employed for the display element, the functional circuit 40 may be provided with an EL correction circuit. The functional circuit 40 includes, for example, the EL correction circuit 43.

In addition, artificial intelligence may be used for the above image correction. For example, current flowing through a pixel circuit (or voltage applied to the pixel circuit) may be monitored and acquired, a displayed image may be acquired with an image sensor or the like, the current (or voltage) and the image may be treated as input data in an arithmetic operation of artificial intelligence (e.g., an artificial neural network or the like), and whether to correct the image or not may be determined based on the output result.

Furthermore, such an arithmetic operation of artificial intelligence can be applied not only to image correction but also to up-conversion processing (down-conversion processing) of image data. As an example, six GPUs 42 illustrate blocks for performing arithmetic operations for a variety of corrections (color irregularity correction 42a, up conversion 42b, and the like).

The timing controller 44 has a function of varying a frame rate at which an image is displayed, for example. For example, the display device 10 can be driven at a frame rate decreased by the timing controller 44 in the case where the display device 10 displays a still image. For another example, the display device 10 can be driven at a frame rate increased by the timing controller 44 in the case where the display device 10 displays a moving image.

The CPU 45 has a function of performing general-purpose processing such as execution of an operating system, data control, and execution of a variety of arithmetic operations or programs, for example. The CPU 45 has a function of, for example, giving an instruction for a writing operation or a reading operation of image data in the memory device 41, an operation for correcting image data, an operation for a later-described sensor, or the like. Furthermore, the CPU 45 may have a function of transmitting a control signal to at least one of the circuits included in the functional circuit 40, for example.

The sensor controller 46 has a function of controlling a sensor, for example. In addition, FIG. 5 illustrates a wiring SNCL as a wiring for electrical connection to the sensor. The sensor can be, for example, a touch sensor that can be provided in the display portion. Alternatively, the sensor can be an illuminance sensor, for example.

The power supply circuit 47 has a function of generating voltage to be supplied to the pixel circuits 51, the circuits included in the driver circuit 30 and the functional circuit 40, and the like. Note that the power supply circuit 47 may have a function of selecting a circuit to which voltage is to be supplied. The power supply circuit 47 stops supply of voltage to the CPU 45, the GPU 42, and the like during a period in which a still image is displayed, so that the power consumption of the whole display device 10 can be reduced, for example.

As described above, the display device according to one embodiment of the present invention can have a structure in which light-emitting devices, sensor devices, and circuit devices (pixel circuits, a driver circuit, a functional circuit, and the like) are stacked. The driver circuit and the functional circuit that are peripheral circuits can be provided to be overlapped with the pixel circuits and thus the bezel width can be made extremely narrow, so that a display device with reduced size can be achieved. Alternatively, when the display device according to one embodiment of the present invention has a structure where circuits are stacked, wirings for connecting the circuits can be shortened, which results in a display device with reduced weight. Alternatively, the display device according to one embodiment of the present invention can be a display portion with high pixel definition; thus, the display device according to one embodiment of the present invention can be a display device having high display quality.

At least part of the structure examples, the drawings corresponding thereto, and the like described in this embodiment as examples can be combined with the other structure examples, the other drawings, and the like as appropriate.

Embodiment 2

In this embodiment, a display device according to one embodiment of the present invention will be described with reference to drawings.

Figure 6A:
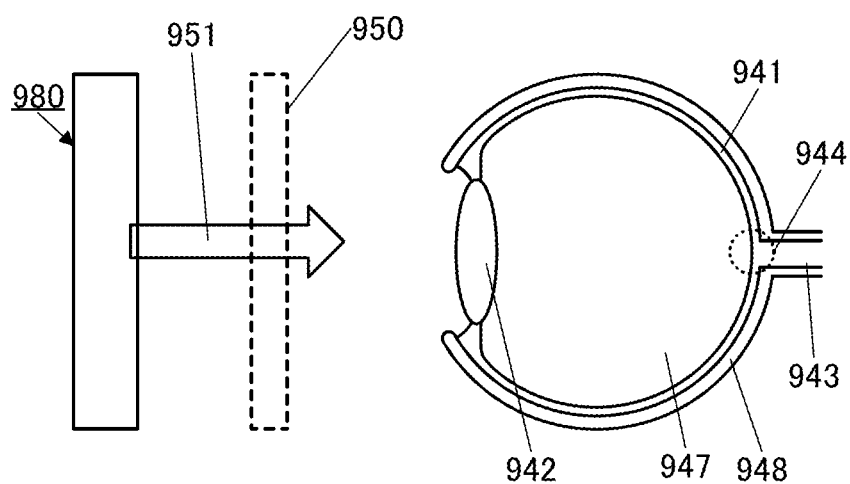
FIG. 6A is a cross-sectional schematic diagram of a display device and a user's eye illustrating one embodiment of the present invention.

FIG. 6A is a schematic cross-sectional view showing a positional relationship between a display device 980 and a user's eye. The display device 980 includes a plurality of light-emitting devices and a plurality of sensor devices.

Light 951 emitted from the light-emitting devices included in the display device 980 is delivered to the eye through an optical system 950, and light reflected by the eye is received by the sensor devices. The display device 980 can capture an image of the periphery of the eye, the surface of the eye, or the inside (fundus or the like) of the eye.

For example, the display device 980 illustrated in FIG. 6A includes the light-emitting devices and the sensor devices, and thus can capture an image of the fundus of one's eye through the optical system 950 to obtain image data of a retinal pattern. Note that it is difficult to capture an image other than that of a focused target when the focus is adjusted with the optical system 950. For example, when the fundus of the eye is focused on, the periphery of the eye or the like is out of focus and thus an image thereof can hardly be captured.

The display device according to one embodiment of the present invention includes a light-emitting device and a light-receiving device in a pixel. In the display device according to one embodiment of the present invention, the pixel has a light-receiving function, so that the contact or approach of an object can be detected while an image is displayed. For example, an image can be displayed using subpixels included in the display device. Alternatively, some subpixels can emit light as a light source, some other subpixels can detect light, and the remaining subpixels can display an image.

In addition, in the display device according to one embodiment of the present invention, the light-emitting devices are arranged in a matrix in a display portion, and an image can be displayed on the display portion. Furthermore, the light-receiving devices are arranged in a matrix in the display portion, and the display portion has one or both of an image capturing function and a sensing function in addition to an image displaying function. The display portion can be used for an image sensor. That is, an image can be captured by detecting light with the display portion, or the movement of an object (the movement of an eye, an eyelid, or an eyeball) can be detected by regularly monitoring an image. Furthermore, in the display device according to one embodiment of the present invention, the light-emitting devices can be used as a light source of the sensor. Accordingly, a light-receiving portion and a light source are not necessarily provided separately from the display device, so that the number of components of an electronic device can be reduced.

First, a method for detecting a user's blink and eyelid movement is described below using FIG. 6A and FIG. 6B.

<Blink and Eyelid Movement>

The display device 980 emits near-infrared light. The user's eye or the periphery of the user's eye is irradiated with the near-infrared light through the optical system 950. Reflected light goes through the optical system 950 again and enters the display device 980. Accordingly, the state of an object can be detected.

Figure 6B:
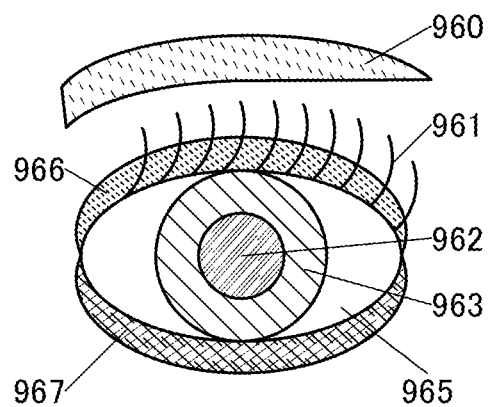
FIG. 6B is a schematic diagram illustrating the user's eye and the periphery of the user's eye.

Note that FIG. 6B is a schematic view illustrating a user's eye and the periphery of the user's eye. FIG. 6B illustrates a user's eyebrow 960, user's eyelids (an upper eyelid 966 and a lower eyelid 967), user's eyelashes 961, a user's pupil 962, a user's cornea 963, and a user's sclera 965. The display device 980 has a function of detecting one or more selected from the user's eyebrow 960, the user's eyelids (the upper eyelid 966 and the lower eyelid 967), the user's eyelashes 961, the user's pupil 962, the user's cornea 963, and the user's sclera 965 that are illustrated in FIG. 6B.

For example, the display device according to one embodiment of the present invention can detect the state of the user's eye or the periphery of the user's eye illustrated in FIG. 6B with the use of the display device 980. For example, when the user closes the eyelids (the upper eyelid 966 and the lower eyelid 967), the surface of the eyelids, i.e., the skin is irradiated with the near-infrared light. In addition, when the user open the eyelids, the surface of the user's eyeball is irradiated with the near-infrared light. Since the skin and the surface of an eyeball have different reflectances, the intensities of reflected near-infrared light are different. By continuously monitoring this state, the display device 980 can detect one or both of the number of blinks and the time required for one blink.

When the user looks at a display for a long time, the number of blinks might be decreased. Furthermore, when the user feels fatigue, blink intervals might become longer and the time required for one blink might become longer.

The display device according to one embodiment of the present invention can estimate the fatigue level of the user from one or both of the number of user's blinks per unit time and the time required for one blink.

<Iris Movement>

When a boundary region between a cornea (e.g., the cornea 963 illustrated in FIG. 6B) and a sclera (e.g., the sclera 965 illustrated in FIG. 6B) is irradiated with an infrared circular spot, the ratio of a region covering the cornea to a region covering the sclera in an infrared spot irradiation range changes in accordance with the eyeball movement. Reflectance from the region covering the sclera is much higher than that from the region covering the cornea, and thus the amount of reflected light changes in accordance with the eyeball movement. By measuring this change, a direction in which the user sees can be detected.

<Scleral Reflection Method>

Next, a scleral reflection method is described. The display device 980 emits near-infrared light. The user's eye is irradiated with the near-infrared light through the optical system 950. Light reflected by the eye goes through the optical system 950 again and enters the display device 980. Accordingly, the state of an object can be detected. The user shifts his/her line of sight when watching a fast-moving object in a displayed video. When the line of sight is shifted, the eyeball moves. When the eyeball moves, the ratio of the region covering the cornea to the region covering the sclera that are irradiated with infrared light changes. Thus, by monitoring a reflected light component, the eyeball movement can be detected. That is, the display device according to one embodiment of the present invention has an eye tracking function.

A region the user watches carefully can be estimated by detecting the user's line of sight by eye tracking. In addition, the resolution of a region other than the region the user watches carefully is reduced by variable rate shading, so that the amount of calculation by the display device 980 can be reduced and a display device with reduced power consumption can be provided.

Since the display device according to one embodiment of the present invention includes both the light-emitting devices and the sensor devices in the display device 980, the number of components can be reduced.

Figure 6C:
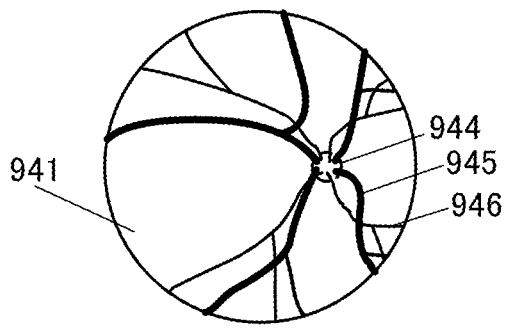
FIG. 6C is a schematic diagram illustrating the retina pattern of the user's eye.

Next, funduscopy of the user's eye is described using FIG. 6A and FIG. 6C.

<Funduscopy>

As illustrated in FIG. 6A, the user's eye is made up of a crystalline lens 942, a retina 941, an optic nerve 943, a vitreous body 947, a choroid 948, a cornea, and the like. Note that for simplicity, the cornea and a pupil between the cornea and the crystalline lens are not illustrated. A ciliary body is a tissue continuous with an iris, and the choroid 948 is a tissue continuous with the ciliary body. Like the diaphragm of a camera, the iris and the pupil adjust light delivered to the retina 941. It is said that the pattern of the retina 941, what is called the retina pattern does not change from birth until death basically, and the use of the retina pattern enables personal authentication or the like. Eye diagnosis is possible even from a remote place with the use of the retina pattern obtained by the display device 980.

Note that the display device 980 has a function of detecting one or more selected from a user's blink, iris movement, and eyelid movement without focusing on the fundus of an eye by adjusting the optical system 950. That is, the display device 980 has a function of detecting eye fatigue.

Next, FIG. 6C illustrates an example of the retina pattern of a right eye obtained by image capturing with the use of the display device according to one embodiment of the present invention. An optic disc 944, a vein 945, an artery 946, a macula, a fovea, and the like can be observed in the retina 941. Note that for easily distinguishing between the vein 945 and the artery 946, the vein 945 is illustrated with a thicker solid line than the artery 946 in FIG. 6C. The optic disc 944 is a boundary portion between the optic nerve 943 and the retina 941, and the vein 945 or the artery 946 extends from the optic disc 944. Note that the fundus of the eye is a portion behind the eyeball and collectively means the retina 941, the vitreous body 947, the choroid 948, and the optic disc 944. Note that the optic disc 944 of the left eye is positioned on the left side of the retina pattern, and the retina pattern of the left eye is a mirror-reversed retina pattern of the right eye in FIG. 6C.

To obtain the retina pattern of the fundus of the eye with the use of the sensor device included in the display device 980, the pupil needs to be open. Display is changed in the following procedure to capture an image of the fundus of the eye with the pupil open. The display screen of the display device 980 is gradually darkened so that the user's eye adapts to the dark. The display screen is brightened for a short time of less than or equal to 16.7 ms and an image is captured. After that, the brightness of the display screen is gradually returned to the original.

In addition, the fatigue level of the user's eye can be detected by the display device 980. When an image is captured while the display screen is brightened for a certain period of time, an image of the eye cannot be captured if the user blinks. Therefore, through detection of the number of blinks, blink timing, or the time when the user closes the eye, the eye fatigue level can also be estimated by a system utilizing AI (Artificial Intelligence) from the number of blinks, blink intervals, the time when the user closes the eye, or the like.

Furthermore, to detect the fatigue level of the user's eye, images may be captured more than once while the display screen of the display device 980 is darkened. When images are captured more than once, the pulse of a retina blood vessel can be detected and whether the user is in a rest state, in a state of tension, or the like can be further determined by the system utilizing AI. Furthermore, diagnosis of high blood pressure, diagnosis of diabetes, or the like can be performed with the system utilizing AI by using a variety of pieces of data obtained by the display device 980. In the case of employing the system utilizing AI, a control circuit is mounted on the display device 980. A CPU or a GPU is used for the control circuit. Alternatively, an APU (Accelerated Processing Unit) that is an integrated chip of a CPU and a GPU can also be used for the control circuit. Alternatively, an IC incorporating an AI system (also referred to as an inference chip) may be used. The IC incorporating an AI system is sometimes referred to as a circuit performing neural network calculation (a microprocessor).

In addition, the direction of an eyeball may be controlled by displaying an eye-catching pattern on the screen of the display device 980 while the display screen of the display device 980 is darkened.

A distance between the display device 980 and the surface of an eye (e.g., a cornea) is preferably less than or equal to 5 cm, further preferably less than or equal to 2 cm. The optical system 950 having a short focal distance is provided between the display device 980 and the eye to achieve this positional relationship.

In the case where an image is displayed on a screen at a magnification of 10 times by the optical system 950, for example, a sensor pixel pitch is approximately 10.4 µm in a display screen of the display device 980 having a diagonal of approximately 1 inch and a resolution (definition) of approximately 2450 ppi. Since the vascular diameter of each of the vein 945 and the artery 946 of the retina is smaller than approximately 100 µm, an image of the vein 945 or the artery 946 can be captured with the display device 980.

At least part of this embodiment can be implemented in combination with the other embodiments described in this specification as appropriate.

Embodiment 3

In this embodiment, structure examples and a driving method example of a pixel circuit that can be employed for the pixel circuit 51 will be described.

Figure 7A:
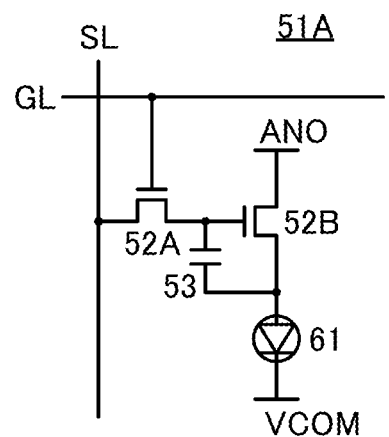
FIG. 7A to FIG. 7D are diagrams each illustrating a structure example of a pixel circuit.

A pixel circuit 51A illustrated in FIG. 7A illustrates a transistor 52A, a transistor 52B, and a capacitor 53. FIG. 7A also illustrates the display element 61 connected to the pixel circuit 51A. The wiring SL, the wiring GL, a wiring ANO, and a wiring VCOM are electrically connected to a pixel circuit PIX1.

In the transistor 52A, a gate is electrically connected to wiring GL, one of a source and a drain is electrically connected to the wiring SL, and the other of the source and the drain is electrically connected to a gate of the transistor 52B and one electrode of a capacitor C1. One of a source and a drain of the transistor 52B is electrically connected to the wiring ANO, and the other of the source and the drain of the transistor 52B is electrically connected to an anode of the display element 61. The other electrode of the capacitor C1 is electrically connected to the anode of the display element 61. A cathode of the display element 61 is electrically connected to the wiring VCOM.

Figure 7B:
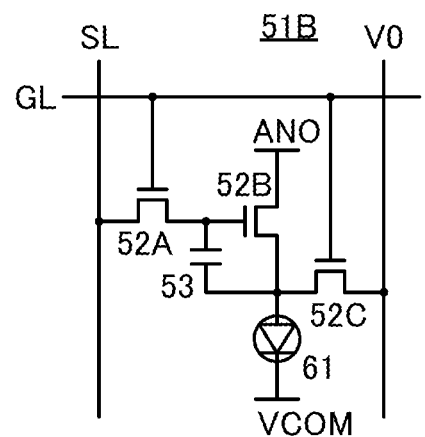

A pixel circuit 51B illustrated in FIG. 7B has a structure in which a transistor 52C is added to the pixel circuit 51A. In addition, a wiring V0 is electrically connected to the pixel circuit 51B.

Figure 7C:
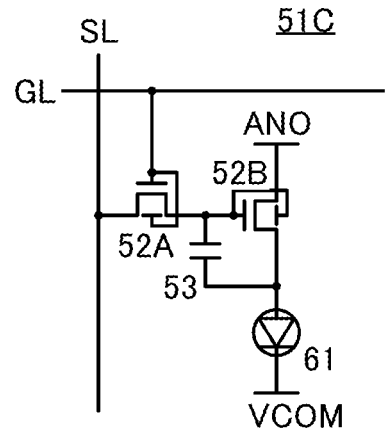
Figure 7D:
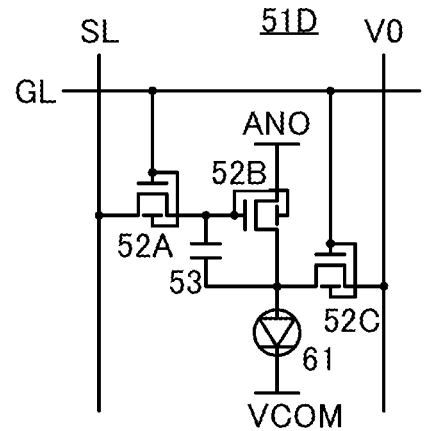

A pixel circuit 51C illustrated in FIG. 7C is an example when a transistor including a pair of gates electrically connected to each other is employed as each of the transistor 52A and the transistor 52B in the pixel circuit 51A. In addition, a pixel circuit 51D illustrated in FIG. 7D is an example when such transistors are employed in the pixel circuit 51B. Thus, current that can flow through the transistors can be increased. Note that although a transistor including a pair of gates electrically connected to each other is employed as each of the transistors here, one embodiment of the present invention is not limited thereto. Alternatively, a transistor that includes a pair of gates electrically connected to different wirings may be employed. When a transistor whose one of gates is electrically connected to a source is used, for example, reliability can be increased.

Figure 8A:
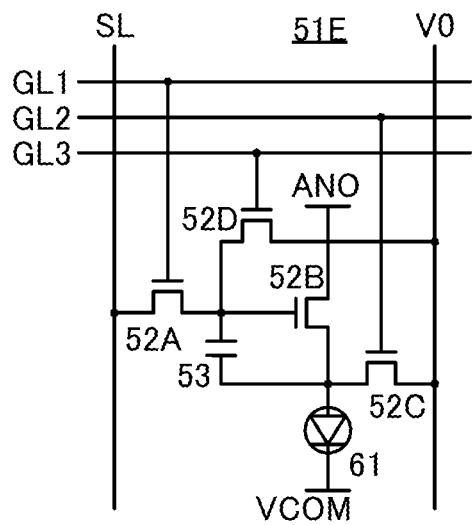
FIG. 8A to FIG. 8D are diagrams each illustrating a structure example of a pixel circuit.

A pixel circuit 51E illustrated in FIG. 8A has a structure in which a transistor 52D is added to 51B. In addition, three wirings (a wiring GL1, a wiring GL2, and a wiring GL3) functioning as gate lines are electrically connected to the pixel circuit 51E.

A gate of the transistor 52D is electrically connected to the wiring GL3, one of a source and a drain of the transistor 52D is electrically connected to the gate of the transistor 52B, and the other of the source and the drain of the transistor 52D is electrically connected to the wiring V0. In addition, the gate of the transistor 52A is electrically connected to the wiring GL1, and a gate of the transistor 52C is electrically connected to the wiring GL2.

When the transistor 52C and the transistor 52D are brought into conduction at the same time, the source and the gate of the transistor 52B have the same potential, so that the transistor 52B can be brought out of conduction. Thus, current flowing through the display element 61 can be interrupted forcibly. Such a pixel circuit is suitable for the case of using a display method in which a display period and an off period are alternately provided.

Figure 8B:
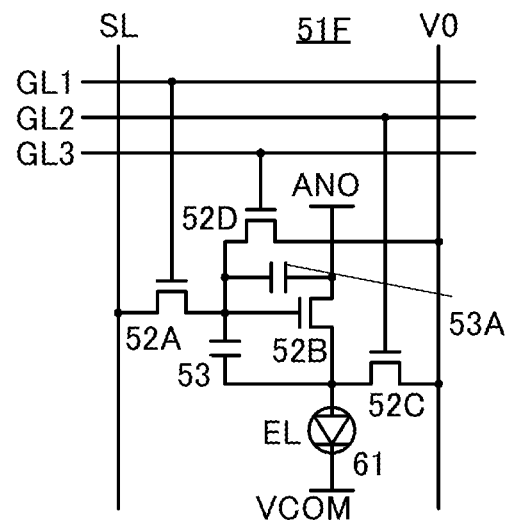

A pixel circuit 51F illustrated in FIG. 8B is an example when a capacitor 53A is added to the pixel circuit 51E. The capacitor 53A functions as a storage capacitor.

Figure 8C:
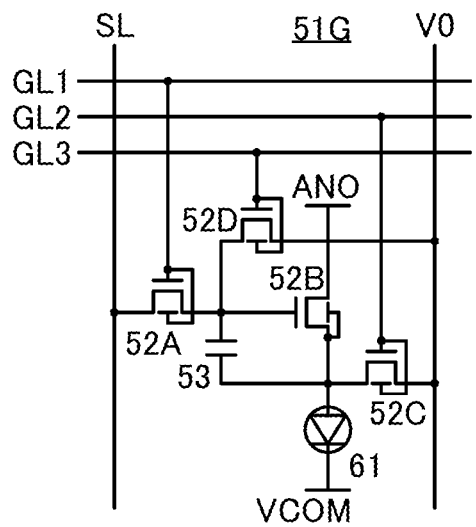
Figure 8D:
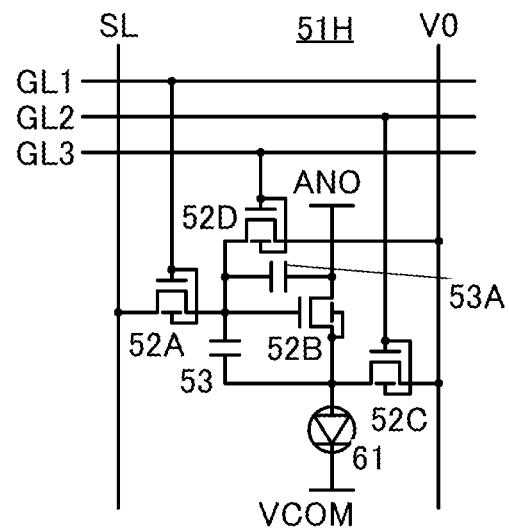

A pixel circuit 51G illustrated in FIG. 8C and a pixel circuit 51H illustrated in FIG. 8D are each an example when a transistor including a pair of gates is employed in the pixel circuit 51E or the pixel circuit 51F. A transistor whose pair of gates are electrically connected to each other is employed as each of the transistor 52A, the transistor 52C, and the transistor 52D, and a transistor whose one of gates is electrically connected to a source is employed as the transistor 52B.

At least part of this embodiment can be implemented in combination with the other embodiments described in this specification as appropriate.

Embodiment 4

In this embodiment, display devices according to one embodiment of the present invention are described using FIG. 9 to FIG. 14.

The display devices in this embodiment can be high-definition display devices. Accordingly, the display devices in this embodiment can be used for display portions of information terminal devices (wearable devices) such as wristwatch-type and bracelet-type information terminal devices and display portions of wearable devices that can be worn on a head, such as a VR device like a head-mounted display and a glasses-type AR device.

[Display Module]

Figure 9A:
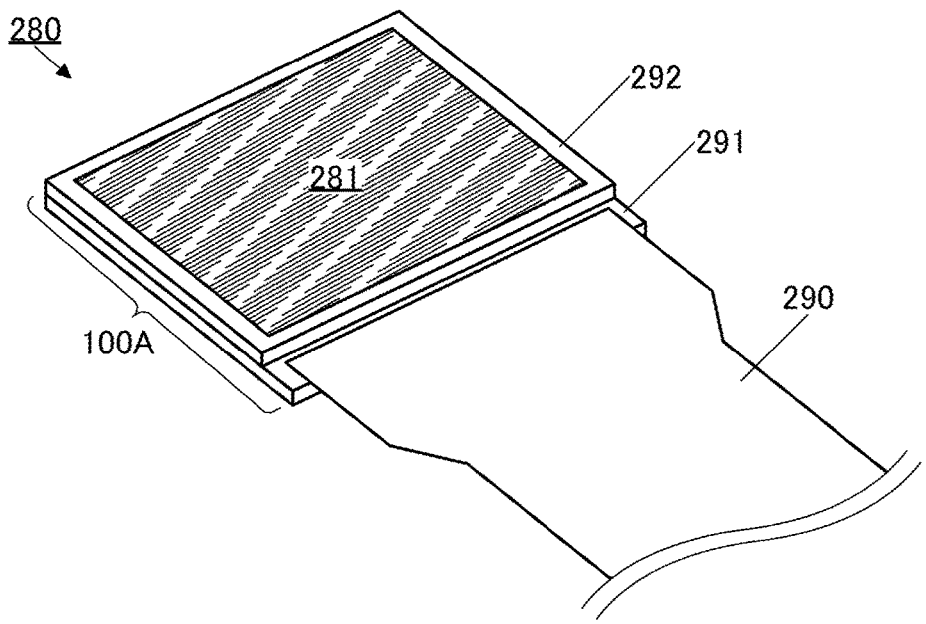
FIG. 9A and FIG. 9B are diagrams each illustrating a structure example of a display device.

FIG. 9A is a perspective view of a display module 280. The display module 280 includes a display device 100A and an FPC 290. Note that the display device included in the display module 280 is not limited to the display device 100A and may be any of a display device 100B to a display device 100E described later.

The display module 280 includes a substrate 291 and a substrate 292. The display module 280 includes a display portion 281. The display portion 281 is a region of the display module 280 where an image is displayed, and is a region where light emitted from each pixel provided in a pixel portion 284 described later can be seen.

Figure 9B:
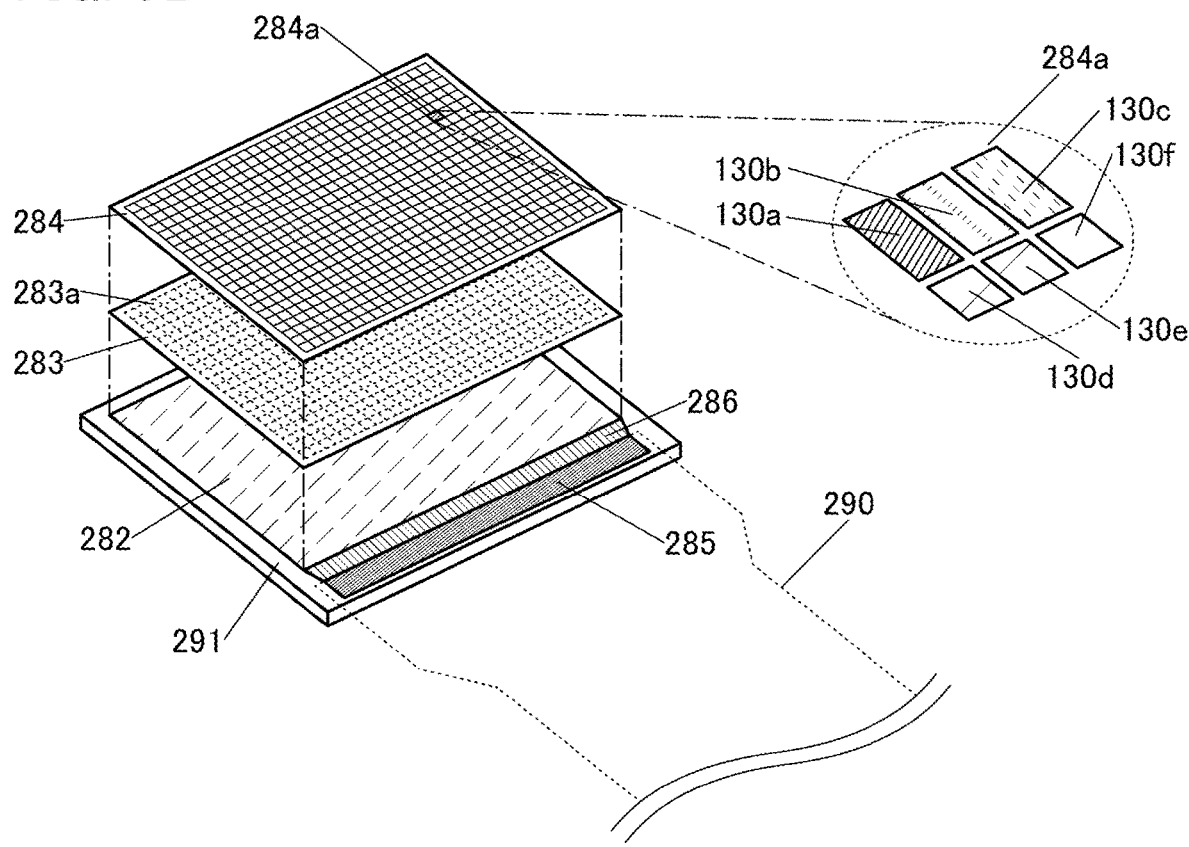

FIG. 9B is a perspective view schematically illustrating a structure on the substrate 291 side. Over the substrate 291, a circuit portion 282, a pixel circuit portion 283 over the circuit portion 282, and the pixel portion 284 over the pixel circuit portion 283 are stacked. In addition, a terminal portion 285 to be connected to the FPC 290 is provided in a portion over the substrate 291 that is not overlapped with the pixel portion 284. The terminal portion 285 and the circuit portion 282 are electrically connected to each other through a wiring portion 286 formed of a plurality of wirings.

The pixel portion 284 includes a plurality of pixels 284a arranged periodically. An enlarged view of one pixel 284a is illustrated on the right side in FIG. 9B. The pixel 284a includes six elements. The pixel 284a includes light-emitting devices 130a, 130b, and 130c whose emission colors are different from each other. The pixel 284a further includes elements 130d, 130e, and 130f The elements 130d, 130e, and 130f each correspond to the element 62 described in Embodiment 1, and a light-emitting device or a sensor device can be used, for example. Note that there is no particular limitation on the number of elements included in one pixel and an arrangement method.

Note that the pixel 284a consists of six subpixels. In such a pixel including many subpixels, high aperture ratio is extremely difficult to achieve. Alternatively, a high-definition display device is difficult to achieve with the use of a pixel including many subpixels. Thus, in the method for manufacturing the display device according to one embodiment of the present invention, an island-shaped EL layer is formed by processing an EL layer formed on the entire surface, not by using a metal mask having a fine pattern. Accordingly, a high-definition display device or a display device having high aperture ratio, each of which has been difficult to achieve, can be obtained. Moreover, since EL layers can be formed separately for respective colors, it is possible to achieve a display device that performs extremely clear display with high contrast and high display quality. Moreover, it is possible to achieve a high-definition display device or a display device having high aperture ratio, each of which incorporates a light-receiving device and has a function of detecting light.

For example, an island-shaped light-emitting layer can be deposited by a vacuum evaporation method using a metal mask (also referred to as a shadow mask). However, this method causes a deviation from the designed shape and position of an island-shaped organic film due to various influences such as the accuracy of the metal mask, the positional deviation between the metal mask and a substrate, a warp of the metal mask, and expansion of the outline of a deposited film due to vapor scattering, for example; accordingly, it is difficult to achieve high definition and high aperture ratio.

In the method for manufacturing the display device according to one embodiment of the present invention, an island-shaped pixel electrode (also referred to as a lower electrode) is formed, a first layer (which can be referred to as an EL layer or part of an EL layer) including a light-emitting layer emitting light of a first color is formed on the entire surface, and then the first layer is processed to form an island-shaped first layer. Next, like the first layer, a second layer (which can be referred to as an EL layer or part of an EL layer) including a light-emitting layer emitting light of a second color is formed on the entire surface, and the second layer is processed to form an island-shaped second layer.

Although it is difficult to set the distance between adjacent light-emitting devices to be less than 10 µm by a formation method using a metal mask, for example, the above method can shorten the distance to be less than or equal to 3 µm, less than or equal to 2 µm, or less than or equal to 1 µm.

In addition, a pattern of the EL layer itself (also referred to as a processing size) can be made extremely smaller than that in the case of using a metal mask. Furthermore, for example, in the case of using a metal mask for forming EL layers separately, a variation in thickness occurs between the center and the edge of the EL layer; thus, an effective area that can be used as a light-emitting region with respect to the area of the EL layer is reduced. In contrast, in the above manufacturing method, an EL layer is formed by processing a film that has been deposited with uniform thickness, which enables uniform thickness in the EL layer; thus, almost the entire area can be used as a light-emitting region even in the case of a fine pattern. Thus, a display device having both high definition and high aperture ratio can be manufactured.

Here, each of the first layer and the second layer includes at least a light-emitting layer and preferably consists of a plurality of layers. Specifically, one or more layers are preferably formed over the light-emitting layer. Providing a layer between the light-emitting layer and a sacrificial layer can inhibit the light-emitting layer from being exposed on the outermost surface during the manufacturing process of the display device and can reduce damage to the light-emitting layer. As a result, the reliability of the light-emitting devices can be increased.

Note that it is not necessary to form all layers included in EL layers separately between light-emitting devices emitting light of different colors, and some of the layers can be deposited in the same step. In the method for manufacturing the display device according to one embodiment of the present invention, some layers included in the EL layers are formed into an island shape separately for each color, and then other layers included in the EL layers (for example, a carrier-injection layer) and a common electrode (also referred to as an upper electrode) are commonly formed for the light-emitting devices of the respective colors.

A manufacturing method similar to that of the light-emitting device can be employed for a sensor device such as the light-receiving device. An island-shaped active layer (also referred to as a photoelectric conversion layer) included in the light-receiving device is formed by depositing a film to be the active layer on the entire surface and then processing the film, not by using a metal mask having a fine pattern; thus, the island-shaped active layer can be formed to have uniform thickness.

In the pixel of the display device in this embodiment, the subpixels including the light-emitting devices or the light-receiving devices can each include a light-emitting region or a light-receiving region having one side of greater than or equal to 1 µm and less than or equal to 1am. Moreover, the pixel can have a structure including a region where the distance between two adjacent subpixels is less than 1 µm.

The pixel circuit portion 283 includes a plurality of pixel circuits 283a arranged periodically.

One pixel circuit 283a is a circuit that controls driving of a plurality of elements included in one pixel 284a. One pixel circuit 283a may be provided with six circuits each of which controls driving of an element. For example, the pixel circuit 283a can include at least one selection transistor, one current control transistor (driving transistor), and a capacitor for one light-emitting device. At this time, a gate signal is input to a gate of the selection transistor, and a source signal is input to one of a source and a drain of the selection transistor. Thus, an active-matrix display device is achieved.

The circuit portion 282 includes a circuit for driving the pixel circuits 283a in the pixel circuit portion 283. For example, the circuit portion 282 preferably includes one or both of a gate line driver circuit and a source line driver circuit. The circuit portion 282 may further include at least one of an arithmetic circuit, a memory circuit, a power supply circuit, and the like.

The FPC 290 functions as a wiring for supplying a video signal, a power supply potential, or the like to the circuit portion 282 from the outside. In addition, an IC may be mounted on the FPC 290.

The display module 280 can have a structure in which one or both of the pixel circuit portion 283 and the circuit portion 282 are provided to be stacked below the pixel portion 284; thus, the aperture ratio (effective display area ratio) of the display portion 281 can be significantly high. For example, the aperture ratio of the display portion 281 can be greater than or equal to 40% and less than 100%, preferably greater than or equal to 50% and less than or equal to 95%, further preferably greater than or equal to 60% and less than or equal to 95%. Furthermore, the pixels 284a can be arranged extremely densely and thus the display portion 281 can have extremely high definition. For example, the pixels 284a are preferably arranged in the display portion 281 with a definition higher than or equal to 2000 ppi, preferably higher than or equal to 3000 ppi, further preferably higher than or equal to 5000 ppi, still further preferably higher than or equal to 6000 ppi, and lower than or equal to 20000 ppi or lower than or equal to 30000 ppi.

Such a display module 280 has extremely high definition, and thus can be suitably used for a VR device such as a head-mounted display or a glasses-type AR device. For example, even in the case of a structure in which the display portion of the display module 280 is seen through a lens, pixels of the extremely-high-definition display portion 281 included in the display module 280 are not seen even when the display portion is enlarged by the lens, so that display providing a high sense of immersion can be performed. Without being limited thereto, the display module 280 can also be suitably used for an electronic device having a comparatively small display portion. For example, the display module 280 can be suitably used for a display portion of a wearable electronic device, such as a wristwatch.

[Display Device 100A]

Figure 10A:
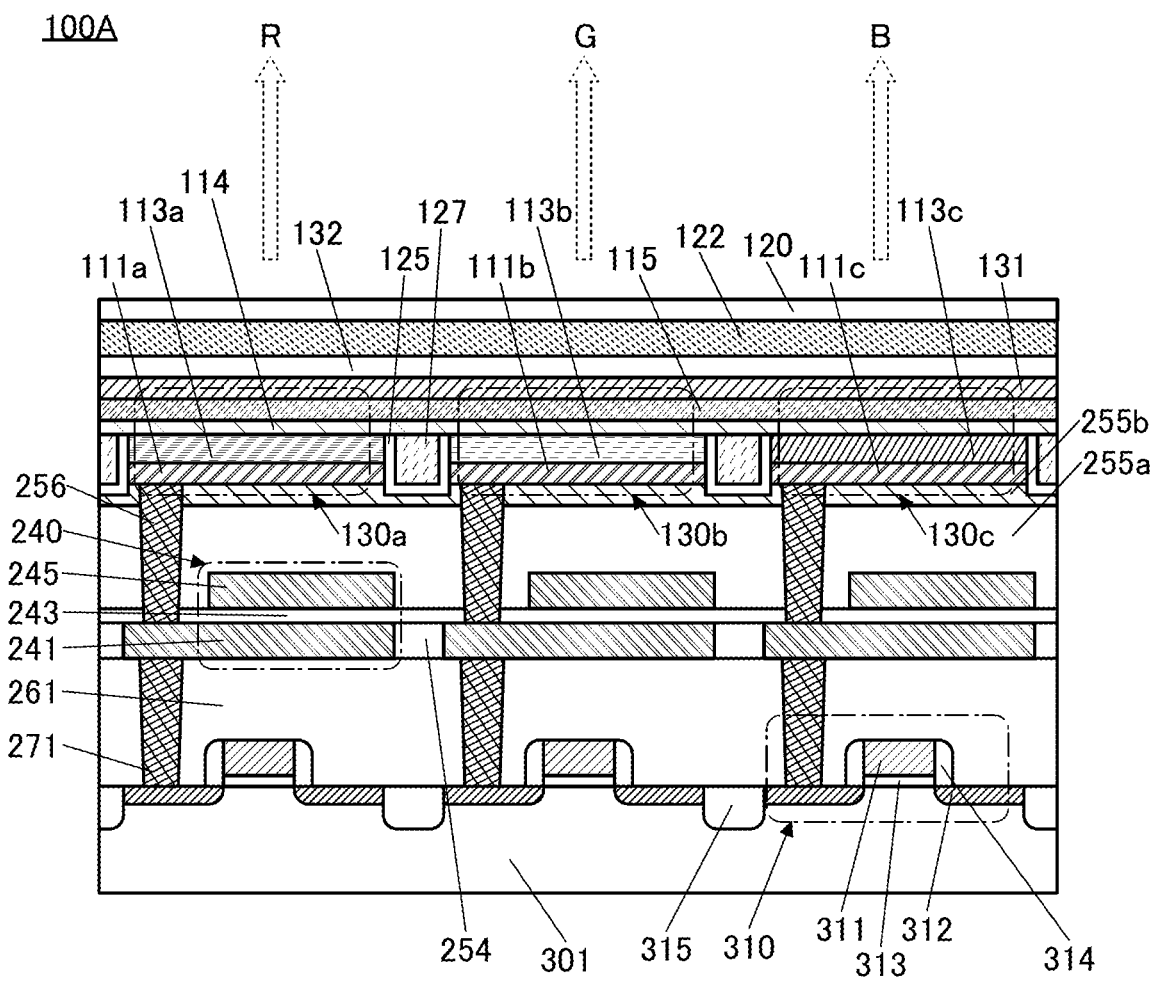
FIG. 10A to FIG. 10C are diagrams each illustrating a structure example of a display device.
Figure 10B:
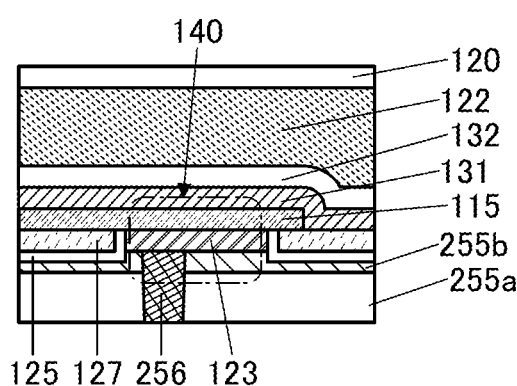

The display device 100A illustrated in FIG. 10A includes a substrate 301, the light-emitting devices 130a, 130b and 130c, capacitors 240, and transistors 310.

The substrate 301 corresponds to the substrate 291 in FIG. 9A and FIG. 9B.

The transistor 310 is a transistor that includes a channel formation region in the substrate 301. As the substrate 301, a semiconductor substrate such as a single crystal silicon substrate can be used, for example. The transistor 310 includes part of the substrate 301, a conductive layer 311, low-resistance regions 312, an insulating layer 313, and insulating layers 314. The conductive layer 311 functions as a gate electrode. The insulating layer 313 is positioned between the substrate 301 and the conductive layer 311 and functions as a gate insulating layer. The low-resistance region 312 is a region where the substrate 301 is doped with an impurity, and functions as one of a source and a drain. The insulating layer 314 is provided to cover a side surface of the conductive layer 311.

In addition, an element isolation layer 315 is provided between two adjacent transistors 310 to be embedded in the substrate 301.

Furthermore, an insulating layer 261 is provided to cover the transistor 310, and the capacitor 240 is provided over the insulating layer 261.

The capacitor 240 includes a conductive layer 241, a conductive layer 245, and an insulating layer 243 between the conductive layers 241 and 245.

The conductive layer 241 is provided over the insulating layer 261 and is embedded in an insulating layer 254. The conductive layer 241 is electrically connected to one of the source and the drain of the transistor 310 through a plug 271 embedded in the insulating layer 261. The insulating layer 243 is provided to cover the conductive layer 241. The conductive layer 245 is provided in a region overlapped with the conductive layer 241 with the insulating layer 243 therebetween.

An insulating layer 255a is provided to cover the capacitor 240, and an insulating layer 255b is provided over the insulating layer 255a.

For each of the insulating layer 255a and the insulating layer 255b, a variety of inorganic insulating films such as an oxide insulating film, a nitride insulating film, an oxynitride insulating film, and a nitride oxide insulating film can be suitably used. For the insulating layer 255a, an oxide insulating film or an oxynitride insulating film, such as a silicon oxide film, a silicon oxynitride film, or an aluminum oxide film, is preferably used. For the insulating layer 255b, a nitride insulating film or a nitride oxide insulating film, such as a silicon nitride film or a silicon nitride oxide film, is preferably used. More specifically, it is preferable that a silicon oxide film be used for the insulating layer 255a and that a silicon nitride film be used for the insulating layer 255b. The insulating layer 255b preferably has a function of an etching protective film. Alternatively, a nitride insulating film or a nitride oxide insulating film may be used for the insulating layer 255a, and an oxide insulating film or an oxynitride insulating film may be used for the insulating layer 255b. Although this embodiment shows an example in which a depression portion is provided in the insulating layer 255b, a depression portion is not necessarily provided in the insulating layer 255b.

The light-emitting devices 130a, 130b, and 130c are provided over the insulating layer 255b. An insulator is provided in a region between adjacent light-emitting devices. In FIG. 10A and the like, the insulating layer 125 and the insulating layer 127 over the insulating layer 125 are provided in this region.

This embodiment shows an example of a top-emission display device in which light is emitted in a direction opposite to the substrate where the light-emitting device is formed. Note that the display device may have a bottom-emission structure in which light is emitted toward the substrate where the light-emitting device is formed or a dual-emission structure in which light is emitted toward both surfaces.

The light-emitting devices 130a, 130b, and 130c emit light of different colors. This embodiment shows an example where the light-emitting devices 130a, 130b, and 130c correspond to a combination of light-emitting devices that emit light of three colors, red (R), green (G), and blue (B).

The light-emitting device includes an EL layer between a pair of electrodes. In this specification and the like, in some cases, one of the pair of electrodes is referred to as a pixel electrode and the other of the pair of electrodes is referred to as a common electrode. One of the pair of electrodes of the light-emitting device functions as an anode, and the other electrode functions as a cathode. The case where the pixel electrode functions as an anode and the common electrode functions as a cathode is described below as an example.

The light-emitting device 130a includes a pixel electrode 111a over the insulating layer 255b, an island-shaped first layer 113a over the pixel electrode 111a, a fourth layer 114 over the island-shaped first layer 113a, and a common electrode 115 over the fourth layer 114. In the light-emitting device 130a, the first layer 113a and the fourth layer 114 can be collectively referred to as an EL layer.

The light-emitting device 130b includes a pixel electrode 111b, a second layer 113b, the fourth layer 114, and the common electrode 115. The light-emitting device 130c includes a pixel electrode 111c, a third layer 113c, the fourth layer 114, and the common electrode 115.

When a cross section of the light-emitting device is observed, the light-emitting device includes a region where a side surface of the lower electrode (pixel electrode) and a side surface of the light-emitting layer are aligned with or substantially aligned with each other. In addition, in a top view, a top-surface shape of the lower electrode can be regarded as being aligned with or substantially aligned with a top-surface shape of the light-emitting layer.

Note that in this specification and the like, the expression "top surface shapes are substantially aligned with each other" means that at least outlines of stacked layers are partly overlapped with each other. For example, the case of processing an upper layer and a lower layer with the use of the same mask pattern or mask patterns that are partly the same is included. However, in some cases, the outlines are not completely overlapped with each other and the upper layer is positioned on an inner side of the lower layer or the upper layer is positioned on an outer side of the lower layer; such a case is also represented by the expression "top surface shapes are substantially aligned with each other".

The light-emitting devices of the respective colors share the same film as the common electrode. The common electrode 115 shared by the light-emitting devices of the respective colors is electrically connected to a conductive layer 123 provided in a connection portion 140 illustrated in FIG. 10B. The conductive layer 123 is electrically connected to a wiring provided below a plug 256 through the plug 256.

The pixel electrode of each of the light-emitting devices is electrically connected to one of the source and the drain of the transistor 310 through the plug 256 embedded in the insulating layers 255a and 255b, the conductive layer 241 embedded in the insulating layer 254, and the plug 271 embedded in the insulating layer 261. A top surface of the insulating layer 255b and a top surface of the plug 256 are level with or substantially level with each other. A variety of conductive materials can be used for the plugs.

Note that in this specification and the like, the expression "A and B are level with or substantially level with each other" includes the case where A and B are level with each other and the case where a difference in level occurs between A and B owing to a manufacturing error when A and B are manufactured so that A and B are level with each other.

For example, after the insulating layer 261 is formed, an opening is provided in the insulating layer 261, and a conductive layer to be the plug 271 is formed to fill the opening, planarization treatment is performed using a chemical mechanical polishing (CMP) method or the like. Accordingly, it is possible to achieve a structure where a top surface of the plug 271 and a top surface of the insulating layer 261 are level with or substantially level with each other.

A conductive film that transmits visible light is used for the electrode through which light is extracted, which is either the pixel electrode or the common electrode. In addition, a conductive film that reflects visible light is preferably used for the electrode through which light is not extracted. Note that it is preferable to employ a micro optical resonator (microcavity) structure by using an electrode that has properties of transmitting and reflecting visible light (a semi-transmissive and semi-reflective electrode) as the electrode through which light is extracted. Accordingly, light obtained from the light-emitting layer can be resonated between the electrodes, so that light emitted from the light-emitting device can be intensified. Note that the semi-transmissive and semi-reflective electrode can have a stacked-layer structure of a reflective electrode and an electrode having a property of transmitting visible light (also referred to as a transparent electrode).

It is preferable that each of the first layer 113a, the second layer 113b, and the third layer 113c be provided with an island shape and that the first layer 113a, the second layer 113b, and the third layer 113c include light-emitting layers that emit light of different colors. The light-emitting layer can contain one or more kinds of light-emitting substances. A substance that emits visible light of blue, purple, bluish purple, green, yellowish green, yellow, orange, red, or the like, a substance that emits non-visible light such as near infrared light, and the like can be used as the light-emitting substances.

Examples of the light-emitting substance include a fluorescent material, a phosphorescent material, a TADF material, a quantum dot material, and the like.

In addition to the light-emitting layer, the first layer 113a, the second layer 113b, and the third layer 113c may further include a layer containing a substance with a high hole-injection property, a substance with a high hole-transport property (also referred to as a hole-transport material), a hole-blocking material, a substance with a high electron-transport property (also referred to as an electron-transport material), a substance with a high electron-injection property, an electron-blocking material, a substance with a bipolar property (also referred to as a substance with a high electron-transport property and a high hole-transport property or a bipolar material), or the like.

Either a low molecular compound or a high molecular compound can be used for the light-emitting devices, and an inorganic compound may be included. Each of the layers included in the light-emitting devices can be formed by a method such as an evaporation method (including a vacuum evaporation method), a transfer method, a printing method, an ink-jet method, or a coating method.

For example, the first layer 113a, the second layer 113b, and the third layer 113c may each include one or more of a hole-injection layer, a hole-transport layer, a hole-blocking layer, an electron-blocking layer, an electron-transport layer, and an electron-injection layer.

In the EL layer, one or more of a hole-injection layer, a hole-transport layer, a hole-blocking layer, an electron-blocking layer, an electron-transport layer, and an electron-injection layer can be employed as a layer commonly formed for the light-emitting devices of the respective colors. For example, a carrier-injection layer (a hole-injection layer or an electron-injection layer) may be formed as the fourth layer 114. Note that all the layers in the EL layer may be separately formed for the respective colors. That is, the EL layer does not necessarily include a layer common to the light-emitting devices of the respective colors.

The first layer 113a, the second layer 113b, and the third layer 113c each preferably include a light-emitting layer and a carrier-transport layer over the light-emitting layer. Accordingly, the light-emitting layer is inhibited from being exposed on the outermost surface during the manufacturing process of the display device, so that damage to the light-emitting layer can be reduced. As a result, the reliability of the light-emitting devices can be increased.

In addition, in the case of manufacturing a light-emitting device having a tandem structure, an intermediate layer is provided between two light-emitting units. The intermediate layer has a function of injecting electrons into one of the two light-emitting units and injecting holes to the other when voltage is applied between the pair of electrodes. The intermediate layer can also be referred to as a charge-generation layer.

Side surfaces of the pixel electrodes 111a, 111b, and 111c, the first layer 113a, the second layer 113b, and the third layer 113c are covered with the insulating layers 125 and 127. The fourth layer 114 is provided over the first layer 113a, the second layer 113b, the third layer 113c, and the insulating layers 125 and 127. The common electrode 115 is provided over the fourth layer 114.

Thus, the fourth layer 114 (or the common electrode 115) is inhibited from being in contact with the side surface of any of the pixel electrodes 111a, 111b, and 111c, the first layer 113a, the second layer 113b, and the third layer 113c, so that short-circuit of the light-emitting device can be inhibited.

The insulating layer 125 preferably covers at least the side surfaces of the pixel electrodes 111a, 111b, and 111c. Furthermore, the insulating layer 125 preferably covers the side surfaces of the first layer 113a, the second layer 113b, and the third layer 113c. A structure can be employed in which the insulating layer 125 is in contact with the side surfaces of the pixel electrodes 111a, 111b, and 111c, the first layer 113a, the second layer 113b, and the third layer 113c.

The insulating layer 127 is provided over the insulating layer 125 to fill a depression portion formed by the insulating layer 125. A structure can be employed in which the insulating layer 127 is overlapped with the side surfaces of the pixel electrodes 111a, 111b, and 111c, the first layer 113a, the second layer 113b, and the third layer 113c with the insulating layer 125 therebetween.

Figure 10C:
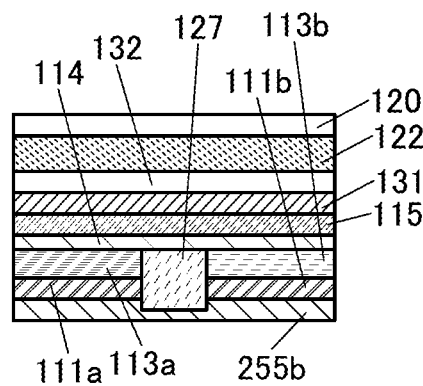

Note that either one or both the insulating layer 125 and the insulating layer 127 is not necessarily provided. FIG. 10C illustrates an example in which the insulating layer 125 is not provided. In the case where the insulating layer 125 is not provided, a structure can be employed in which the insulating layer 127 is in contact with the side surfaces of the first layer 113*a*, the second layer 113*b*, and the third layer 113*c*. In addition, the display device may include an insulating layer covering an end portion of the pixel electrode. In this case, one or both of the insulating layer 125 and the insulating layer 127 may be provided over the insulating layer.

The fourth layer 114 and the common electrode 115 are provided over the first layer 113*a*, the second layer 113*b*, the third layer 113*c*, the insulating layer 125, and the insulating layer 127. Before the insulating layer 125 and the insulating layer 127 are provided, a step is generated owing to a region where the pixel electrode and the EL layer are provided and a region where neither the pixel electrode nor the EL layer is provided (a region between the light-emitting devices). In the display device according to one embodiment of the present invention, the step can be planarized by including the insulating layer 125 and the insulating layer 127, and coverage with the fourth layer 114 and the common electrode 115 can be improved. Thus, connection defects caused by disconnection at the step can be inhibited. Alternatively, it is possible to inhibit an increase in electric resistance due to local thinning of the common electrode 115 by the step.

To improve the planarity of a surface over which the fourth layer 114 and the common electrode 115 are formed, a top surface of the insulating layer 125 and a top surface of the insulating layer 127 are preferably level with or substantially level with at least one of top surfaces of the first layer 113*a*, the second layer 113*b*, and the third layer 113*c*. In addition, the top surface of the insulating layer 127 preferably has a flat shape and may have a projection portion or a depression portion.

The insulating layer 125 includes regions in contact with the side surfaces of the first layer 113*a*, the second layer 113*b*, and the third layer 113*c*, and functions as a protective insulating layer of the first layer 113*a*, the second layer 113*b*, and the third layer 113*c*. Providing the insulating layer 125 can inhibit entry of impurities such as oxygen and moisture from the side surfaces of the first layer 113*a*, the second layer 113*b*, and the third layer 113*c* into their insides, and thus a highly reliable display device can be obtained.

When the widths (thicknesses) of the insulating layer 125 in the regions in contact with the side surfaces of the first layer 113*a*, the second layer 113*b*, and the third layer 113*c* are large in a cross-sectional view, the distance between the first layer 113*a*, the second layer 113*b*, and the third layer 113*c* is large, which results in a reduction in aperture ratio in some cases. In addition, when the width (thickness) of the insulating layer 125 is small, the effect of inhibiting impurities from entering the first layer 113*a*, the second layer 113*b*, and the third layer 113*c* through their side surfaces might be weakened. The widths (thicknesses) of the insulating layer 125 in the regions in contact with the side surfaces of the first layer 113*a*, the second layer 113*b*, and the third layer 113*c* are preferably greater than or equal to 3 nm and less than or equal to 200 nm, further preferably greater than or equal to 3 nm and less than or equal to 150 nm, further preferably greater than or equal to 5 nm and less than or equal to 150 nm, still further preferably greater than or equal to 5 nm and less than or equal to 100 nm, still further preferably greater than or equal to 10 nm and less than or equal to 100 nm, yet further preferably greater than or equal to 10 nm and less than or equal to 50 nm. When the width (thickness) of the insulating layer 125 is within the above range, a highly reliable display device with high aperture ratio can be obtained.

The insulating layer 125 can be an insulating layer containing an inorganic material. An inorganic insulating film such as an oxide insulating film, a nitride insulating film, an oxynitride insulating film, or a nitride oxide insulating film can be used for the insulating layer 125, for example. The insulating layer 125 may have either a single-layer structure or a stacked-layer structure. Examples of the oxide insulating film include a silicon oxide film, an aluminum oxide film, a magnesium oxide film, an indium gallium zinc oxide film, a gallium oxide film, a germanium oxide film, an yttrium oxide film, a zirconium oxide film, a lanthanum oxide film, a neodymium oxide film, a hafnium oxide film, a tantalum oxide film, and the like. Examples of the nitride insulating film include a silicon nitride film, an aluminum nitride film, and the like. Examples of the oxynitride insulating film include a silicon oxynitride film, an aluminum oxynitride film, and the like. Examples of the nitride oxide insulating film include a silicon nitride oxide film, an aluminum nitride oxide film, and the like. In particular, aluminum oxide is preferable because it has high selectivity with respect to the EL layer in etching and has a function of protecting the EL layer during formation of the insulating layer 127 described later. In particular, when an inorganic insulating film such as an aluminum oxide film, a hafnium oxide film, or a silicon oxide film that is formed by an ALD method is employed for the insulating layer 125, it is possible to form the insulating layer 125 that has few pinholes and an excellent function of protecting the EL layer.

Note that in this specification and the like, an oxynitride refers to a material that contains more oxygen than nitrogen in its composition, and a nitride oxide refers to a material that contains more nitrogen than oxygen in its composition. For example, in the case where silicon oxynitride is described, it refers to a material that contains more oxygen than nitrogen in its composition. In the case where silicon nitride oxide is described, it refers to a material that contains more nitrogen than oxygen in its composition.

For the formation of the insulating layer 125, a sputtering method, a CVD method, a PLD method, an ALD method, or the like can be used. The insulating layer 125 is preferably formed by an ALD method achieving good coverage.

The insulating layer 127 provided over the insulating layer 125 has a function of planarizing the depression portion in the insulating layer 125 that is formed between the adjacent light-emitting devices. In other words, the insulating layer 127 brings an effect of improving the planarity of a surface where the common electrode 115 is formed. An insulating layer containing an organic material can be suitably used as the insulating layer 127. As the insulating layer 127, an acrylic resin, a polyimide resin, an epoxy resin, an imide resin, a polyamide resin, a polyimide-amide resin, a silicone resin, a siloxane resin, a benzocyclobutene-based resin, a phenol resin, precursors of these resins, or the like can be employed, for example. Alternatively, an organic material such as polyvinyl alcohol (PVA), polyvinylbutyral, polyvinylpyrrolidone, polyethylene glycol, polyglycerin, pullulan, water-soluble cellulose, an alcohol-soluble polyamide resin, or the like can be employed for the insulating layer 127. Alternatively, a photosensitive resin (also referred to as an organic resin) can be used for the insulating layer 127. A photoresist may be used for the photosensitive resin. For the photosensitive resin, a positive type material or a negative type material can be used.

The difference in level between the top surface of the insulating layer 127 and the top surface of any of the first layer 113a, the second layer 113b, and the third layer 113c is preferably, for example, less than or equal to 0.5 times the thickness of the insulating layer 127, further preferably less than or equal to 0.3 times the thickness of the insulating layer 127. Alternatively, the insulating layer 127 may be provided so that the level of the top surface of any of the first layer 113a, the second layer 113b, and the third layer 113c is higher than the level of the top surface of the insulating layer 127, for example. As another example, the insulating layer 127 may be provided so that the level of the top surface of the insulating layer 127 is greater than the level of the top surface of the light-emitting layer included in the first layer 113a, the second layer 113b, or the third layer 113c.

In addition, a protective layer 131 and a protective layer 132 are stacked and provided over the light-emitting devices 130a, 130b, and 130c. A substrate 120 is attached onto the protective layer 132 with a resin layer 122. There is no limitation on the conductivity of the protective layers 131 and 132. For the protective layers 131 and 132, at least one type of an insulating film, a semiconductor film, and a conductive film can be used.

When the protective layers 131 and 132 include an inorganic film, it is possible to inhibit degradation of the light-emitting devices by preventing oxidation of the common electrode 115 or inhibiting entry of impurities (moisture, oxygen, and the like) into the light-emitting devices 130a, 130b, and 130c, for example; thus, the reliability of the display device can be increased.

Furthermore, the protective layers 131 and 132 may include an organic film. For example, the protective layer 132 may include both an organic film and an inorganic film. End portions of top surfaces of the pixel electrodes 111a, 111b, and 111c are not covered with an insulating layer. Thus, the distance between adjacent light-emitting devices can be extremely narrowed. Accordingly, the display device can have high definition or high resolution.

In the display device in this embodiment, the distance between the light-emitting devices can be narrowed. Specifically, the distance between the light-emitting devices, the distance between the EL layers, or the distance between the pixel electrodes can be less than 10 μm, less than or equal to 5 μm, less than or equal to 3 μm, less than or equal to 2 μm, less than or equal to 1 μm, less than or equal to 500 nm, less than or equal to 200 nm, less than or equal to 100 nm, less than or equal to 90 nm, less than or equal to 70 nm, less than or equal to 50 nm, less than or equal to 30 nm, less than or equal to 20 nm, less than or equal to 15 nm, or less than or equal to 10 nm. In other words, the display device includes a region where the distance between the side surface of the first layer 113a and the side surface of the second layer 113b or the distance between the side surface of the second layer 113b and the side surface of the third layer 113c is less than or equal to 1 μm, preferably less than or equal to 0.5 μm (500 nm), further preferably less than or equal to 100 nm.

A light-blocking layer, a color filter, or the like may be provided on the surface of the substrate 120 on the resin layer 122 side. In addition, a variety of optical members can be arranged on the outer side of the substrate 120. Examples of the optical members include a polarizing plate, a retardation plate, a light diffusion layer (a diffusion film or the like), an anti-reflective layer, a light-condensing film, and the like. Furthermore, an antistatic film preventing attachment of dust, a water repellent film suppressing attachment of stain, a hard coat film suppressing generation of a scratch caused by the use, a shock-absorbing layer, or the like may be arranged on the outer side of the substrate 120.

For the substrate 120, glass, quartz, ceramics, sapphire, a resin, a metal, an alloy, a semiconductor, or the like can be used. For the substrate on the side from which light from the light-emitting device is extracted, a material that transmits the light is used. When a flexible material is used for the substrate 120, the display device can have increased flexibility and a flexible display can be achieved. Furthermore, a polarizing plate may be used for the substrate 120.

For the resin layer 122, a variety of curable adhesives such as a photocurable adhesive such as an ultraviolet curable adhesive, a reactive curable adhesive, a thermosetting adhesive, and an anaerobic adhesive can be used.

As materials that can be used for conductive layers such as a variety of wirings and electrodes that constitute a display device, in addition to a gate, a source, and a drain of a transistor, a metal such as aluminum, titanium, chromium, nickel, copper, yttrium, zirconium, molybdenum, silver, tantalum, or tungsten, an alloy containing the metal as its main component, and the like can be given. A single-layer structure or a stacked-layer structure including a film containing these materials can be used.

In addition, as a light-transmitting conductive material, a conductive oxide such as indium oxide, indium tin oxide, indium zinc oxide, zinc oxide, or zinc oxide containing gallium, or graphene can be used. It is also possible to use a metal material such as gold, silver, platinum, magnesium, nickel, tungsten, chromium, molybdenum, iron, cobalt, copper, palladium, or titanium, or an alloy material containing the metal material. Alternatively, a nitride of the metal material (e.g., titanium nitride) or the like may be used. Note that in the case of using the metal material or the alloy material (or the nitride thereof), the thickness is preferably set small enough to transmit light. Alternatively, a stacked film of the above materials can be used for the conductive layers. For example, a stacked film of indium tin oxide and an alloy of silver and magnesium, or the like is preferably used because conductivity can be increased. They can also be used for conductive layers such as a variety of wirings and electrodes that constitute the display device, and conductive layers (conductive layers functioning as a pixel electrode or a common electrode) included in the light-emitting device.

Examples of insulating materials that can be used for the insulating layers include a resin such as an acrylic resin and an epoxy resin, an inorganic insulating material such as silicon oxide, silicon oxynitride, silicon nitride oxide, silicon nitride, and aluminum oxide, and the like.

[Display Device 100B]

Figure 11:
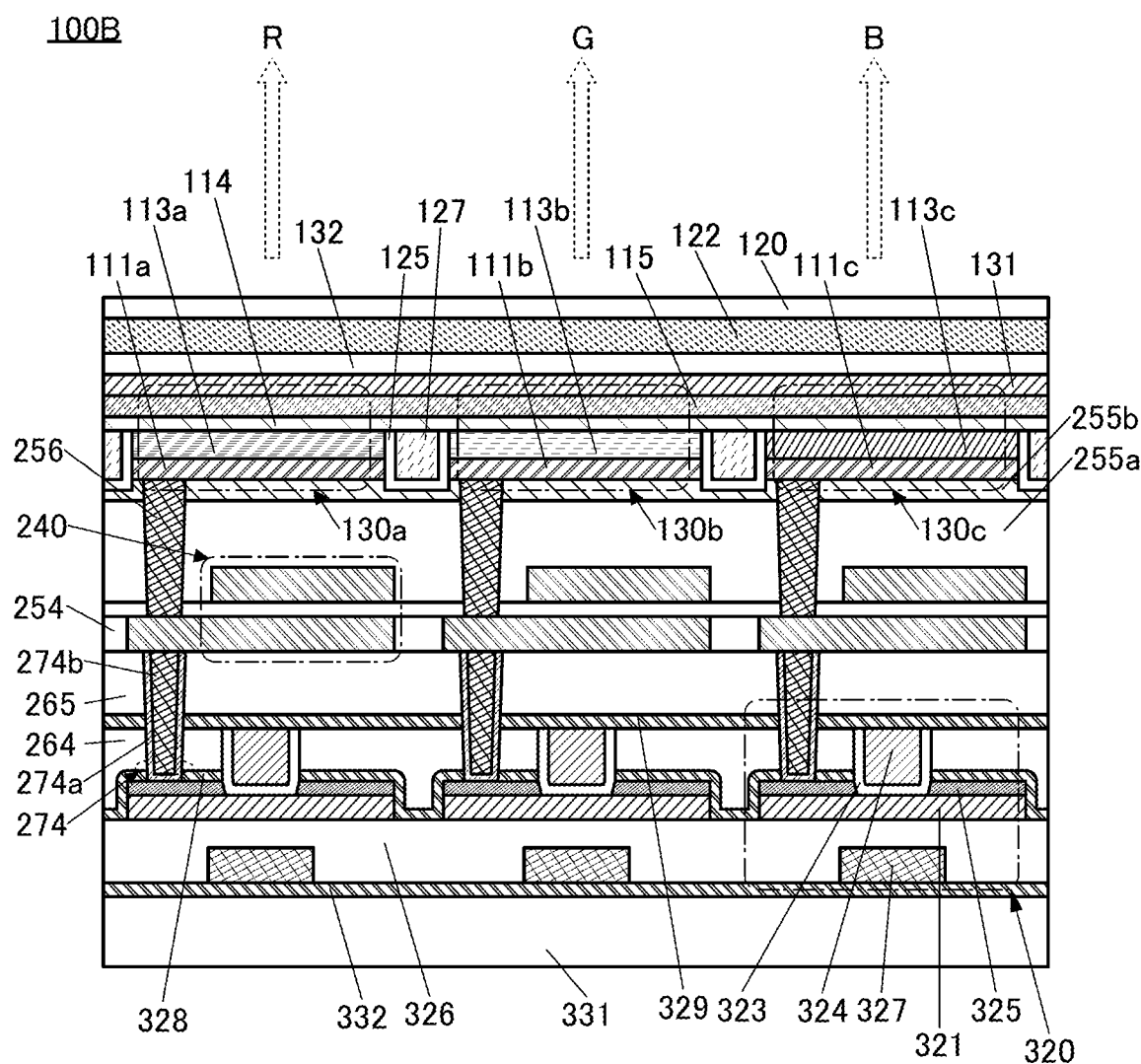
FIG. 11 is a diagram illustrating a structure example of a display device.

The display device 100B illustrated in FIG. 11 differs from the display device 100A mainly in a transistor structure. Note that the description of portions similar to those in the display device 100A is omitted in some cases.

A transistor 320 is a transistor (an OS transistor) in which a metal oxide (also referred to as an oxide semiconductor) is employed in a semiconductor layer where a channel is formed.

The transistor 320 includes a semiconductor layer 321, an insulating layer 323, a conductive layer 324, a pair of conductive layers 325, an insulating layer 326, and a conductive layer 327.

A substrate 331 corresponds to the substrate 291 in FIG. 9A and FIG. 9B.

An insulating layer 332 is provided over the substrate 331. The insulating layer 332 functions as a barrier layer that prevents diffusion of impurities such as water or hydrogen from the substrate 331 into the transistor 320 and release of oxygen from the semiconductor layer 321 to the insulating layer 332 side. As the insulating layer 332, for example, a film in which hydrogen or oxygen is less likely to diffuse than in a silicon oxide film, such as an aluminum oxide film, a hafnium oxide film, and a silicon nitride film, can be used.

The conductive layer 327 is provided over the insulating layer 332, and the insulating layer 326 is provided to cover the conductive layer 327. The conductive layer 327 functions as a first gate electrode of the transistor 320, and part of the insulating layer 326 functions as a first gate insulating layer. An oxide insulating film such as a silicon oxide film is preferably used for at least part of the insulating layer 326 that is in contact with the semiconductor layer 321. A top surface of the insulating layer 326 is preferably planarized.

The semiconductor layer 321 is provided over the insulating layer 326. The semiconductor layer 321 preferably includes a metal oxide (also referred to as an oxide semiconductor) film having semiconductor characteristics. The pair of conductive layers 325 is provided on and in contact with the semiconductor layer 321, and functions as a source electrode and a drain electrode.

An insulating layer 328 is provided to cover top surfaces and side surfaces of the pair of conductive layers 325, a side surface of the semiconductor layer 321, and the like, and an insulating layer 264 is provided over the insulating layer 328. The insulating layer 328 functions as a barrier layer that prevents diffusion of impurities such as water or hydrogen from the insulating layer 264 and the like into the semiconductor layer 321 and release of oxygen from the semiconductor layer 321. For the insulating layer 328, an insulating film similar to the insulating layer 332 can be used.

An opening reaching the semiconductor layer 321 is provided in the insulating layer 328 and the insulating layer 264. The conductive layer 324 and the insulating layer 323 that is in contact with side surfaces of the insulating layer 264, the insulating layer 328, and the conductive layer 325 and a top surface of the semiconductor layer 321 are embedded in the opening. The conductive layer 324 functions as a second gate electrode, and the insulating layer 323 functions as a second gate insulating layer.

A top surface of the conductive layer 324, a top surface of the insulating layer 323, and a top surface of the insulating layer 264 are subjected to planarization treatment so that they are level with or substantially level with each other, and an insulating layer 329 and an insulating layer 265 are provided to cover these layers.

The insulating layer 264 and the insulating layer 265 each function as an interlayer insulating layer. The insulating layer 329 functions as a barrier layer that prevents diffusion of impurities such as water or hydrogen from the insulating layer 265 or the like to the transistor 320. As the insulating layer 329, an insulating film similar to the insulating layer 328 and the insulating layer 332 can be used.

A plug 274 electrically connected to one of the pair of conductive layers 325 is provided to be embedded in the insulating layer 265, the insulating layer 329, and the insulating layer 264. Here, the plug 274 preferably includes a conductive layer 274a that covers side surfaces of openings in the insulating layer 265, the insulating layer 329, the insulating layer 264, and the insulating layer 328 and part of a top surface of the conductive layer 325, and a conductive layer 274b in contact with a top surface of the conductive layer 274a. At this time, a conductive material in which hydrogen and oxygen are less likely to diffuse is preferably used for the conductive layer 274a.

[Display Device 100C]

Figure 12:
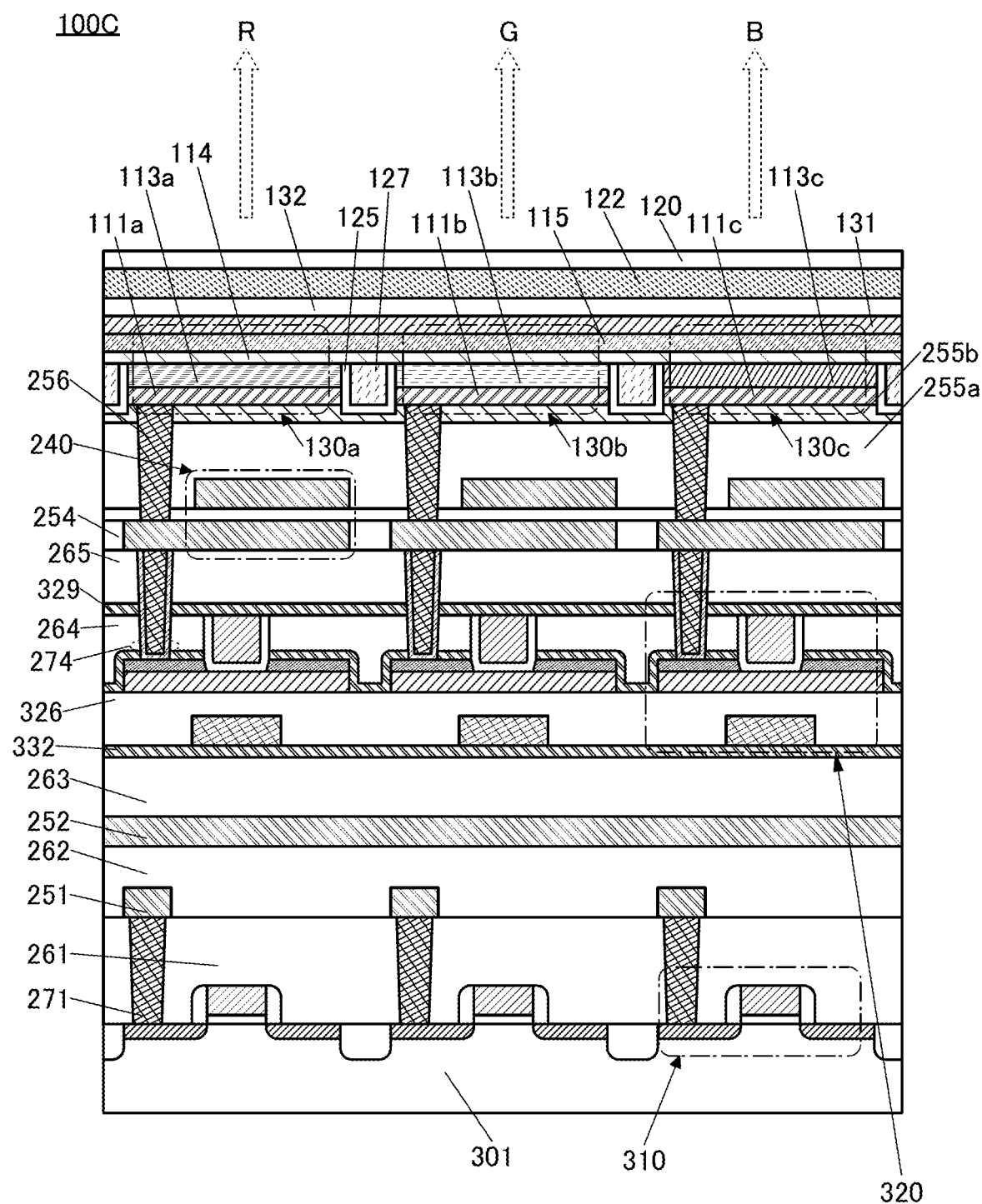
FIG. 12 is a diagram illustrating a structure example of a display device.

The display device 100C illustrated in FIG. 12 has a structure in which the transistor 310 whose channel is formed in the substrate 301 and the transistor 320 including a metal oxide in the semiconductor layer where the channel is formed are stacked. Note that the description of portions similar to those in the display devices 100A and 100B is omitted in some cases.

The insulating layer 261 is provided to cover the transistor 310, and a conductive layer 251 is provided over the insulating layer 261. In addition, an insulating layer 262 is provided to cover the conductive layer 251, and a conductive layer 252 is provided over the insulating layer 262. The conductive layer 251 and the conductive layer 252 each function as a wiring. Furthermore, an insulating layer 263 and the insulating layer 332 are provided to cover the conductive layer 252, and the transistor 320 is provided over the insulating layer 332. Moreover, the insulating layer 265 is provided to cover the transistor 320, and the capacitor 240 is provided over the insulating layer 265. The capacitor 240 and the transistor 320 are electrically connected to each other through the plug 274.

The transistor 320 can be used as a transistor included in a pixel circuit. In addition, the transistor 310 can be used as a transistor included in a pixel circuit or a transistor included in a driver circuit (a gate line driver circuit or a source line driver circuit) for driving the pixel circuit. Furthermore, the transistor 310 and the transistor 320 can be used as transistors included in a variety of circuits such as an arithmetic circuit or a memory circuit.

With such a structure, not only the pixel circuit but also the driver circuit and the like can be formed directly under the light-emitting devices; thus, the display device can be downsized as compared with the case where the driver circuit is provided around a display region.

[Display Device 100D]

Figure 13:
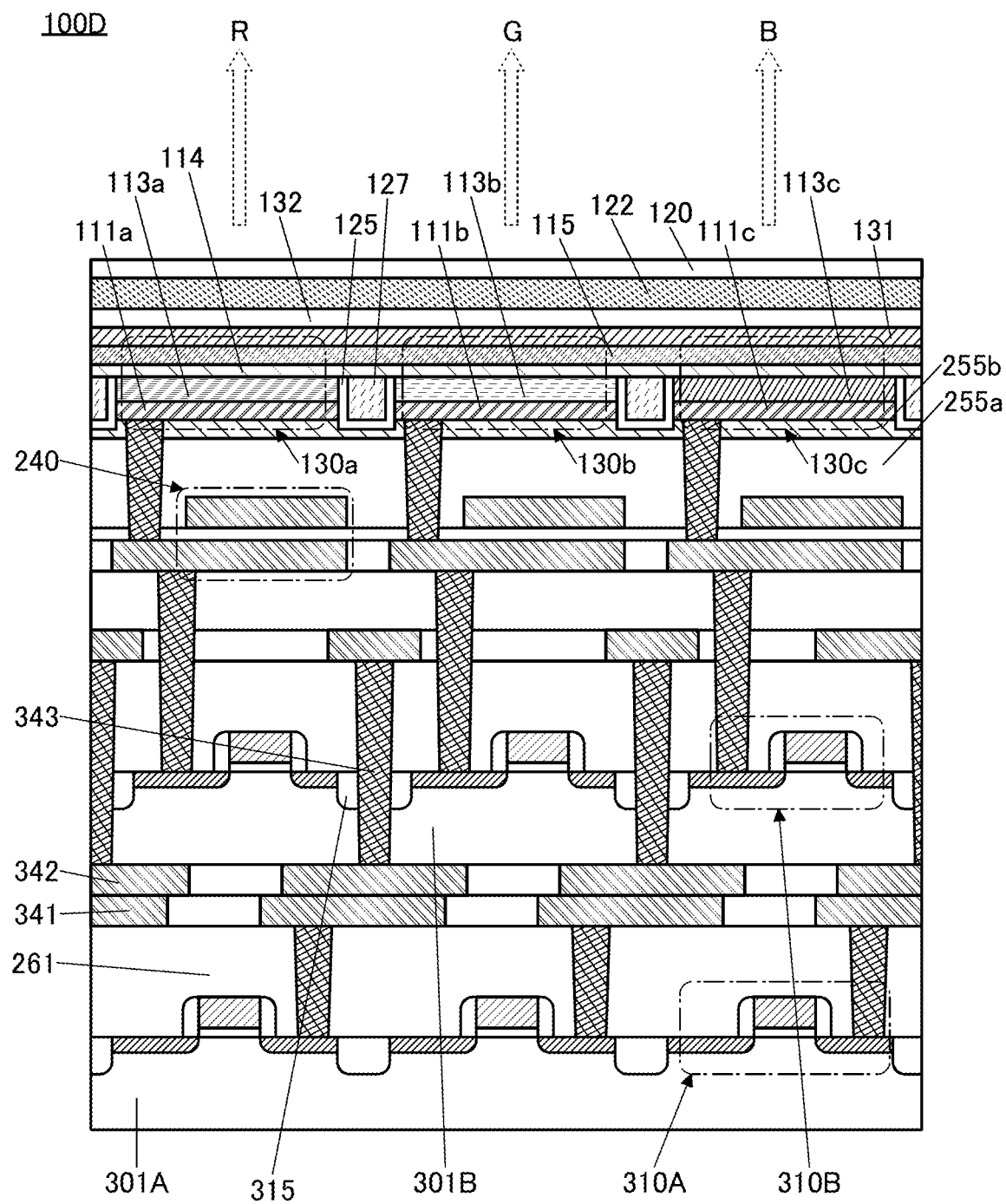
FIG. 13 is a diagram illustrating a structure example of a display device.

The display device 100D illustrated in FIG. 13 has a structure in which a transistor 310A and a transistor 310B each having a channel formed in a semiconductor substrate are stacked.

In the display device 100D, a structure is employed in which a substrate 301B provided with the transistor 310B, the capacitor 240, and the light-emitting devices is attached to a substrate 301A provided with the transistor 310A.

The substrate 301B is provided with a plug 343 that penetrates the substrate 301B. In addition, the plug 343 is electrically connected to a conductive layer 342 that is provided on a rear surface of the substrate 301 (a surface that is opposite to the substrate 120 side). In contrast, the substrate 301A is provided with a conductive layer 341 over the insulating layer 261.

The conductive layer 341 and the conductive layer 342 are bonded to each other, so that the substrate 301A and the substrate 301B are electrically connected to each other.

The same conductive material is preferably used for the conductive layer 341 and the conductive layer 342. A metal film containing an element selected from Al, Cr, Cu, Ta, Ti, Mo, and W, a metal nitride film containing the above element as a component (a titanium nitride film, a molybdenum nitride film, or a tungsten nitride film), or the like can be used, for example. Copper is particularly preferably used for the conductive layer 341 and the conductive layer 342. Accordingly, it is possible to employ a Cu-to-Cu (copper-to-copper) direct bonding technique (a technique for achieving electrical continuity by connecting Cu (copper) pads to each other). Note that the conductive layer 341 and the conductive layer 342 may be bonded to each other through a bump.

[Display Device 100E]

Figure 14:
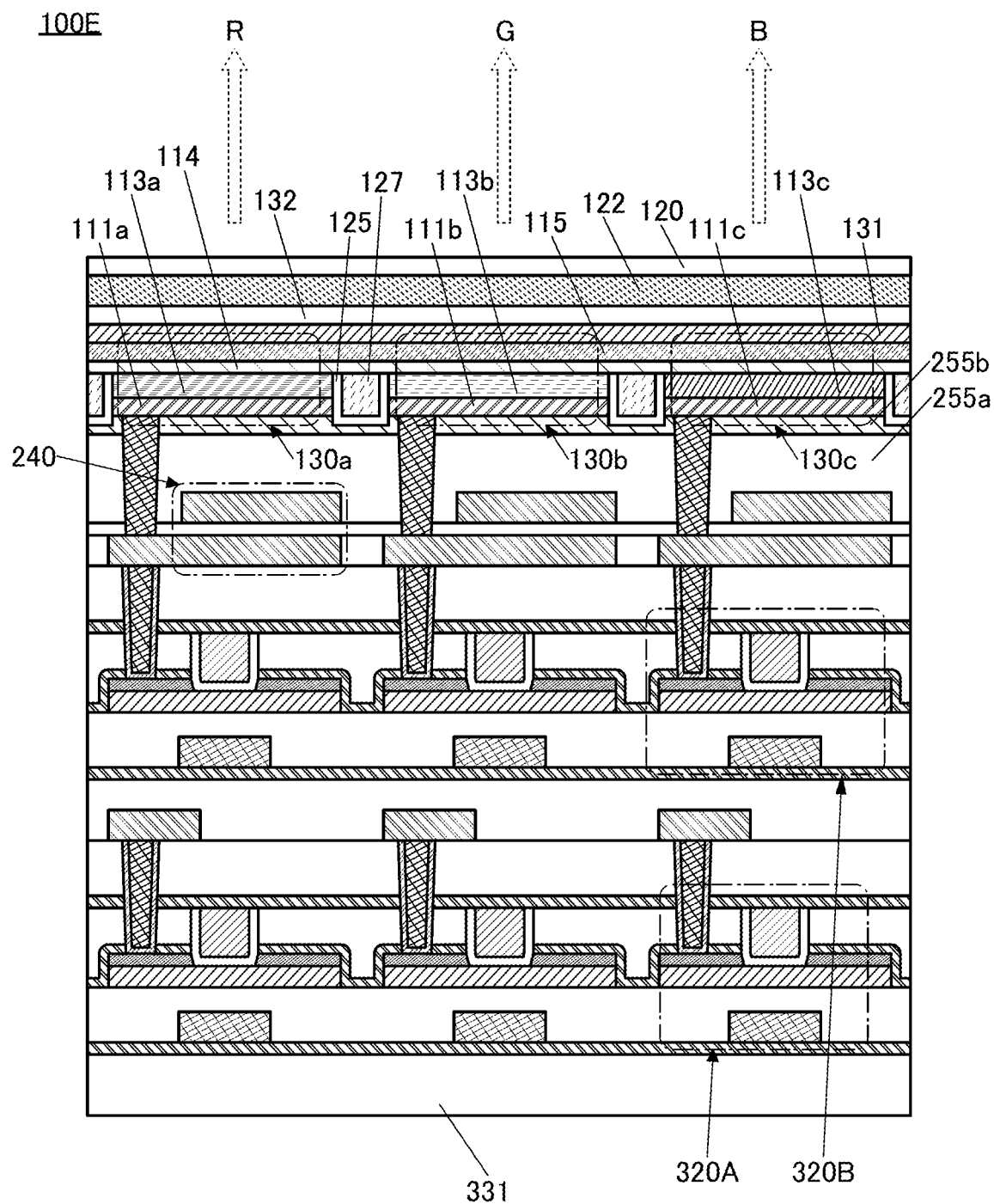
FIG. 14 is a diagram illustrating a structure example of a display device.

The display device 100E illustrated in FIG. 14 has a structure in which a transistor 320A and a transistor 320B each including an oxide semiconductor in a semiconductor where a channel is formed are stacked.

The display device 100B can be referred to for the transistor 320A, the transistor 320B, and other peripheral structures.

Note that although the structure in which two transistors including an oxide semiconductor are stacked is described here, the present invention is not limited thereto. For example, a structure may be employed in which three or more transistors are stacked.

This embodiment can be combined with the other embodiments as appropriate.

Embodiment 5

In this embodiment, light-emitting devices that can be used for the display device according to one embodiment of the present invention will be described.

Figure 15A:
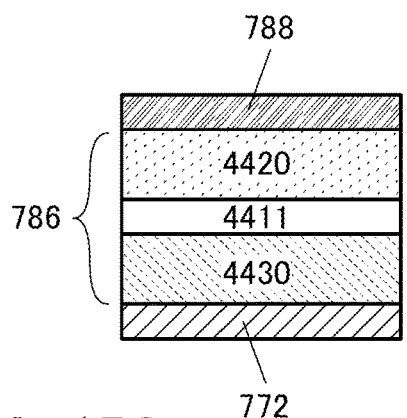
FIG. 15A to FIG. 15F are diagrams each illustrating a structure example of a light-emitting device.

As illustrated in FIG. 15A, a light-emitting device includes an EL layer 786 between a pair of electrodes (a lower electrode 772 and an upper electrode 788). The EL layer 786 can be formed of a plurality of layers such as a layer 4420, a light-emitting layer 4411, and a layer 4430. The layer 4420 can include, for example, a layer containing a substance with a high electron-injection property (an electron-injection layer) and a layer containing a substance with a high electron-transport property (an electron-transport layer). The light-emitting layer 4411 contains a light-emitting compound, for example. The layer 4430 can include, for example, a layer containing a substance with a high hole-injection property (a hole-injection layer) and a layer containing a substance with a high hole-transport property (a hole-transport layer).

A structure including the layer 4420, the light-emitting layer 4411, and the layer 4430, which is provided between a pair of electrodes, can function as a single light-emitting unit, and the structure in FIG. 15A is referred to as a single structure in this specification.

Figure 15B:
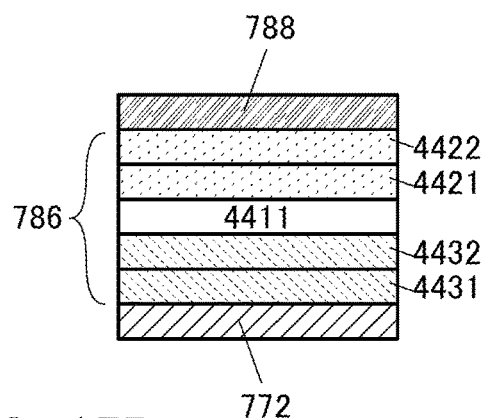

In addition, FIG. 15B illustrates a modification example of the EL layer 786 included in the light-emitting device illustrated in FIG. 15A. Specifically, the light-emitting device illustrated in FIG. 15B includes a layer 4431 over the lower electrode 772, a layer 4432 over the layer 4431, the light-emitting layer 4411 over the layer 4432, a layer 4421 over the light-emitting layer 4411, a layer 4422 over the layer 4421, and the upper electrode 788 over the layer 4422. For example, when the lower electrode 772 is an anode and the upper electrode 788 is a cathode, the layer 4431 functions as a hole-injection layer, the layer 4432 functions as a hole-transport layer, the layer 4421 functions as an electron-transport layer, and the layer 4422 functions as an electron-injection layer. Alternatively, when the lower electrode 772 is a cathode and the upper electrode 788 is an anode, the layer 4431 functions as an electron-injection layer, the layer 4432 functions as an electron-transport layer, the layer 4421 functions as a hole-transport layer, and the layer 4422 functions as a hole-injection layer. With such a layer structure, carriers can be efficiently injected to the light-emitting layer 4411, and the efficiency of recombination of carriers in the light-emitting layer 4411 can be increased.

Figure 15C:
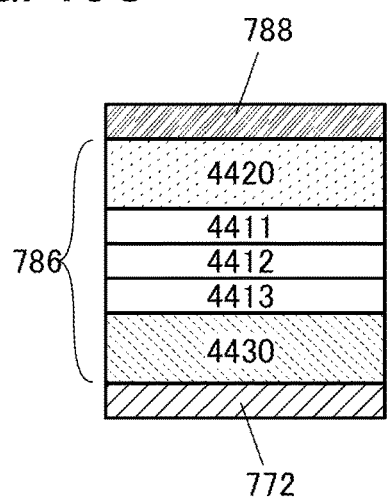
Figure 15D:
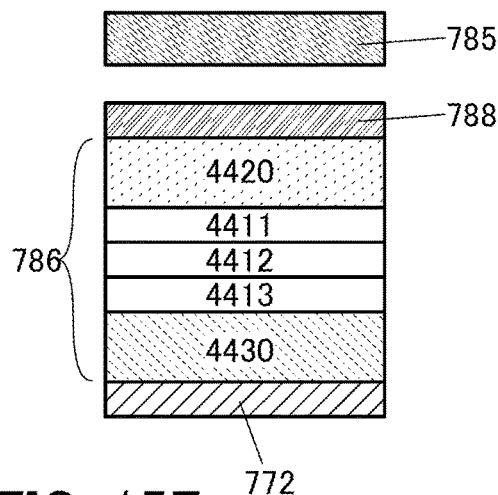

Note that a structure in which a plurality of light-emitting layers (light-emitting layers 4411, 4412, and 4413) are provided between the layer 4420 and the layer 4430 as illustrated in FIG. 15C or FIG. 15D is a variation of the single structure.

Figure 15E:
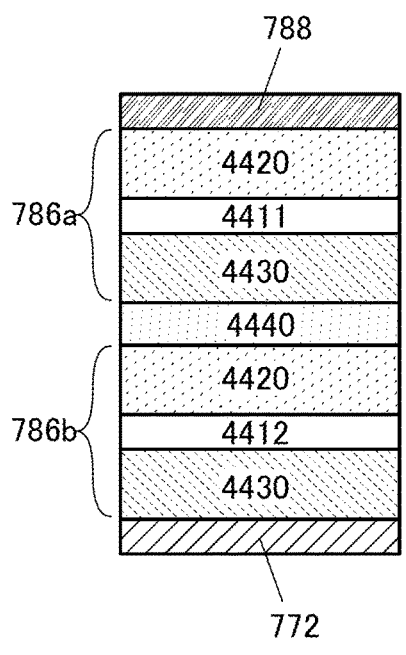
Figure 15F:
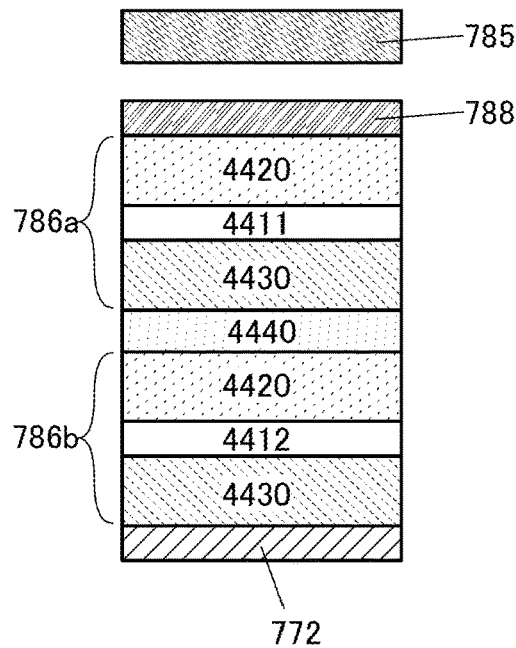

A structure in which a plurality of light-emitting units (an EL layer 786a and an EL layer 786b) are connected in series with an intermediate layer (a charge-generation layer) 4440 therebetween as illustrated in FIG. 15E or FIG. 15F is referred to as a tandem structure in this specification. Note that in this specification and the like, the structure illustrated in FIG. 15E or FIG. 15F is referred to as a tandem structure; however, without being limited to this, a tandem structure may be referred to as a stack structure, for example. Note that the tandem structure enables a light-emitting device to emit light at high luminance.

In FIG. 15C, a light-emitting material that emits light of the same color may be used for the light-emitting layer 4411, the light-emitting layer 4412, and the light-emitting layer 4413.

Alternatively, different light-emitting materials may be used for the light-emitting layer 4411, the light-emitting layer 4412, and the light-emitting layer 4413. White light emission can be obtained when light emitted from the light-emitting layer 4411, light emitted from the light-emitting layer 4412, and light emitted from the light-emitting layer 4413 have a relationship of complementary colors. FIG. 15D illustrates an example in which a coloring layer 785 functioning as a color filter is provided. When white light passes through a color filter, light of a desired color can be obtained.

In addition, in FIG. 15E, the same light-emitting material may be used for the light-emitting layer 4411 and the light-emitting layer 4412. Alternatively, light-emitting materials that emit light of different colors may be used for the light-emitting layer 4411 and the light-emitting layer 4412. White light emission can be obtained when light emitted from the light-emitting layer 4411 and light emitted from the light-emitting layer 4412 have a relationship of complementary colors. FIG. 15F illustrates an example in which the coloring layer 785 is further provided.

Note that also in FIG. 15C, FIG. 15D, FIG. 15E, and FIG. 15F, the layer 4420 and the layer 4430 may each have a stacked-layer structure of two or more layers as illustrated in FIG. 15B.

A structure in which light emission colors (here, blue (B), green (G), and red (R)) are separately formed for the light-emitting devices is referred to as an SBS (Side By Side) structure in some cases.

The emission color of the light-emitting devices can be red, green, blue, cyan, magenta, yellow, white, or the like depending on materials that constitute the EL layer 786. Furthermore, color purity can be further increased when the light-emitting device has a microcavity structure.

In the case where the light-emitting device emits white light, the light-emitting layer preferably contains two or more kinds of light-emitting substances. To obtain white light emission, two or more light-emitting substances are selected so that their emission colors have a relationship of complementary colors. For example, when the emission color of a first light-emitting layer and the emission color of a second light-emitting layer have a relationship of complementary colors, it is possible to obtain the light-emitting device that emits white light as a whole. The same applies to a light-emitting device including three or more light-emitting layers.

The light-emitting layer preferably contains two or more light-emitting substances that emit red (R) light, green (G) light, blue (B) light, yellow (Y) light, orange (O) light, and the like. Alternatively, the light-emitting layer preferably contains two or more light-emitting substances that emit light containing spectral components of two or more colors out of R, G, and B.

Here, a specific structure example of the light-emitting device is described.

The light-emitting device includes at least the light-emitting layer. The light-emitting device may further include, as a layer other than the light-emitting layer, a layer containing a substance with a high hole-injection property, a substance with a high hole-transport property, a hole-blocking material, a substance with a high electron-transport property, an electron-blocking material, a substance with a high electron-injection property, a substance with a bipolar property (a substance with a high electron-transport property and a high hole-transport property), or the like.

Either a low molecular compound or a high molecular compound can be used for the light-emitting device, and an inorganic compound may also be contained. Each of the layers included in the light-emitting device can be formed by an evaporation method (including a vacuum evaporation method), a transfer method, a printing method, an inkjet method, a coating method, or the like.

For example, the light-emitting device can include one or more of a hole-injection layer, a hole-transport layer, a hole-blocking layer, an electron-blocking layer, an electron-transport layer, and an electron-injection layer.

The hole-injection layer is a layer injecting holes from an anode to the hole-transport layer, and a layer containing a substance with a high hole-injection property. Examples of the substance with a high hole-injection property include an aromatic amine compound, a composite material containing a hole-transport material and an acceptor material (an electron-accepting material), and the like.

The hole-transport layer is a layer transporting holes, which are injected from the anode by the hole-injection layer, to the light-emitting layer. The hole-transport layer is a layer containing a hole-transport material. As the hole-transport material, a substance having a hole mobility higher than or equal to $1\times10^{-6}$ cm$^2$/Vs is preferable. Note that other substances can also be used as long as they have a property of transporting more holes than electrons. As the hole-transport material, a substance with a high hole-transport property, such as a π-electron rich heteroaromatic compound (e.g., a carbazole derivative, a thiophene derivative, a furan derivative, or the like) or an aromatic amine (a compound having an aromatic amine skeleton), is preferable.

The electron-transport layer is a layer transporting electrons, which are injected from a cathode by the electron-injection layer, to the light-emitting layer. The electron-transport layer is a layer containing an electron-transport material. As the electron-transport material, a substance having an electron mobility higher than or equal to $1\times10^{-6}$ cm$^2$/Vs is preferable. Note that other substances can also be used as long as they have a property of transporting more electrons than holes. As the electron-transport material, it is possible to use a substance with a high electron-transport property, such as a metal complex having a quinoline skeleton, a metal complex having a benzoquinoline skeleton, a metal complex having an oxazole skeleton, a metal complex having a thiazole skeleton, an oxadiazole derivative, a triazole derivative, an imidazole derivative, an oxazole derivative, a thiazole derivative, a phenanthroline derivative, a quinoline derivative having a quinoline ligand, a benzoquinoline derivative, a quinoxaline derivative, a dibenzoquinoxaline derivative, a pyridine derivative, a bipyridine derivative, a pyrimidine derivative, or a π-electron deficient heteroaromatic compound such as a nitrogen-containing heteroaromatic compound.

The electron-injection layer is a layer injecting electrons from a cathode to the electron-transport layer and a layer containing a substance with a high electron-injection property. As the substance with a high electron-injection property, an alkali metal, an alkaline earth metal, or a compound thereof can be used. As the substance with a high electron-injection property, a composite material containing an electron-transport material and a donor material (an electron-donating material) can also be used.

For the electron-injection layer, it is possible to use, for example, an alkali metal, an alkaline earth metal, or a compound thereof, such as lithium, cesium, lithium fluoride (LiF), cesium fluoride (CsF), calcium fluoride (CaF$_2$), 8-(quinolinolato)lithium (abbreviation: Liq), 2-(2-pyridyl)phenolatolithium (abbreviation: LiPP), 2-(2-pyridyl)-3-pyridinolatolithium (abbreviation: LiPPy), 4-phenyl-2-(2-pyridyl)phenolatolithium (abbreviation: LiPPP), lithium oxide (LiO$_x$), or cesium carbonate.

Alternatively, an electron-transport material may be used for the electron-injection layer. For example, a compound having an unshared electron pair and an electron deficient heteroaromatic ring can be used for the electron-transport material. Specifically, a compound having at least one of a pyridine ring, a diazine ring (a pyrimidine ring, a pyrazine ring, and a pyridazine ring), and a triazine ring can be used.

Note that the lowest unoccupied molecular orbital (LUMO) of the organic compound having an unshared electron pair is preferably greater than or equal to −3.6 eV and less than or equal to −2.3 eV. In addition, in general, the highest occupied molecular orbital (HOMO) level and the LUMO level of an organic compound can be estimated by cyclic voltammetry (CV), photoelectron spectroscopy, optical absorption spectroscopy, inverse photoelectron spectroscopy, or the like.

For example, 4,7-diphenyl-1,10-phenanthroline (abbreviation: BPhen), 2,9-bis(naphthalen-2-yl)-4,7-diphenyl-1,10-phenanthroline (abbreviation: NBPhen), diquinoxalino[2,3-a:2',3'-c]phenazine (abbreviation: HATNA), 2,4,6-tris[3'-(pyridin-3-yl)biphenyl-3-yl]-1,3,5-triazine (abbreviation: TmPPPyTz), or the like can be used for the organic compound having an unshared electron pair. Note that NBPhen has a higher glass transition point (Tg) than BPhen and thus has high heat resistance.

The light-emitting layer is a layer containing a light-emitting substance. The light-emitting layer can include one or more kinds of light-emitting substances. As the light-emitting substance, a substance that exhibits an emission color of blue, purple, bluish purple, green, yellowish green, yellow, orange, red, or the like is used as appropriate. Alternatively, as the light-emitting substance, a substance that emits near-infrared light can be used.

Examples of the light-emitting substance include a fluorescent material, a phosphorescent material, a TADF material, a quantum dot material, and the like.

Examples of the fluorescent material include a pyrene derivative, an anthracene derivative, a triphenylene derivative, a fluorene derivative, a carbazole derivative, a dibenzothiophene derivative, a dibenzofuran derivative, a dibenzoquinoxaline derivative, a quinoxaline derivative, a pyridine derivative, a pyrimidine derivative, a phenanthrene derivative, a naphthalene derivative, and the like.

Examples of the phosphorescent material include an organometallic complex (in particular, an iridium complex) having a 4H-triazole skeleton, a 1H-triazole skeleton, an imidazole skeleton, a pyrimidine skeleton, a pyrazine skeleton, or a pyridine skeleton; an organometallic complex (in particular, an iridium complex) having a phenylpyridine derivative including an electron-withdrawing group as a ligand; a platinum complex; a rare earth metal complex; and the like.

The light-emitting layer may contain one or more kinds of organic compounds (a host material, an assist material, and the like) in addition to the light-emitting substance (a guest material). As one or more kinds of organic compounds, one or both of the hole-transport material and the electron-transport material can be used. Alternatively, as one or more kinds of organic compounds, a bipolar material or a TADF material may be used.

The light-emitting layer preferably includes a phosphorescent material and a combination of a hole-transport material and an electron-transport material that easily forms an exciplex, for example. Such a structure makes it possible to efficiently obtain light emission using ExTET (Exciplex—Triplet Energy Transfer), which is energy transfer from an exciplex to a light-emitting substance (a phosphorescent material). When a combination of materials is selected to form an exciplex that exhibits light emission whose wavelength is to be overlapped with the wavelength of the lowest-energy-side absorption band of the light-emitting substance, energy can be transferred smoothly and light emission can be obtained efficiently. With this structure, the high efficiency, low-voltage driving, and long lifetime of the light-emitting device can be achieved at the same time.

At least part of this embodiment can be implemented in combination with the other embodiments described in this specification as appropriate.

Embodiment 6

In this embodiment, a metal oxide (also referred to as an oxide semiconductor) that can be used in the OS transistor described in the above embodiment is described.

A metal oxide preferably contains at least indium or zinc. In particular, indium and zinc are preferably contained. In addition, in addition to these, aluminum, gallium, yttrium, tin, or the like is preferably contained. Furthermore, one or more kinds selected from boron, silicon, titanium, iron, nickel, germanium, zirconium, molybdenum, lanthanum, cerium, neodymium, hafnium, tantalum, tungsten, magnesium, cobalt, and the like may be contained.

In addition, the metal oxide can be formed by a sputtering method, a chemical vapor deposition (CVD) method such as a metal organic chemical vapor deposition (MOCVD) method, an atomic layer deposition (ALD) method, or the like.

<Classification of Crystal Structure>

Amorphous (including completely amorphous), CAAC (c-axis-aligned crystalline), nc (nanocrystalline), CAC (cloud-aligned composite), single-crystal, and polycrystalline (polycrystal) structures can be given as examples of a crystal structure of an oxide semiconductor.

Note that the crystal structure of a film or a substrate can be evaluated with an X-ray diffraction (XRD) spectrum. For example, evaluation is possible using an XRD spectrum that is obtained by GIXD (Grazing-Incidence XRD) measurement. Note that a GIXD method is also referred to as a thin film method or a Seemann-Bohlin method.

For example, the XRD spectrum of a quartz glass substrate shows a peak with a substantially bilaterally symmetrical shape. On the other hand, the peak of the XRD spectrum of an IGZO film having a crystal structure has a bilaterally asymmetrical shape. The bilaterally asymmetrical peak of the XRD spectrum clearly shows the existence of crystal in the film or the substrate. In other words, the crystal structure of the film or the substrate cannot be regarded as an amorphous state unless it has a bilaterally symmetrical peak in the XRD spectrum.

In addition, the crystal structure of a film or a substrate can also be evaluated with a diffraction pattern obtained by a nanobeam electron diffraction method (NBED) (such a pattern is also referred to as a nanobeam electron diffraction pattern). For example, a halo pattern is observed in the diffraction pattern of the quartz glass substrate, which indicates that the quartz glass substrate is in an amorphous state. Furthermore, not a halo pattern but a spot-like pattern is observed in the diffraction pattern of the IGZO film deposited at room temperature. Thus, it is suggested that the IGZO film deposited at room temperature is in an intermediate state, which is neither a crystal state nor an amorphous state, and it cannot be concluded that the IGZO film is in an amorphous state.

<<Structure of Oxide Semiconductor>>

Note that oxide semiconductors might be classified in a manner different from the above-described one when classified in terms of the structure. Oxide semiconductors are classified into a single crystal oxide semiconductor and a non-single-crystal oxide semiconductor, for example. Examples of the non-single-crystal oxide semiconductor include the CAAC-OS and the nc-OS. Other examples of the non-single-crystal oxide semiconductor include a polycrystalline oxide semiconductor, an amorphous-like oxide semiconductor (a-like OS), an amorphous oxide semiconductor, and the like.

Here, the CAAC-OS, the nc-OS, and the a-like OS are described in detail.

[CAAC-OS]

The CAAC-OS is an oxide semiconductor that has a plurality of crystal regions each of which has c-axis alignment in a particular direction. Note that the particular direction refers to the thickness direction of a CAAC-OS film, the normal direction of a surface where the CAAC-OS film is formed, or the normal direction of the surface of the CAAC-OS film. In addition, the crystal region refers to a region having periodic atomic arrangement. Note that when atomic arrangement is regarded as lattice arrangement, the crystal region also refers to a region with uniform lattice arrangement. Furthermore, the CAAC-OS has a region where a plurality of crystal regions are connected in an a-b plane direction, and the region has distortion in some cases. Note that distortion refers to a portion where the direction of lattice arrangement changes between a region with uniform lattice arrangement and another region with uniform lattice arrangement in a region where a plurality of crystal regions are connected. That is, the CAAC-OS is an oxide semiconductor having c-axis alignment and having no clear alignment in the a-b plane direction.

Note that each of the plurality of crystal regions is formed of one or more fine crystals (crystals each of which has a maximum diameter of less than 10 nm). In the case where the crystal region is formed of one fine crystal, the maximum diameter of the crystal region is less than 10 nm. Alternatively, in the case where the crystal region is formed of a large number of fine crystals, the size of the crystal region is sometimes approximately several tens of nanometers.

In addition, in an In-M-Zn oxide (the element M is one or more kinds selected from aluminum, gallium, yttrium, tin, titanium, and the like), the CAAC-OS tends to have a layer-shaped crystal structure (also referred to as a layer-shaped structure) in which a layer containing indium (In) and oxygen (hereinafter an In layer) and a layer containing the element M, zinc (Zn), and oxygen (hereinafter an (M,Zn) layer) are stacked. Note that indium and the element M can be replaced with each other. Therefore, indium is sometimes contained in the (M,Zn) layer. Furthermore, the element M is sometimes contained in the In layer. Note that Zn is sometimes contained in the In layer. Such a layer-shaped structure is observed as a lattice image in a high-resolution TEM (Transmission Electron Microscope) image, for example.

When the CAAC-OS film is subjected to structural analysis by out-of-plane XRD measurement with an XRD apparatus using θ/2θ scanning, for example, a peak indicating c-axis alignment is detected at 2θ of 31° or around 31°. Note that the position of the peak indicating c-axis alignment (the value of 2θ) might fluctuate depending on the kind, composition, or the like of the metal element contained in the CAAC-OS.

In addition, for example, a plurality of bright spots are observed in the electron diffraction pattern of the CAAC-OS film. Note that one spot and another spot are observed point-symmetrically with a spot of an incident electron beam passing through a sample (also referred to as a direct spot) as a symmetric center.

When the crystal region is observed from the particular direction, lattice arrangement in the crystal region is basically hexagonal lattice arrangement; however, a unit lattice is not always a regular hexagon and is a non-regular hexagon in some cases. In addition, pentagonal lattice arrangement, heptagonal lattice arrangement, and the like are included in the distortion in some cases. Note that a clear grain boundary cannot be observed even in the vicinity of the distortion in the CAAC-OS. That is, it is found that formation of a grain boundary is inhibited by the distortion of lattice arrangement. This is probably because the CAAC-OS can tolerate distortion owing to a low density of arrangement of oxygen atoms in the a-b plane direction, an interatomic bond distance changed by substitution of a metal atom, or the like.

Note that a crystal structure in which a clear grain boundary is observed is what is called polycrystal. It is highly probable that the grain boundary becomes a recombination center and captures carriers and thus decreases the on-state current and field-effect mobility of a transistor, for example. Thus, the CAAC-OS in which no clear grain boundary is observed is one of crystalline oxides having a crystal structure suitable for a semiconductor layer of a transistor. Note that Zn is preferably contained to form the CAAC-OS. For example, an In—Zn oxide and an In—Ga—Zn oxide are suitable because they can inhibit generation of a grain boundary as compared with an In oxide.

The CAAC-OS is an oxide semiconductor with high crystallinity in which no clear grain boundary is observed. Thus, in the CAAC-OS, it can be said that a reduction in electron mobility due to the grain boundary is unlikely to occur. In addition, entry of impurities, formation of defects, or the like might decrease the crystallinity of an oxide semiconductor. This means that the CAAC-OS can also be referred to as an oxide semiconductor having small amounts of impurities and defects (oxygen vacancies or the like). Therefore, physical properties of an oxide semiconductor including the CAAC-OS become stable. Accordingly, the oxide semiconductor including the CAAC-OS is resistant to heat and has high reliability. In addition, the CAAC-OS is also stable with respect to high temperatures in the manufacturing process (what is called thermal budget). Accordingly, the use of the CAAC-OS for the OS transistor can extend the degree of freedom of the manufacturing process.

[nc-OS]

In the nc-OS, a microscopic region (e.g., a region greater than or equal to 1 nm and less than or equal to 10 nm, in particular, a region greater than or equal to 1 nm and less than or equal to 3 nm) has periodic atomic arrangement. In other words, the nc-OS includes a fine crystal. Note that the size of the fine crystal is, for example, greater than or equal to 1 nm and less than or equal to 10 nm, particularly greater than or equal to 1 nm and less than or equal to 3 nm; thus, the fine crystal is also referred to as a nanocrystal. In addition, there is no regularity of crystal orientation between different nanocrystals in the nc-OS. Hence, the orientation in the whole film is not observed. Accordingly, in some cases, the nc-OS cannot be distinguished from an a-like OS or an amorphous oxide semiconductor, depending on the analysis method. For example, when an nc-OS film is subjected to structural analysis by out-of-plane XRD measurement with an XRD apparatus using θ/2θ scanning, a peak indicating crystallinity is not detected. Furthermore, a diffraction pattern like a halo pattern is observed when the nc-OS film is subjected to electron diffraction (also referred to as selected-area electron diffraction) using an electron beam with a probe diameter larger than the diameter of a nanocrystal (e.g., larger than or equal to 50 nm). Meanwhile, in some cases, a plurality of spots in a ring-like region with a direct spot as the center are obtained in the observed electron diffraction pattern when the nc-OS film is subjected to electron diffraction (also referred to as nanobeam electron diffraction) using an electron beam with a probe diameter close to or smaller than the size of a nanocrystal (e.g., greater than or equal to 1 nm and less than or equal to 30 nm).

[A-Like OS]

The a-like OS is an oxide semiconductor having a structure between those of the nc-OS and the amorphous oxide semiconductor. The a-like OS has a void or a low-density region. That is, the a-like OS has lower crystallinity than the nc-OS and the CAAC-OS. Moreover, the a-like OS has higher hydrogen concentration in the film than the nc-OS and the CAAC-OS.

<<Composition of Oxide Semiconductor>>

Next, the CAC-OS is described in detail. Note that the CAC-OS relates to the material composition.

[CAC-OS]

The CAC-OS refers to one composition of a material in which elements constituting a metal oxide are unevenly distributed with a size greater than or equal to 0.5 nm and less than or equal to 10 nm, preferably greater than or equal to 1 nm and less than or equal to 3 nm, or a similar size, for example. Note that a state in which one or more metal elements are unevenly distributed and regions including the metal element(s) are mixed with a size greater than or equal to 0.5 nm and less than or equal to 10 nm, preferably greater than or equal to 1 nm and less than or equal to 3 nm, or a similar size in a metal oxide is hereinafter referred to as a mosaic pattern or a patch-like pattern.

In addition, the CAC-OS has a composition in which materials are separated into a first region and a second region to form a mosaic pattern, and the first regions are distributed in the film (this composition is hereinafter also referred to as a cloud-like composition). That is, the CAC-OS is a composite metal oxide having a composition in which the first regions and the second regions are mixed.

Here, the atomic ratios of In, Ga, and Zn to the metal elements contained in the CAC-OS in an In—Ga—Zn oxide are denoted by [In], [Ga], and [Zn], respectively. For example, the first region in the CAC-OS in the In—Ga—Zn oxide has [In] higher than that in the composition of the CAC-OS. Moreover, the second region has [Ga] higher than that in the composition of the CAC-OS. Alternatively, for example, the first region has higher [In] and lower [Ga] than the second region. Moreover, the second region has higher [Ga] and lower [In] than the first region.

Specifically, the first region includes indium oxide, indium zinc oxide, or the like as its main component. In addition, the second region includes gallium oxide, gallium zinc oxide, or the like as its main component. That is, the first region can be referred to as a region containing In as its main component. Furthermore, the second region can be referred to as a region containing Ga as its main component.

Note that a clear boundary between the first region and the second region cannot be observed in some cases.

In addition, in a material composition of a CAC-OS in an In—Ga—Zn oxide that contains In, Ga, Zn, and O, there are regions containing Ga as a main component in part of the CAC-OS and regions containing In as a main component in another part of the CAC-OS. These regions each form a mosaic pattern and are randomly present. Thus, it is suggested that the CAC-OS has a structure in which metal elements are unevenly distributed.

The CAC-OS can be formed by a sputtering method under a condition where a substrate is not heated, for example. Furthermore, in the case where the CAC-OS is formed by a sputtering method, any one or more selected from an inert gas (typically, argon), an oxygen gas, and a nitrogen gas is used as a deposition gas. Moreover, the ratio of the flow rate of an oxygen gas to the total flow rate of the deposition gas at the time of deposition is preferably as low as possible, and for example, the ratio of the flow rate of an oxygen gas to the total flow rate of the deposition gas at the time of deposition is preferably higher than or equal to 0% and lower than 30%, further preferably higher than or equal to 0% and lower than or equal to 10%.

For example, energy dispersive X-ray spectroscopy (EDX) is used to obtain EDX mapping, and according to the EDX mapping, the CAC-OS in the In—Ga—Zn oxide has a structure in which the region containing In as its main component (the first region) and the region containing Ga as its main component (the second region) are unevenly distributed and mixed.

Here, the first region has higher conductivity than the second region. In other words, when carriers flow through the first region, the conductivity of a metal oxide is exhibited. Accordingly, when the first regions are distributed in a metal oxide like a cloud, high field-effect mobility ($\mu$) can be achieved.

In contrast, the second region has a higher insulating property than the first region. In other words, when the second regions are distributed in a metal oxide, leakage current can be inhibited.

In the case where the CAC-OS is used for a transistor, a switching function (On/Off function) can be given to the CAC-OS owing to the complementary action of the conductivity derived from the first region and the insulating property derived from the second region. That is, the CAC-OS has a conducting function in part of the material and has an insulating function in another part of the material; as a whole, the CAC-OS has a function of a semiconductor. Separation of the conducting function and the insulating function can maximize each function. Accordingly, when the CAC-OS is used for a transistor, high on-state current ($I_{on}$), high field-effect mobility ($\mu$), and excellent switching operation can be achieved.

In addition, a transistor using the CAC-OS has high reliability. Thus, the CAC-OS is most suitable for a variety of semiconductor devices such as display devices.

Oxide semiconductors have various structures and each have different properties.

Two or more kinds among the amorphous oxide semiconductor, the polycrystalline oxide semiconductor, the a-like OS, the CAC-OS, the nc-OS, and the CAAC-OS may be included in an oxide semiconductor according to one embodiment of the present invention.

<Transistor Including Oxide Semiconductor>

Next, the case where the oxide semiconductor is used for a transistor is described.

When the oxide semiconductor is used for a transistor, a transistor with high field-effect mobility can be achieved. In addition, a highly reliable transistor can be achieved.

An oxide semiconductor having a low carrier concentration is preferably used for the transistor. For example, the carrier concentration of an oxide semiconductor is lower than or equal to $1\times10^{17}$ cm$^{-3}$, preferably lower than or equal to $1\times10^{15}$ cm$^{-3}$, further preferably lower than or equal to $1\times10^{13}$ cm$^{-3}$, still further preferably lower than or equal to $1\times10^{11}$ cm$^{-3}$, yet further preferably lower than $1\times10^{10}$ cm$^{-3}$, and higher than or equal to $1\times10^{-9}$ cm$^{-3}$. Note that in the case where the carrier concentration of an oxide semiconductor film is lowered, the impurity concentration in the oxide semiconductor film is lowered to decrease the density of defect states. In this specification and the like, a state with a low impurity concentration and a low density of defect states is referred to as a highly purified intrinsic or substantially highly purified intrinsic state. Note that an oxide semiconductor having a low carrier concentration is sometimes referred to as a highly purified intrinsic or substantially highly purified intrinsic oxide semiconductor.

In addition, a highly purified intrinsic or substantially highly purified intrinsic oxide semiconductor film has a low density of defect states and accordingly has a low density of trap states in some cases.

In addition, electric charge captured by the trap states in an oxide semiconductor takes a long time to disappear and might behave like fixed electric charge. Thus, a transistor whose channel formation region is formed in an oxide semiconductor having a high density of trap states has unstable electrical characteristics in some cases.

Accordingly, in order to stabilize electrical characteristics of the transistor, reducing the concentration in the oxide semiconductor is effective. In addition, in order to reduce the impurity concentration in the oxide semiconductor, the impurity concentration in a film that is adjacent to the oxide semiconductor is also preferably reduced. Examples of impurities include hydrogen, nitrogen, an alkali metal, an alkaline earth metal, iron, nickel, silicon, and the like.

<Impurities>

Here, the influence of each impurity in the oxide semiconductor is described.

When silicon or carbon, which is a Group 14 element, is contained in an oxide semiconductor, defect states are formed in the oxide semiconductor. Thus, the concentration of silicon or carbon in the oxide semiconductor and the concentration of silicon or carbon in the vicinity of an interface with the oxide semiconductor (the concentration obtained by secondary ion mass spectrometry (SIMS)) are each set lower than or equal to $2\times10^{18}$ atoms/cm$^3$, preferably lower than or equal to $2\times10^{17}$ atoms/cm$^3$.

In addition, when the oxide semiconductor contains an alkali metal or an alkaline earth metal, defect states are formed and carriers are generated in some cases. Accordingly, a transistor using an oxide semiconductor that contains an alkali metal or an alkaline earth metal tends to have normally-on characteristics. Thus, the concentration of an alkali metal or an alkaline earth metal in the oxide semiconductor that is obtained by SIMS is lower than or equal to $1\times10^{18}$ atoms/cm$^3$, preferably lower than or equal to $2\times10^{16}$ atoms/cm$^3$.

In addition, an oxide semiconductor containing nitrogen easily becomes n-type by generation of electrons serving as carriers and an increase in carrier concentration. Thus, a transistor using an oxide semiconductor that contains nitrogen as the semiconductor tends to have normally-on characteristics. Alternatively, when nitrogen is contained in the oxide semiconductor, a trap state is sometimes formed. This might make the electrical characteristics of the transistor unstable. Therefore, the concentration of nitrogen in the oxide semiconductor that is obtained by SIMS is set lower than $5\times10^{19}$ atoms/cm$^3$, preferably lower than or equal to $5\times10^{18}$ atoms/cm$^3$, further preferably lower than or equal to $1\times10^{18}$ atoms/cm$^3$, still further preferably lower than or equal to $5\times10^{17}$ atoms/cm$^3$.

In addition, hydrogen contained in the oxide semiconductor reacts with oxygen bonded to a metal atom to be water, and thus forms an oxygen vacancy in some cases. Entry of hydrogen into the oxygen vacancy generates an electron serving as a carrier in some cases. Furthermore, in some cases, some hydrogen is bonded to oxygen bonded to a metal atom and generates an electron serving as a carrier. Thus, a transistor using an oxide semiconductor that contains hydrogen tends to have normally-on characteristics. For this reason, hydrogen in the oxide semiconductor is preferably reduced as much as possible. Specifically, the hydrogen concentration in the oxide semiconductor that is obtained by SIMS is set lower than $1\times10^{20}$ atoms/cm$^3$, preferably lower than $1\times10^{19}$ atoms/cm$^3$, further preferably lower than $5\times10^{18}$ atoms/cm$^3$, still further preferably lower than $1\times10^{18}$ atoms/cm$^3$.

When an oxide semiconductor with sufficiently reduced impurities is used for a channel formation region in a transistor, the transistor can have stable electrical characteristics. At least part of this embodiment can be implemented in combination with the other embodiments described in this specification as appropriate.

Embodiment 7

In this embodiment, examples of an electronic device in which the display device according to one embodiment of the present invention can be employed will be described.

Electronic devices in this embodiment each include the display device according to one embodiment of the present invention in a display portion. The display device according to one embodiment of the present invention can easily achieve higher definition and higher resolution. Thus, the display device according to one embodiment of the present invention can be used for display portions of a variety of electronic devices.

In particular, the display device according to one embodiment of the present invention can have higher definition, and thus can be suitably used for an electronic device having a comparatively small display portion. Examples of such an electronic device include wristwatch-type and bracelet-type information terminal devices (wearable devices); a wearable device that can be worn on a head, such as a device for VR such as a head-mounted display, a glasses-type device for AR, or a device for MR; and the like.

The resolution of the display device according to one embodiment of the present invention is preferably as high as HD (pixel count: 1280×720), FHD (pixel count: 1920×1080), WQHD (pixel count: 2560×1440), WQXGA (pixel count: 2560×1600), 4K (pixel count: 3840×2160), or 8K (pixel count: 7680×4320). In particular, the resolution of 4K, 8K, or higher is preferable. In addition, the pixel density (definition) of the display device according to one embodiment of the present invention is preferably higher than or equal to 100 ppi, further preferably higher than or equal to 300 ppi, still further preferably higher than or equal to 500 ppi, still further preferably higher than or equal to 1000 ppi, still further preferably higher than or equal to 2000 ppi, still further preferably higher than or equal to 3000 ppi, still further preferably higher than or equal to 5000 ppi, yet further preferably higher than or equal to 7000 ppi. With the use of such a display device with one or both of high resolution and high definition, an electronic device for personal use such as portable use or home use can have higher realistic sensation, sense of depth, and the like. Furthermore, there is no particular limitation on the screen ratio (aspect ratio) of the display device according to one embodiment of the present invention. For example, the display device is compatible with a variety of screen ratios such as 1:1 (a square), 4:3, 16:9, and 16:10. In particular, compared to a square screen shape, a landscape screen with 16:9 or the like is preferable for AR use.

The electronic device in this embodiment may include a sensor (a sensor having a function of measuring force, displacement, a position, speed, acceleration, angular velocity, rotational frequency, distance, light, liquid, magnetism, temperature, a chemical substance, sound, time, hardness, an electric field, current, voltage, power, radiation, flow rate, humidity, a gradient, oscillation, odor, or infrared rays).

The electronic device in this embodiment can have a variety of functions. For example, the electronic device in this embodiment can have a function of displaying a variety of information (a still image, a moving image, a text image, and the like) on the display portion, a touch panel function, a function of displaying a calendar, date, time, and the like, a function of executing a variety of software (programs), a wireless communication function, and a function of reading out a program or data stored in a storage medium.

Figure 16A:
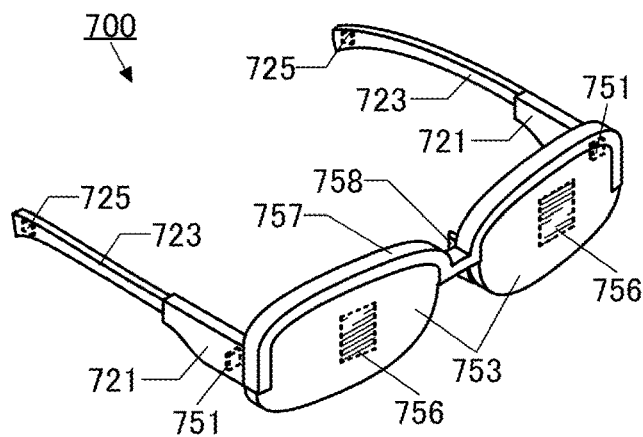
FIG. 16A and FIG. 16B are diagrams illustrating a structure example of an electronic device.

An example of a wearable device that can be worn on a head is described using FIG. 16A. A wearable device in this embodiment has a function of displaying a variety of information depending on an application, such as a function of displaying a captured moving image in real time or a function of displaying an operation screen. In addition, the wearable device may have one or both of a function of displaying AR contents and a function of displaying VR contents. Note that the wearable device may have a function of displaying SR or MR contents, in addition to AR and VR contents. The wearable device having a function of displaying contents of AR, VR, SR, MR, or the like enables the user to reach a higher level of immersion.

An electronic device 700 illustrated in FIG. 16A includes a pair of display panels 751, a pair of housings 721, a communication portion (not illustrated), a pair of wearing portions 723, a control portion (not illustrated), an image capturing portion (not illustrated), a pair of optical members 753, a frame 757, and a pair of nose pads 758.

The display device according to one embodiment of the present invention can be employed for the display panel 751. Thus, the electronic device can perform display with extremely high definition.

The electronic device 700 can project an image displayed on the display panel 751 onto a display region 756 of the optical member 753. Since the optical members 753 have a light-transmitting property, the user can see images displayed on the display regions that are superimposed on transmission images seen through the optical members 753. Thus, the electronic device 700 is an electronic device capable of AR display.

In the electronic device 700, a camera capable of capturing images of the front side may be provided as the image capturing portion. Furthermore, when the electronic device 700 is provided with an acceleration sensor such as a gyroscope sensor, the orientation of a user's head can be sensed and an image corresponding to the orientation can be displayed on the display region 756.

The pair of wearing portions 723 each include a vibration module 725 serving as a sound output means. The vibration module 725 enables part of the wearing portion 723 to function as a speaker utilizing bone conduction. The use of bone conduction allows the user to listen to sounds without concern for sound leakage to the surroundings. Note that an earphone may be used as the sound output means.

The communication portion includes a wireless communication device, and a video signal and the like can be supplied by the wireless communication device. Note that instead of the wireless communication device or in addition to the wireless communication device, a connector to which a cable supplied with a video signal and a power potential can be connected may be provided.

In addition, the electronic device 700 is provided with a battery so that charging can be performed wirelessly and/or by wire.

A touch sensor module may be provided in the housing 721. The touch sensor module has a function of detecting a touch on an outer surface of the housing 721. A tap operation, a slide operation, or the like by the user can be detected with the touch sensor module, so that a variety of processings can be executed. For example, processing such as a pause or a restart of a moving image can be executed by a tap operation, and processing such as fast forward or fast rewind can be executed by a slide operation. In addition, the touch sensor module is provided in each of the two housings 721, so that the range of the operation can be increased.

A variety of touch sensors can be employed for the touch sensor module. For example, touch sensors of a variety of types such as a capacitive type, a resistive film type, an infrared type, an electromagnetic induction type, a surface acoustic wave type, and an optical type can be employed. In particular, a capacitive sensor or an optical sensor is preferably employed for the touch sensor module.

In the case of using an optical touch sensor, a photoelectric conversion device (also referred to as a photoelectric conversion element) can be used as a light-receiving device. One or both of an inorganic semiconductor and an organic semiconductor can be used for an active layer of the photoelectric conversion device.

FIG. 16A illustrates a structure in which the display panels 751 are provided on the housings 721 and images are projected on the optical members 753 from the sides. Note that without limitation to this structure, the display panels 751 may each have a structure in which an image is projected from above or below the optical member 753.

Figure 16B:
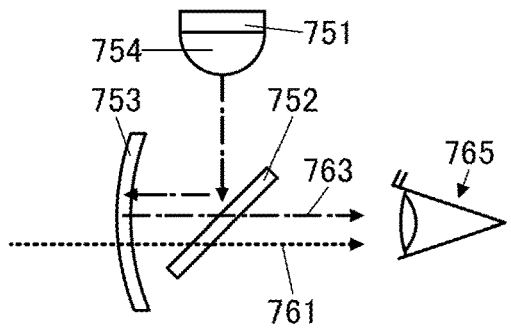

FIG. 16B illustrates an example where an image is projected from above the optical member 753. Each of the display panels 751 is positioned on the frame 757 so that an image is output therebelow, for example. Part of light emitted from the display panel 751 is reflected by an optical member 752 to the optical member 753 side and projected on the optical member 753. Part of the light reflected by the optical member 753 (light 763) passes through the optical member 752 and then reaches a user's eye 765. Meanwhile, external light 761 passes through the optical member 753 and the optical member 752 and reaches the user's eye 765. Accordingly, an image from the display panel 751 can be superimposed on actual scenery.

In addition, a lens 754 may be provided on the display surface side of the display panel 751. Furthermore, a microlens array may be provided between the display panel 751 and the lens 754.

The optical member 752 and the optical member 753 can each include a polarizing plate, a circularly polarizing plate, a lens, a half mirror, or the like. The optical member 752 functions as a beam splitter and has a function of transmitting light with predetermined polarization and reflecting light with other polarization, for example. The optical member 753 condenses and reflects light from the optical member 752 and polarizes the light so that the light can pass through the optical member 752.

Figure 16C:
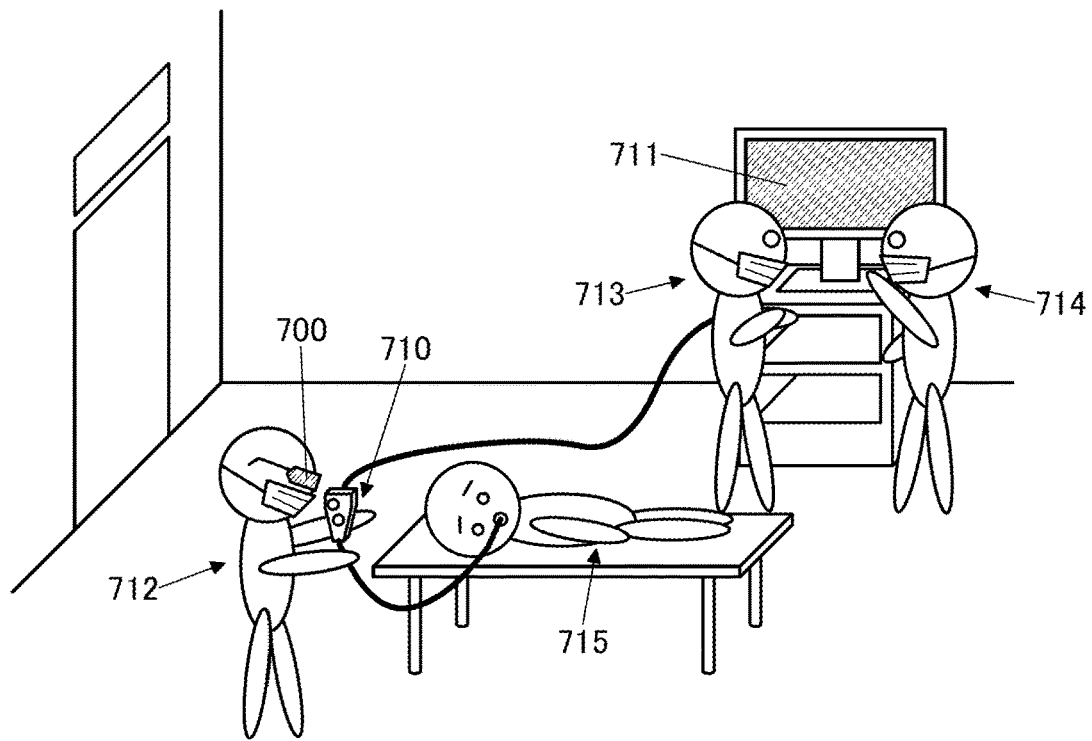
FIG. 16C is a diagram illustrating a usage example of an electronic device.

An example in which the electronic device 700 is utilized in a medical site is described using FIG. 16C. FIG. 16C shows a situation where medical diagnosis using an endoscope device 710 is performed.

A doctor 712 operates the endoscope device 710 to observe the inside of the body of a patient 715 and performs appropriate treatment. The doctor 712 wears the electronic device 700. A video taken by the endoscope device 710 is displayed on a display portion of the electronic device 700 in real time, and the doctor 712 can perform medical treatment while seeing the video.

In addition, the video taken by the endoscope device 710 can also be displayed on a monitor device 711 that is separately provided. Accordingly, other doctors 713 and 714 and the like can see the situation of the medical treatment performed by the doctor 712 in real time without interrupting the doctor 712. Here, the example in which the monitor device 711 is provided in an operating room is described; however, it is possible to see the situation of the medical treatment performed by the doctor 712 from a separate room. For example, when a resident physician or the like sees the situation of the medical treatment performed by the doctor 712 through a monitor device provided in an operating room, the resident physician or the like can feel the real atmosphere of a treatment environment.

The display device according to one embodiment of the present invention can be employed not only for the display portion of the electronic device 700 but also for a display portion of the monitor device 711. Therefore, from extremely high-resolution images, the other doctors 713 and 714 and the like can make highly accurate medical judgment, and the judgment can be shared with the doctor 712 who is performing the medical treatment.

Figure 17A:
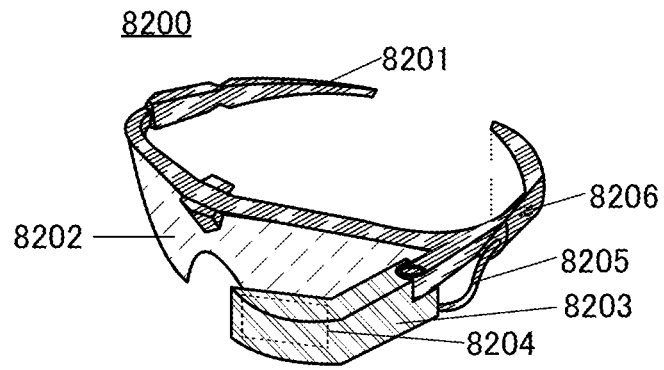
FIG. 17A to FIG. 17D are diagrams illustrating structure examples of electronic devices.

FIG. 17A is a diagram illustrating the appearance of a head-mounted display 8200.

The head-mounted display 8200 includes a wearing portion 8201, a lens 8202, a main body 8203, a display portion 8204, a cable 8205, and the like. In addition, a battery 8206 is incorporated in the wearing portion 8201.

The cable 8205 supplies power from the battery 8206 to the main body 8203. The main body 8203 includes a wireless receiver or the like and can display an image corresponding to received image data or the like on the display portion 8204. In addition, user's eyeball or eyelid movement is captured by a camera provided in the main body 8203 and then coordinates of the sight line of the user are calculated using the information so that the sight line of the user can be used as an input means.

A plurality of electrodes may be provided in the wearing portion 8201 at a position in contact with the user. The main body 8203 may have a function of sensing current flowing through the electrodes along with the user's eyeball movement to recognize the user's sight line. Alternatively, the main body 8203 may have a function of sensing current flowing through the electrodes to monitor the user's pulse. In addition, the wearing portion 8201 may include a variety of sensors such as a temperature sensor, a pressure sensor, and an acceleration sensor to have a function of displaying user's biological information on the display portion 8204. Furthermore, the main body 8203 may detect user's head movement or the like to change an image displayed on the display portion 8204 in synchronization with the movement.

The display device according to one embodiment of the present invention can be employed for the display portion 8204. Thus, the power consumption of the head-mounted display 8200 can be reduced, so that the head-mounted display 8200 can be continuously used for a long time. In addition, the reduction in the power consumption of the head-mounted display 8200 allows the battery 8206 to be downsized and made lighter and accordingly allows the head-mounted display 8200 to be downsized and made lighter. Thus, the burden of the user of the head-mounted display 8200 can be reduced, and the user is less likely to feel fatigue.

Figure 17B:
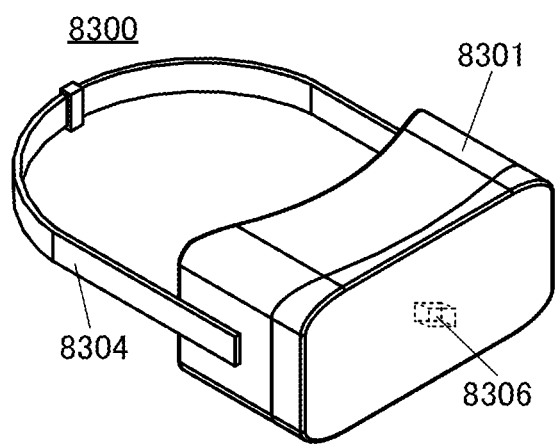
Figure 17C:
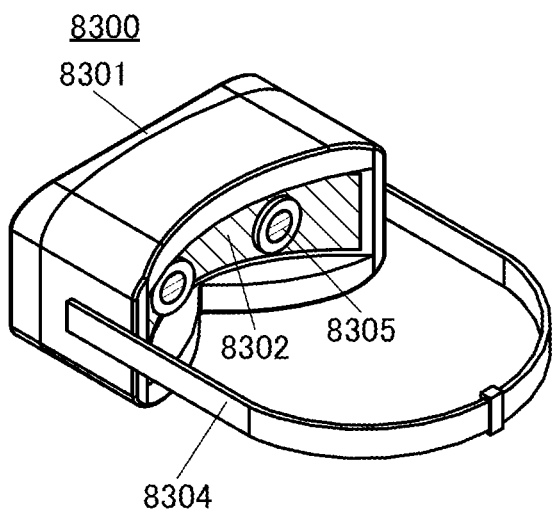
Figure 17D:
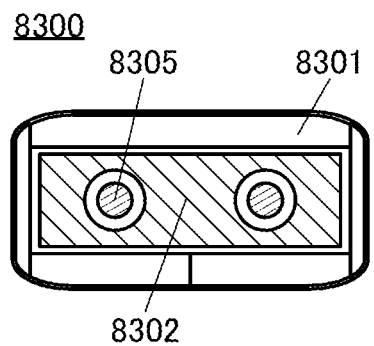

FIG. 17B, FIG. 17C, and FIG. 17D are diagrams illustrating the appearance of a head-mounted display 8300. The head-mounted display 8300 includes a housing 8301, a display portion 8302, a band-like fixing member 8304, and a pair of lenses 8305. In addition, a battery 8306 is incorporated in the housing 8301, and power can be supplied from the battery 8306 to the display portion 8302 and the like.

The user can see display on the display portion 8302 through the lenses 8305. Note that it is suitable that the display portion 8302 be curved and placed. When the display portion 8302 is curved and placed, the user can feel high realistic sensation. Note that although the structure in which one display portion 8302 is provided is described in this embodiment as an example, the structure is not limited thereto, and a structure in which two display portions 8302 are provided may also be employed, for example. In that case, one display portion is placed for one eye of the user, so that three-dimensional display using parallax or the like is possible.

Note that the above display device can be employed for the display portion 8302. Thus, the power consumption of the head-mounted display 8300 can be reduced, so that the head-mounted display 8300 can be continuously used for a long time. In addition, the reduction in the power consumption of the head-mounted display 8300 allows the battery 8306 to be downsized and made lighter and accordingly allows the head-mounted display 8300 to be downsized and made lighter. Thus, the burden of the user of the head-mounted display 8300 can be reduced, and the user is less likely to feel fatigue.

Figure 18A:
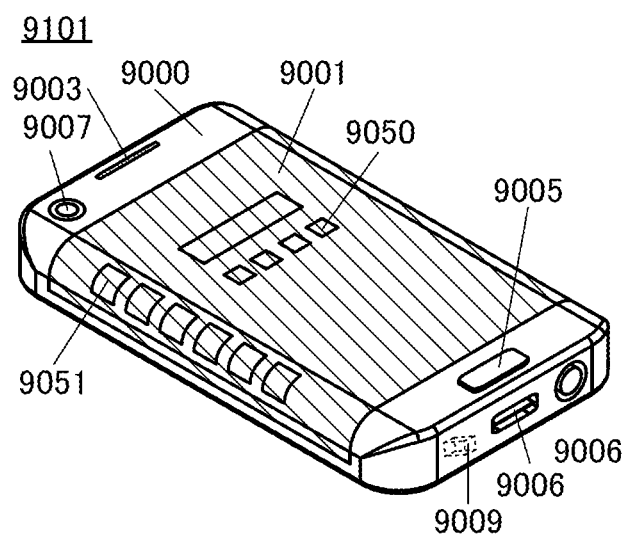
FIG. 18A and FIG. 18B are diagrams each illustrating a structure example of an electronic device.
Figure 18B:
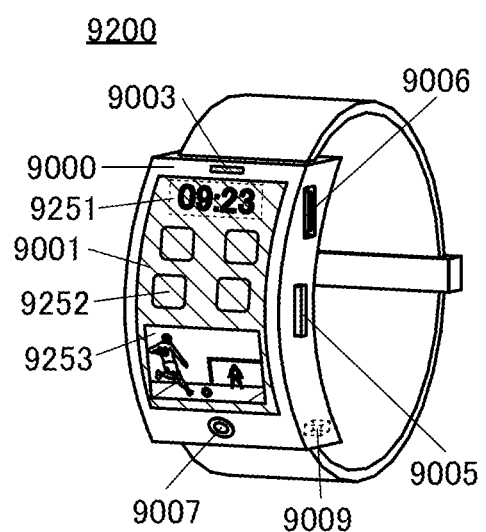

Next, FIG. 18A and FIG. 18B illustrate examples of electronic devices that are different from the electronic devices illustrated in FIG. 17A to FIG. 17D.

The electronic devices illustrated in FIG. 18A and FIG. 18B include a housing 9000, a display portion 9001, a speaker 9003, an operation key 9005 (including a power switch or an operation switch), a connection terminal 9006, a sensor 9007 (having a function of measuring force, displacement, a position, speed, acceleration, angular velocity, rotational frequency, distance, light, liquid, magnetism, temperature, a chemical substance, sound, time, hardness, an electric field, current, voltage, power, radiation, flow rate, humidity, a gradient, oscillation, odor, or infrared rays), a battery 9009, and the like.

The electronic devices illustrated in FIG. 18A and FIG. 18B have a variety of functions. For example, the electronic devices illustrated in FIG. 18A and FIG. 18B can include a function of displaying a variety of information (a still image, a moving image, a text image, and the like) on the display portion, a touch panel function, a function of displaying a calendar, date, time, and the like, a function of controlling processing with a variety of software (programs), a wireless communication function, a function of being connected to a variety of computer networks with a wireless communication function, a function of transmitting and receiving a variety of data with a wireless communication function, a function of reading out a program or data stored in a storage medium and displaying the program or data on the display portion. Note that functions that can be provided for the electronic devices illustrated in FIG. 18A and FIG. 18B are not limited thereto, and the electronic devices can have a variety of functions. In addition, although not illustrated in FIG. 18A and FIG. 18B, the electronic devices may each include a plurality of display portions. Furthermore, the electronic devices may be each provided with a camera or the like and may each have a function of taking a still image, a function of taking a moving image, a function of storing the taken image in a storage medium (an external storage medium or a storage medium incorporated in the camera), a function of displaying the taken image on the display portion, or the like.

The details of the electronic devices illustrated in FIG. 18A and FIG. 18B are described below.

FIG. 18A is a perspective view illustrating a portable information terminal 9101. The portable information terminal 9101 has a function of, for example, one or more functions selected from a telephone set, a notebook, an information browsing system, and the like. Specifically, the portable information terminal 9101 can be used as a smartphone. In addition, the portable information terminal 9101 can display a text or an image on its plurality of surfaces. For example, three operation buttons 9050 (also referred to as operation icons or simply as icons) can be displayed on one surface of the display portion 9001. Furthermore, information 9051 indicated by dashed rectangles can be displayed on another surface of the display portion 9001. Note that examples of the information 9051 include display indicating incoming e-mails, SNS (social networking services), phone calls, and the like; the titles of e-mails, SNS, and the like; the senders of e-mails, SNS, and the like; dates; time; remaining battery; radio field strength; and the like. Alternatively, instead of the information 9051, the operation buttons 9050 or the like may be displayed on the position where the information 9051 is displayed.

The above display device can be employed for the portable information terminal 9101. Thus, the power consumption of the portable information terminal 9101 can be reduced, so that the portable information terminal 9101 can be continuously used for a long time. In addition, the reduction in the power consumption of the portable information terminal 9101 allows the battery 9009 to be downsized and made lighter and accordingly allows the portable information terminal 9101 to be downsized and made lighter. Thus, the portability of the portable information terminal 9101 can be increased.

FIG. 18B is a perspective view of a wristwatch-type portable information terminal 9200. The portable information terminal 9200 can execute a variety of applications such as mobile phone calls, e-mailing, viewing and creating texts, music reproduction, Internet communication, and computer games. In addition, the display surface of the display portion 9001 is curved and provided, and display can be performed on the curved display surface. FIG. 18B illustrates an example in which time 9251, operation buttons 9252 (also referred to as operation icons or simply as icons), and a content 9253 are displayed on the display portion 9001. The content 9253 can be a moving image, for example.

In addition, the portable information terminal 9200 can execute near field communication conformable to a communication standard. For example, mutual communication with a headset capable of wireless communication enables hands-free calling. Furthermore, the portable information terminal 9200 includes the connection terminal 9006 and can exchange data directly with another information terminal through a connector. Moreover, charging through the connection terminal 9006 is also possible. Note that a charging operation may be performed by wireless power feeding without through the connection terminal 9006.

The above display device can be employed for the portable information terminal 9200. Thus, the power consumption of the portable information terminal 9200 can be reduced, so that the portable information terminal 9200 can be continuously used for a long time. In addition, the reduction in the power consumption of the portable information terminal 9200 allows the battery 9009 to be downsized and made lighter and accordingly allows the portable information terminal 9200 to be downsized and made lighter. Thus, the portability of the portable information terminal 9200 can be increased.

At least part of this embodiment can be implemented in combination with the other embodiments described in this specification as appropriate.

REFERENCE NUMERALS

ANO: wiring, BSL: bus wiring, GL: wiring, SL: wiring, SNCL: wiring, VCOM: wiring, 10: display device, 11: layer, 12: layer, 13: layer, 14: terminal portion, 15: display portion, 21: transistor, 22: channel formation region, 30: driver circuit, 31: source driver circuit, 32: digital-to-analog converter circuit, 33: gate driver circuit, 34: level shifter, 40: functional circuit, 41: memory device, 42a: color irregularity correction, 42b: up conversion, 42: GPU, 43: EL correction circuit, 44: timing controller, 45: CPU, 46: sensor controller, 47: power supply circuit, 51A: pixel circuit, 51B: pixel circuit, 51C: pixel circuit, 51D: pixel circuit, 51E: pixel circuit, 51F: pixel circuit, 51G: pixel circuit, 51H: pixel circuit, 51: pixel circuit, 52A: transistor, 52B: transistor, 52C: transistor, 52D: transistor, 52: transistor, 53A: capacitor, 53: capacitor, 54: channel formation region, 61B: display element, 61G: display element, 61R: display element, 61: display element, 62X_1: element, 62X_2: element, 62X_3: element, 62: element, 63: pixel, 100A: display device, 100B: display device, 100C: display device, 100D: display device, 100E: display device, 111a: pixel electrode, 111b: pixel electrode, 111c: pixel electrode, 113a: first layer, 113b: second layer, 113c: third layer, 114: fourth layer, 115: common electrode, 120: substrate, 122: resin layer, 123: conductive layer, 125: insulating layer, 127: insulating layer, 130a: light-emitting device, 130b: light-emitting device, 130c: light-emitting device, 130d: element, 130e: element, 130f: element, 131: protective layer, 132: protective layer, 140: connection portion, 240: capacitor, 241: conductive layer, 243: insulating layer, 245: conductive layer, 251: conductive layer, 252: conductive layer, 254: insulating layer, 255a: insulating layer, 255b: insulating layer, 256: plug, 261: insulating layer, 262: insulating layer, 263: insulating layer, 264: insulating layer, 265: insulating layer, 271: plug, 274a: conductive layer, 274b: conductive layer, 274: plug, 280: display module, 281: display portion, 282: circuit portion, 283a: pixel circuit, 283: pixel circuit portion, 284a: pixel, 284: pixel portion, 285: terminal portion, 286: wiring portion, 290: FPC, 291: substrate, 292: substrate, 301A: substrate, 301B: substrate, 301: substrate, 310A: transistor, 310B: transistor, 310: transistor, 311: conductive layer, 312: low-resistance region, 313: insulating layer, 314: insulating layer, 315: element isolation layer, 320A: transistor, 320B: transistor, 320: transistor, 321: semiconductor layer, 323: insulating layer, 324: conductive layer, 325: conductive layer, 326: insulating layer, 327: conductive layer, 328: insulating layer, 329: insulating layer, 331: substrate, 332: insulating layer, 341: conductive layer, 342: conductive layer, 343: plug, 700: electronic device, 710: endoscope device, 711: monitor device, 712: doctor, 713: doctor, 714: doctor, 715: patient, 721: housing, 723: wearing portion, 725: vibration module, 751: display panel, 752: optical member, 753: optical member, 754: lens, 756: display region, 757: frame, 758: nose pad, 761: external light, 763: light, 765: eye, 772: lower electrode, 785: coloring layer, 786a: EL layer, 786b: EL layer, 786: EL layer, 788: upper electrode, 941: retina, 942: crystalline lens, 943: optic nerve, 944: optic disc, 945: vein, 946: artery, 947: vitreous body, 948: choroid, 950: optical system, 951: light emitted, 960: eyebrow, 961: eyelash, 962: pupil, 963: cornea, 965: sclera, 966: upper eyelid, 967: lower eyelid, 980: display device, 4411: light-emitting layer, 4412: light-emitting layer, 4413: light-emitting layer, 4420: layer, 4421: layer, 4422: layer, 4430: layer, 4431: layer, 4432: layer, 8200: head-mounted display, 8201: wearing portion, 8202: lens, 8203: main body, 8204: display portion, 8205: cable, 8206: battery, 8300: head-mounted display, 8301: housing, 8302: display portion, 8304: fixing member, 8305: lens, 8306: battery, 9000: housing, 9001: display portion, 9003: speaker, 9005: operation key, 9006: connection terminal, 9007: sensor, 9009: battery, 9050: operation button, 9051: information, 9101: portable information terminal, 9200: portable information terminal, 9251: time, 9252: operation button, and 9253: contents.

The invention claimed is:

1. A display device comprising a plurality of pixels and an insulator,
wherein the plurality of pixels each include a light-emitting device, a sensor device, and a circuit device,
wherein the light-emitting device and the sensor device are provided in a first layer,
wherein the circuit device is provided in a second layer,
wherein the light-emitting device includes a lower electrode, an upper electrode, and an electroluminescent (EL) third layer provided between the lower electrode and the upper electrode,
wherein the insulator comprises a portion between the third layer and an adjacent third layer, wherein a side surface of the third layer of each light-emitting device of the plurality of pixels is in contact with the insulator,
wherein the sensor device is configured to detect light emitted from the light-emitting device,
wherein the first layer is provided over the second layer, and
wherein a level of a top surface of the insulator is greater than a level of the top surface of the third layer of the light-emitting device, and
wherein the insulator comprises a first insulator of inorganic material and a second insulator of organic material over a portion of the first insulator to planarize the top surface of the first insulator.

2. The display device according to claim 1, wherein when a cross section of the light-emitting device is observed, the light-emitting device includes a region where a side surface of the lower electrode and a side surface of the third layer are aligned with or substantially aligned with each other.

3. The display device according to claim 1, wherein the insulator includes a photosensitive organic resin.

4. An electronic device comprising:
the display device according to claim 1;
a housing provided with the display device;
a sensor provided in the housing; and
a battery provided in the housing to supply power to the display device.

5. An electronic device comprising:
at least two of the display devices according to claim 1;
a housing provided with the display devices;
a sensor provided in the housing; and
a battery provided in the housing to supply power to the display devices,
wherein the housing includes a wearing portion and a pair of lenses,
wherein an image from one of the two display devices is projected on one of the pair of lenses, and
wherein an image from the other of the two display devices is projected on the other of the pair of lenses.

6. A display device comprising a plurality of pixels and an insulator,
wherein the plurality of pixels each include a light-emitting device, a sensor device, a first circuit device, and a second circuit device,
wherein the light-emitting device and the sensor device are provided in a first layer,
wherein the first circuit device is provided in a second layer,
wherein the second circuit device is provided in a third layer,
wherein the light-emitting device includes a lower electrode, an upper electrode, and an electroluminescent (EL) fourth layer provided between the lower electrode and the upper electrode,
wherein the insulator comprises a portion between the fourth layer and an adjacent fourth layer,
wherein a side surface of the fourth layer of each light-emitting device of the plurality of pixels is in contact with the insulator,
wherein the sensor device is configured to detect light emitted from the light-emitting device,
wherein the first circuit device is configured to drive the light-emitting device or the sensor device,
wherein the second circuit device is configured to perform an arithmetic operation based on information output from the first circuit device,
wherein the first layer is provided over the second layer,
wherein the second layer is provided over the third layer, and
wherein a level of a top surface of the insulator is greater than a level of the top surface of the fourth layer of the light-emitting device, and
wherein the insulator comprises a first insulator of inorganic material and a second insulator of organic material over a portion of the first insulator to planarize the top surface of the first insulator.

7. The display device according to claim 1,
wherein the third layer of the light-emitting device comprises a first side surface,
wherein the third layer of the adjacent light-emitting device comprises a second side surface, and
wherein the first side surface and the second side surface face each other with the insulator provided therebetween.

8. The display device according to claim 1, wherein the third layer comprises a light-emitting layer.

9. The display device according to claim 6, wherein the insulator includes a photosensitive organic resin.

10. The display device according to claim 6,
wherein the first circuit device includes a first transistor, and
wherein the first transistor includes a metal oxide in a channel formation region.

11. The display device according to claim 6,
wherein the second circuit device includes a second transistor, and
wherein the second transistor includes silicon in a channel formation region.

12. The display device according to claim 6, wherein the second circuit device is configured to detect one or more selected from a user's blink, iris movement, and eyelid movement by using either one or both the light-emitting device and the sensor device.

13. A display device comprising a plurality of pixels,
wherein the plurality of pixels each include a first subpixel to a sixth subpixel,
wherein the first subpixel includes a first light-emitting device configured to emit light with a first color,
wherein the second subpixel includes a second light-emitting device configured to emit light with a second color,
wherein the third subpixel includes a third light-emitting device configured to emit light with a third color,
wherein at least one of the fourth subpixel to the sixth subpixel includes a first sensor device,
wherein the first subpixel to the sixth subpixel each include a circuit device,
wherein the first light-emitting device to the third light-emitting device and the first sensor device are provided in a first layer,
wherein the circuit device is provided in a second layer,
wherein the first light-emitting device to the third light-emitting device each include a lower electrode, an upper electrode, and a third layer including a light-emitting layer provided between the lower electrode and the upper electrode,
wherein a side surface of the third layer of of the first light-emitting device, the second light-emitting device, and the third light-emitting device is in contact with a respective insulator, such that each insulator is positioned between adjacent third layers,
wherein the first sensor device is configured to detect light emitted from the pixel, wherein the first layer is provided over the second layer, and wherein a level of a top surface of the insulator is greater than a level of the top surface of each third layer of the first light-emitting device to the third light-emitting device, and wherein each insulator comprises a first insulator of inorganic material and a second insulator of organic material over a portion of the first insulator to planarize the top surface of the first insulator.

14. The display device according to claim 13,
wherein the fourth subpixel includes a fourth light-emitting device configured to emit infrared light,
wherein the fifth subpixel includes the first sensor device,
wherein the sixth subpixel includes a second sensor device,
wherein the fifth subpixel is configured to detect visible light, and
wherein the sixth subpixel is configured to detect infrared light.

15. The display device according to claim 13, wherein the first subpixel to the sixth subpixel each include a light-emitting region or a light-receiving region whose one side is greater than or equal to 1 µm and less than or equal to 10 µm and a region whose distance from an adjacent subpixel is less than 1 µm.

16. The display device according to claim 6, wherein when a cross section of the light-emitting device is observed, the light-emitting device includes a region where a side surface of the lower electrode and a side surface of the fourth layer are aligned with or substantially aligned with each other.

17. The display device according to claim 13,
wherein the first color is one of red, green, and blue,
wherein the second color is another of red, green, and blue, and
wherein the third color is the rest of red, green, and blue.

18. The display device according to claim 13,
wherein the third layer of the first light-emitting device comprises a first side surface,
wherein the third layer of the second light-emitting device comprises a second side surface, and
wherein the first side surface and the second side surface face each other with the insulator provided therebetween.

* * * * *